(12) United States Patent
Lin et al.

(10) Patent No.: US 11,423,966 B2
(45) Date of Patent: Aug. 23, 2022

(54) MEMORY ARRAY STAIRCASE STRUCTURE

(71) Applicant: Taiwan Semiconductor Manufacturing Co., Ltd., Hsinchu (TW)

(72) Inventors: Meng-Han Lin, Hsinchu (TW); Han-Jong Chia, Hsinchu (TW); Sheng-Chen Wang, Hsinchu (TW); Feng-Cheng Yang, Zhudong Township (TW); Yu-Ming Lin, Hsinchu (TW); Chung-Te Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/081,380

(22) Filed: Oct. 27, 2020

(65) Prior Publication Data
US 2022/0036931 A1 Feb. 3, 2022

Related U.S. Application Data

(60) Provisional application No. 63/058,615, filed on Jul. 30, 2020.

(51) Int. Cl.
*G11C 8/14* (2006.01)
*H01L 21/822* (2006.01)
(Continued)

(52) U.S. Cl.
CPC ............ *G11C 8/14* (2013.01); *H01L 21/8221* (2013.01); *H01L 21/8239* (2013.01); *H01L 27/1052* (2013.01); *H01L 27/11597* (2013.01)

(58) Field of Classification Search
CPC ... G11C 8/14; H01L 21/8221; H01L 21/8239; H01L 27/1052; H01L 27/11597;
(Continued)

(56) References Cited

U.S. PATENT DOCUMENTS 6,274,453 B1 8/2001 Schlosser et al.
8,349,681 B2 1/2013 Alsmeier et al.
(Continued)

FOREIGN PATENT DOCUMENTS

CN 111180451 * 5/2020
JP 2015122478 A 7/2015
(Continued)

*Primary Examiner* — Fernando Hidalgo
(74) *Attorney, Agent, or Firm* — Slater Matsil, LLP

(57) ABSTRACT

Routing arrangements for 3D memory arrays and methods of forming the same are disclosed. In an embodiment, a memory array includes a first word line extending from a first edge of the memory array in a first direction, the first word line having a length less than a length of a second edge of the memory array perpendicular to the first edge of the memory array; a second word line extending from a third edge of the memory array opposite the first edge of the memory array, the second word line extending in the first direction, the second word line having a length less than the length of the second edge of the memory array; a memory film contacting the first word line; and an OS layer contacting a first source line and a first bit line, the memory film being disposed between the OS layer and the first word line.

20 Claims, 83 Drawing Sheets

(51) Int. Cl.
*H01L 21/8239* (2006.01)
*H01L 27/105* (2006.01)
*H01L 27/11597* (2017.01)

(58) Field of Classification Search
CPC ......... H01L 27/11578; H01L 27/11551; H01L 27/1159; H01L 29/6684; H01L 29/78391
USPC .......................................................... 365/63
See application file for complete search history.

(56) References Cited

U.S. PATENT DOCUMENTS

| | | | |
|---|---|---|---|
| 9,484,389 | B2 | 11/2016 | Wouters et al. |
| 9,496,274 | B2 | 11/2016 | Pachamuthu et al. |
| 9,570,464 | B1 | 2/2017 | Wakatsuki et al. |
| 9,620,712 | B2 | 4/2017 | Hayashi et al. |
| 9,748,257 | B2 | 8/2017 | Lee et al. |
| 10,109,639 | B1 * | 10/2018 | DeForge ........... H01L 27/11558 |
| 10,115,681 | B1 | 10/2018 | Ariyoshi |
| 10,256,248 | B2 | 4/2019 | Lu et al. |
| 10,446,437 | B2 | 10/2019 | Yang |
| 10,593,399 | B2 | 3/2020 | Fratin et al. |
| 10,930,333 | B2 | 2/2021 | Chen et al. |
| 11,133,325 | B2 | 9/2021 | Dai et al. |
| 2002/0130345 | A1 | 9/2002 | Saigoh et al. |
| 2004/0058493 | A1 | 3/2004 | Demange et al. |
| 2010/0123177 | A1 | 5/2010 | Ozaki |
| 2011/0049646 | A1 | 3/2011 | Lim et al. |
| 2011/0199804 | A1 | 8/2011 | Son et al. |
| 2014/0048868 | A1 | 2/2014 | Kim et al. |
| 2015/0243674 | A1 | 8/2015 | Shih et al. |
| 2016/0118404 | A1 | 4/2016 | Peng |
| 2016/0148947 | A1 | 5/2016 | Seo et al. |
| 2016/0163686 | A1 | 6/2016 | Lee et al. |
| 2016/0181259 | A1 | 6/2016 | Van Houdt et al. |
| 2016/0322381 | A1 | 11/2016 | Liu et al. |
| 2017/0236831 | A1 | 8/2017 | Kim |
| 2017/0301684 | A1 | 10/2017 | Park et al. |
| 2018/0130823 | A1 | 5/2018 | Kim |
| 2019/0067324 | A1 | 2/2019 | Zhang et al. |
| 2019/0123061 | A1 | 4/2019 | Liu |
| 2020/0119047 | A1 | 4/2020 | Yoo et al. |
| 2020/0152502 | A1 | 5/2020 | Hsu |
| 2020/0176464 | A1 | 6/2020 | Jang et al. |
| 2020/0185411 | A1 | 6/2020 | Herner et al. |
| 2020/0194431 | A1 | 6/2020 | Castro et al. |
| 2020/0227428 | A1 | 7/2020 | Liu et al. |
| 2020/0286530 | A1 | 9/2020 | Lee et al. |
| 2020/0295033 | A1 | 9/2020 | Sakamoto et al. |
| 2020/0381037 | A1 * | 12/2020 | Kim .................... G11C 5/025 |
| 2021/0217772 | A1 | 7/2021 | Zhang |
| 2021/0242241 | A1 | 8/2021 | Rajashekhar et al. |
| 2021/0391315 | A1 * | 12/2021 | Zhang ................... G11C 16/14 |

FOREIGN PATENT DOCUMENTS

| | | |
|---|---|---|
| TW | 461083 B | 10/2001 |
| TW | 201814839 A | 4/2018 |
| TW | 201913971 A | 4/2019 |
| TW | 201946253 A | 12/2019 |
| TW | 202010102 A | 3/2020 |
| WO | 2021029916 A1 | 2/2021 |

\* cited by examiner

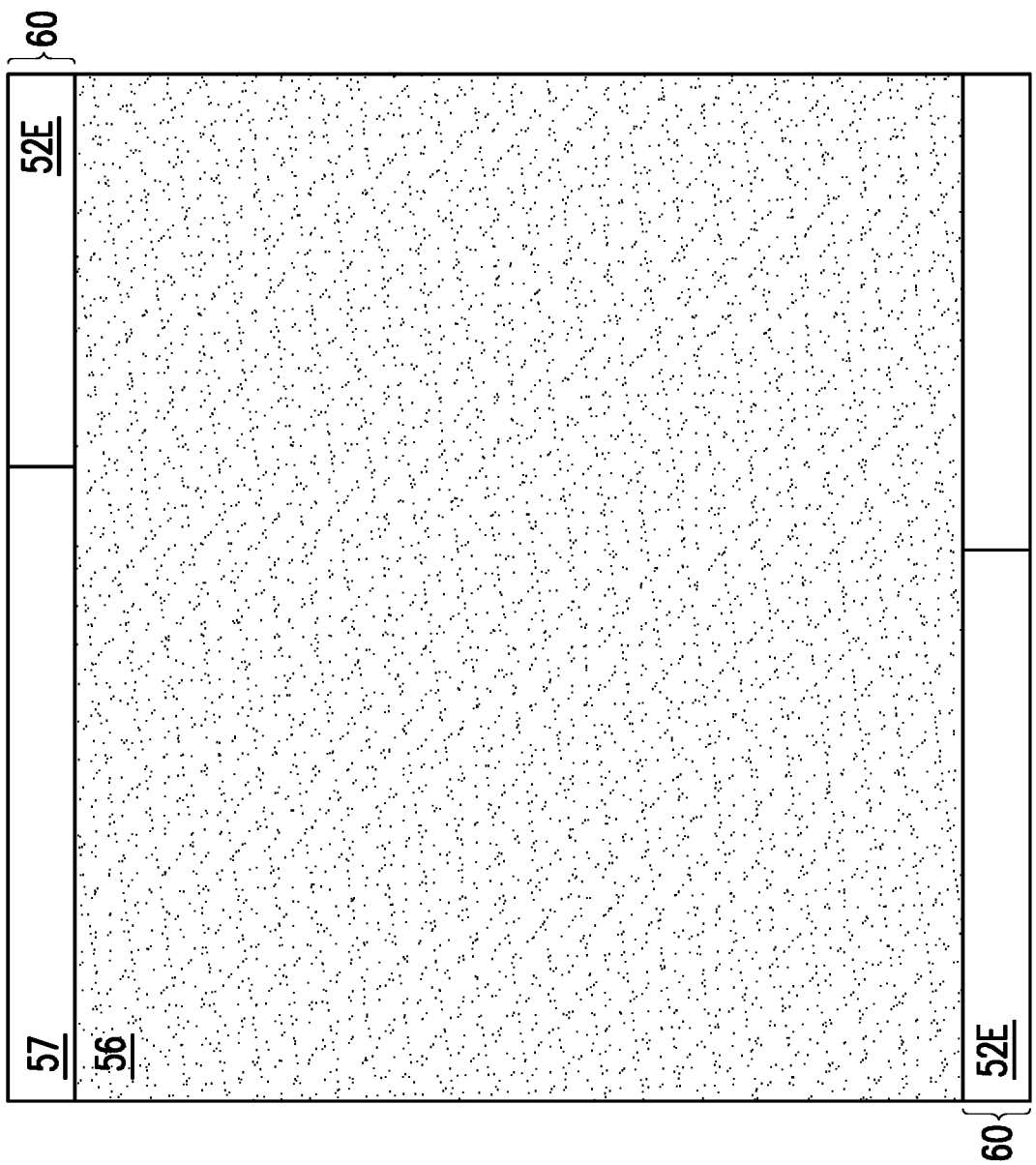

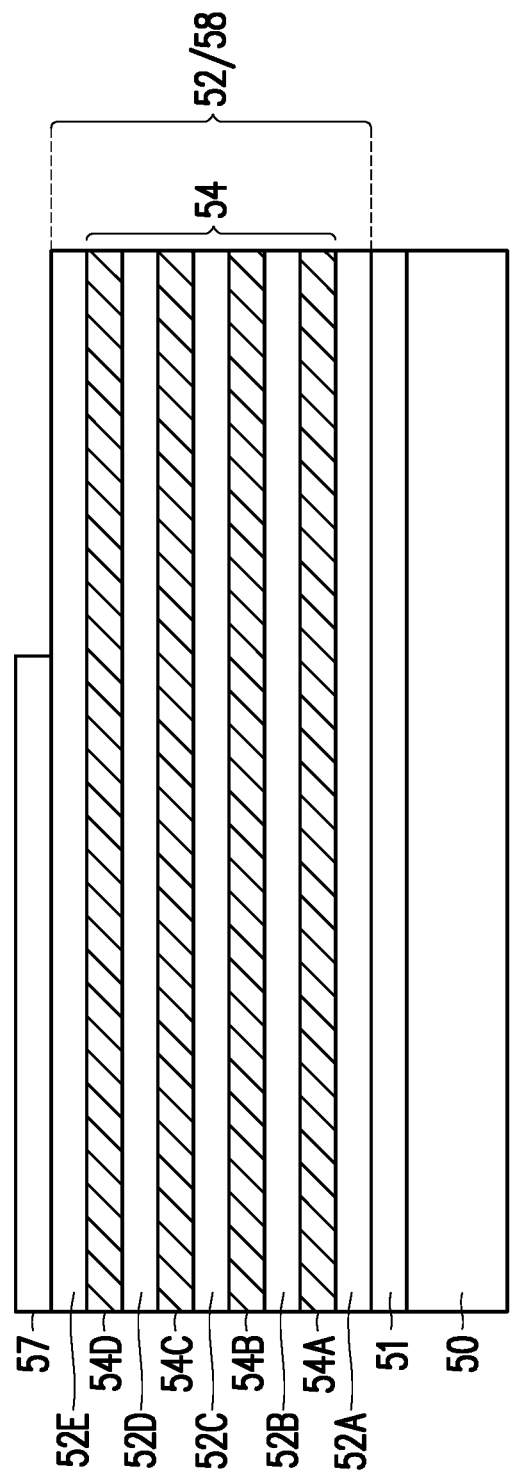

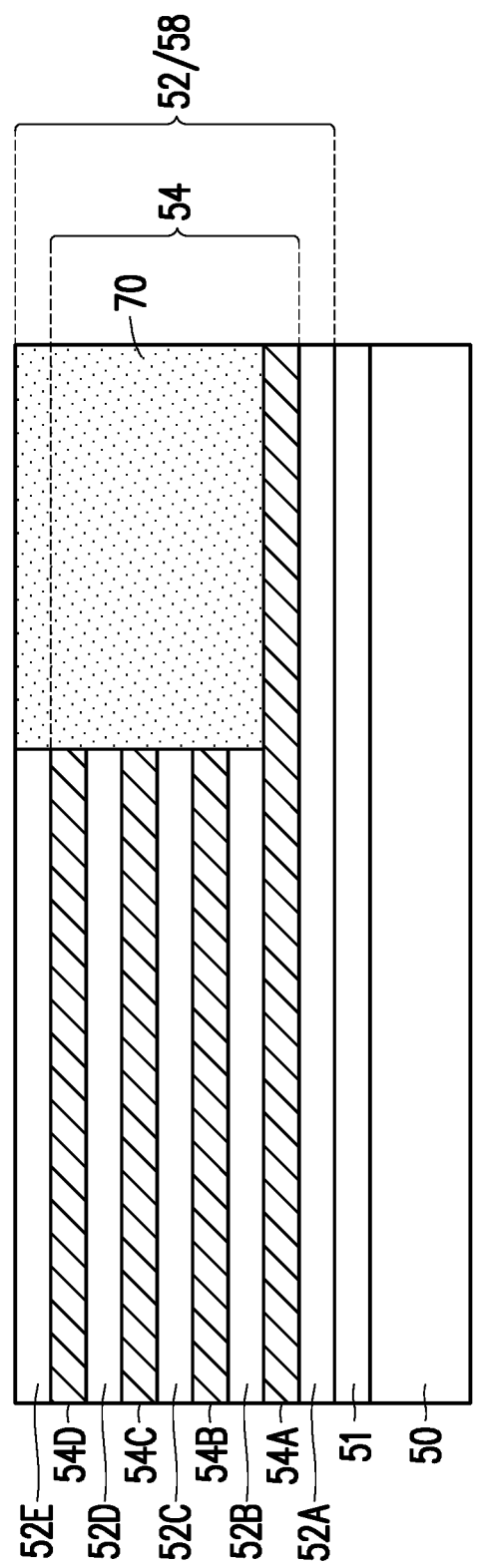

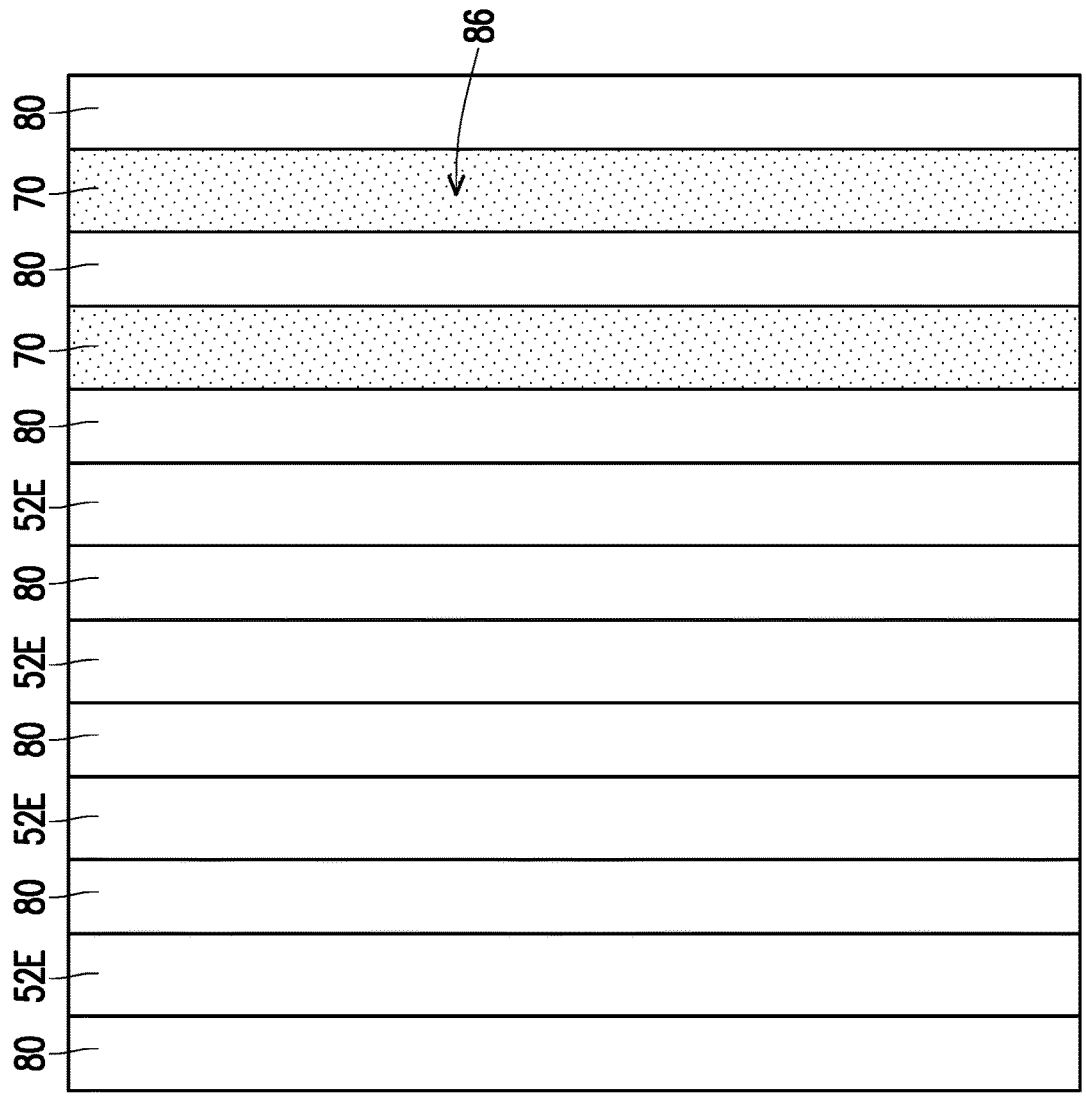

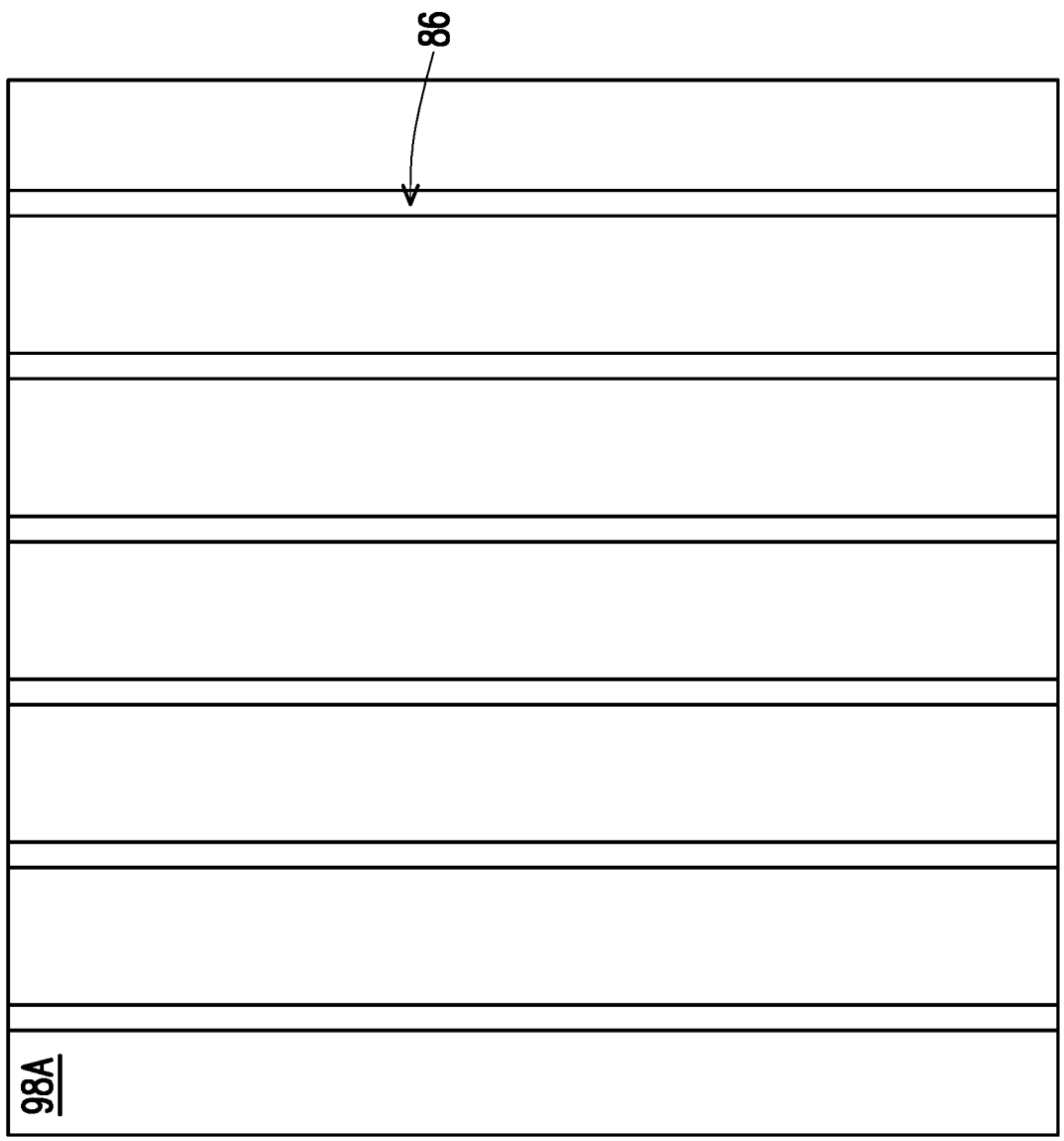

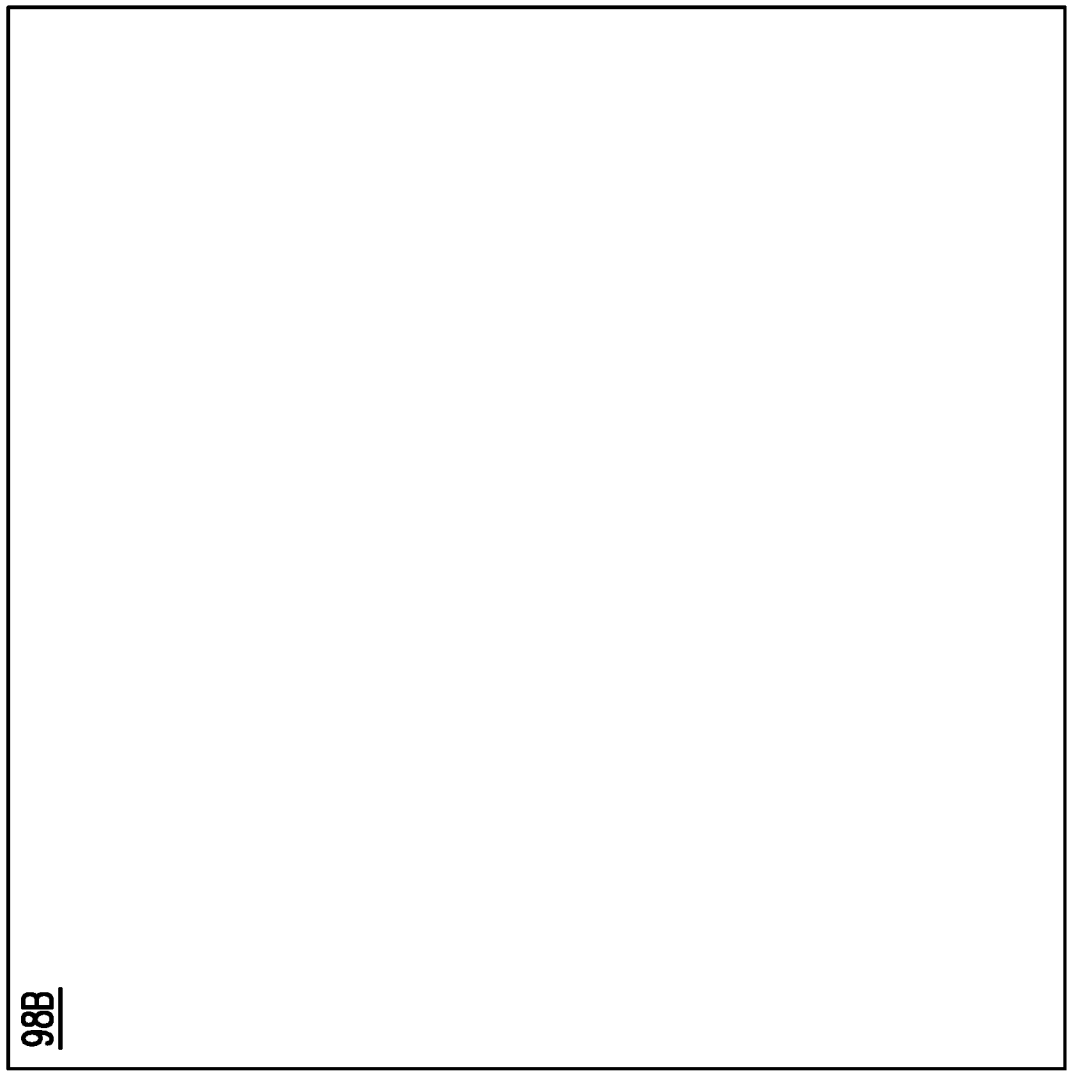

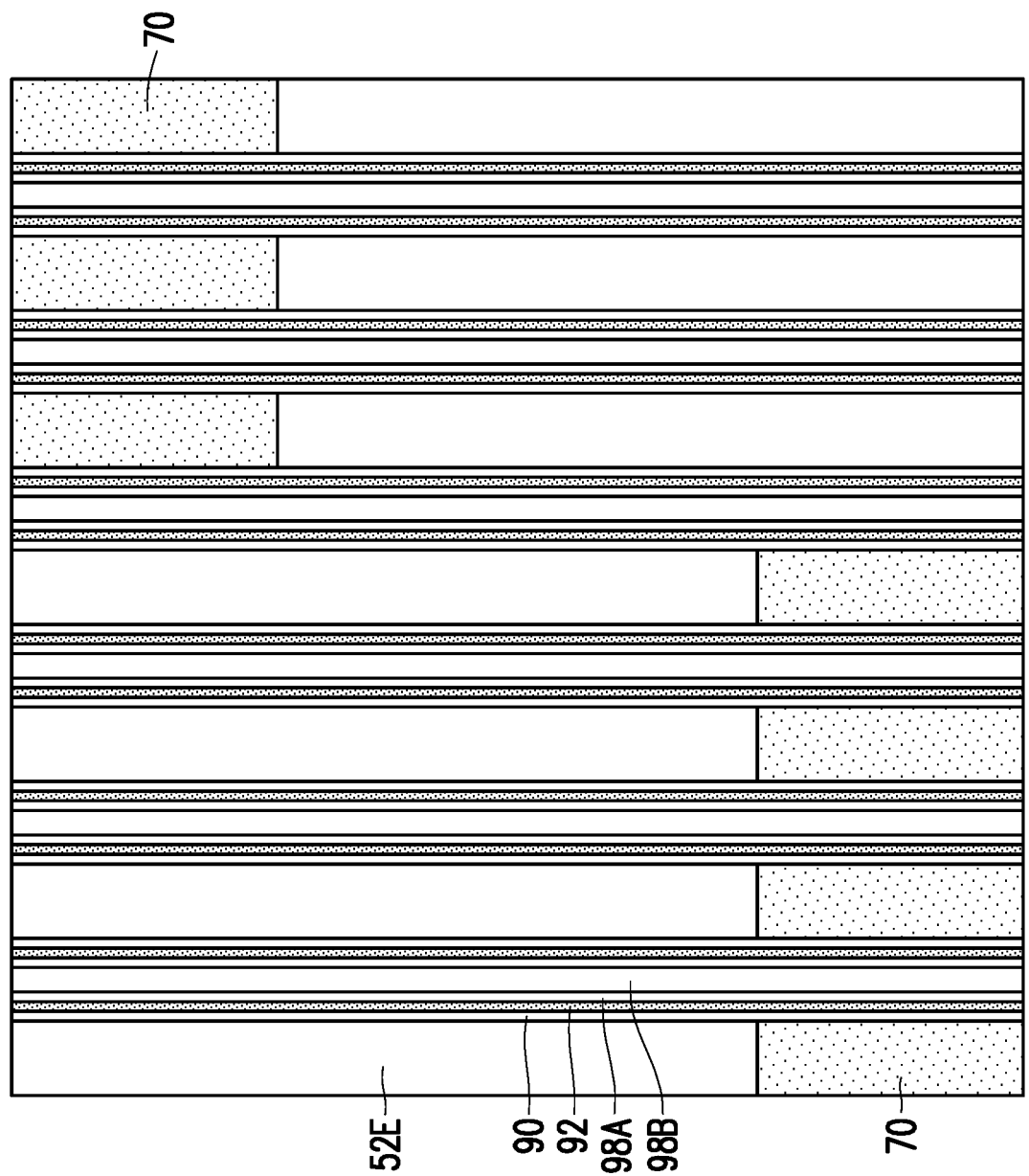

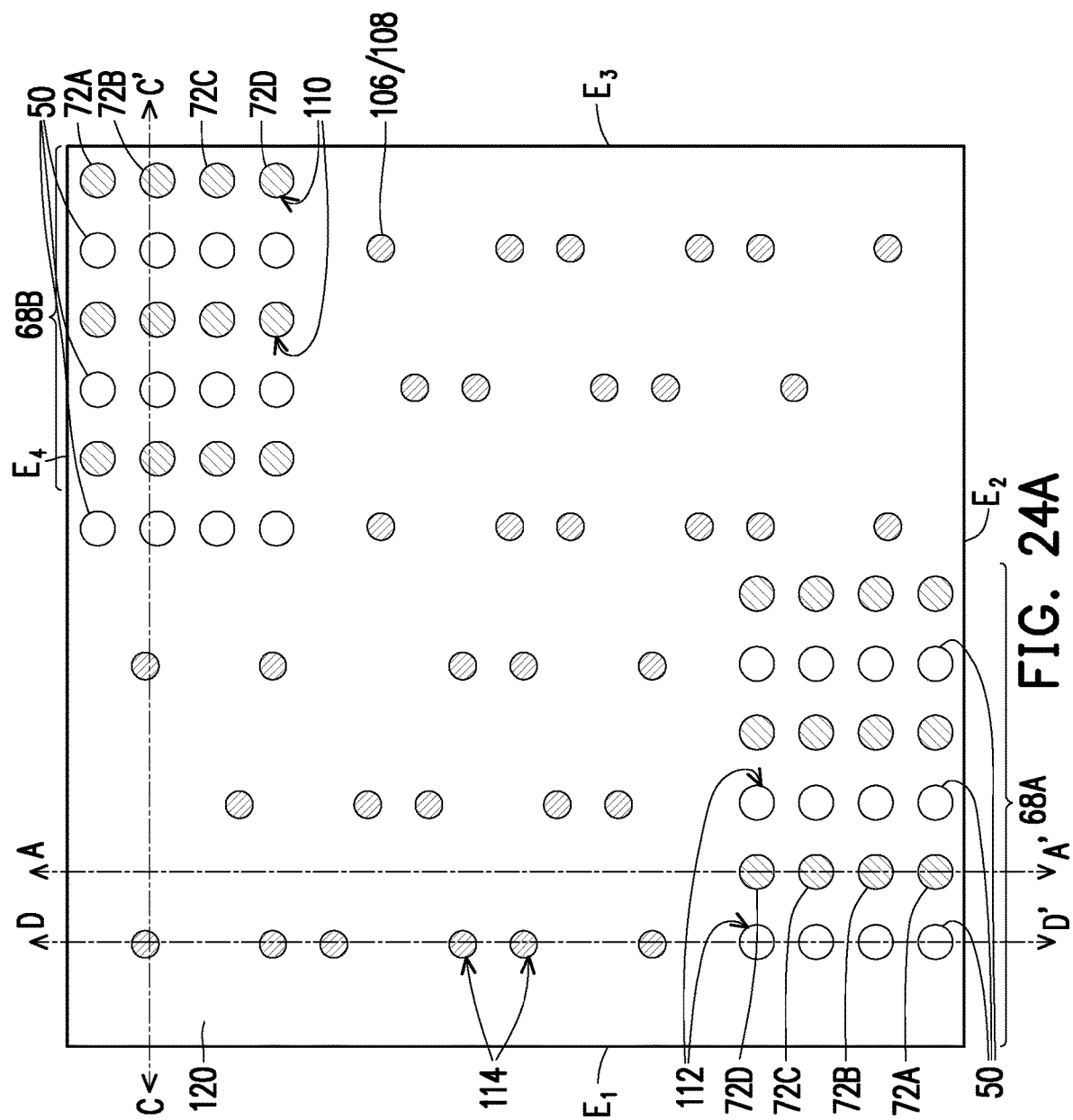

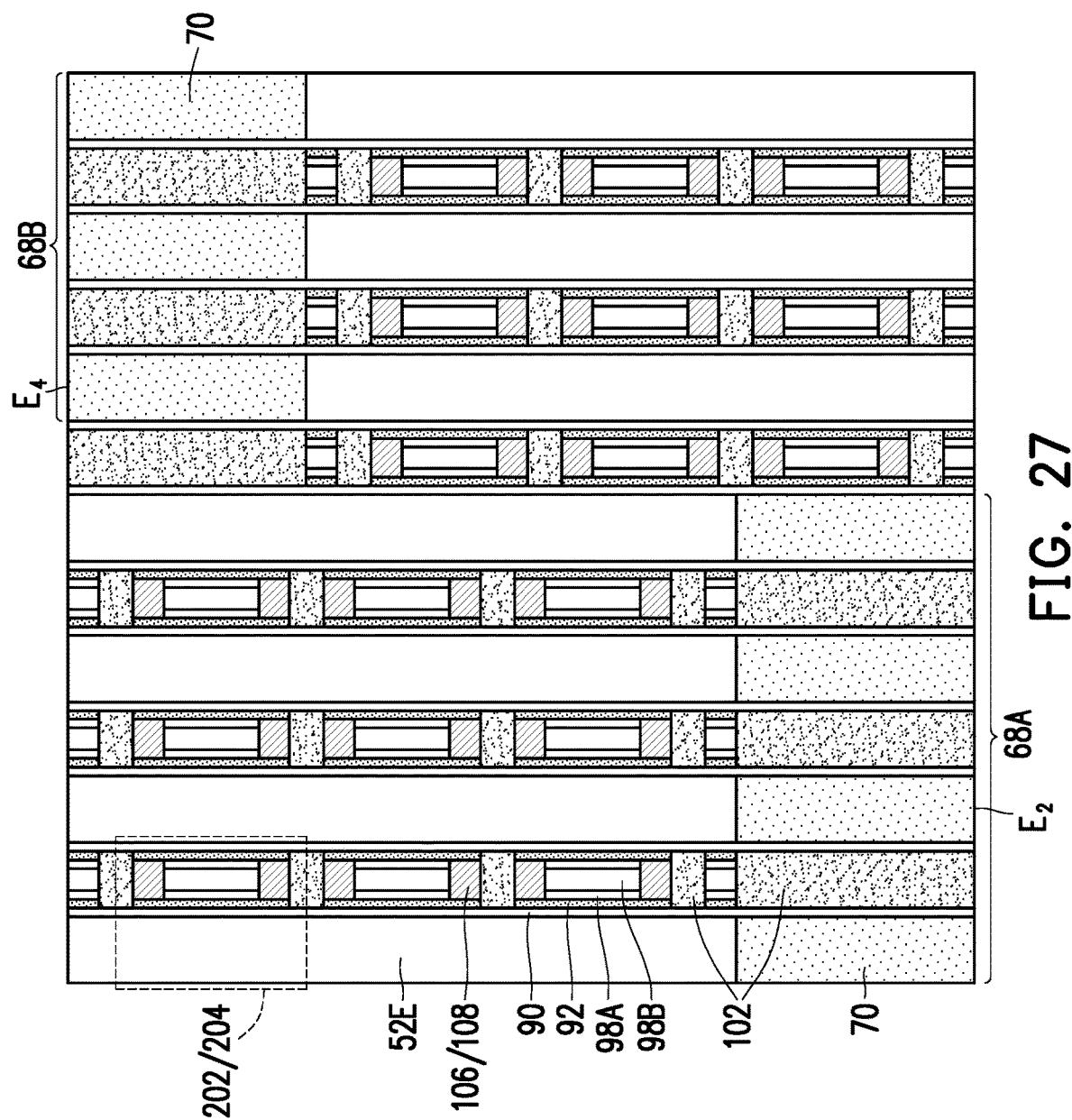

MEMORY ARRAY STAIRCASE STRUCTURE

PRIORITY CLAIM AND CROSS-REFERENCE

This application claims the benefit of U.S. Provisional Application No. 63/058,615, filed on Jul. 30, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FERAM, or FRAM). Advantages of FERAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A, 4B, 4C, 5A, 5B, 5C, 6A, 6B, 6C, 7A,7B, 7C, 8A, 8B, 8C, 9A, 9B, 9C, 10A, 10B, 10C, 11A, 11B, 11C, 12A, 12B, 12C, 13A, 13B, 14A, 14B, 15A, 15B, 15C, 16A, 16B, 17A, 17B, 18A, 18B, 19A, 19B, 20A, 20B, 21A, 21B, 22A, 22B, 22C, 23A, 23B, 23C, 24A, 24B, 24C, 24D, 25A, 25B, 25C, 25D, 26A, 26B, 26C, 26D, 26E, 27, 28, 29, 30, 31, 32, 33, 34, 35, 36A, 36B, 36C, 36D, and 36E illustrate varying views of manufacturing a semiconductor device including a memory array in accordance with some embodiments.

DETAILED DESCRIPTION

Figure 1A:
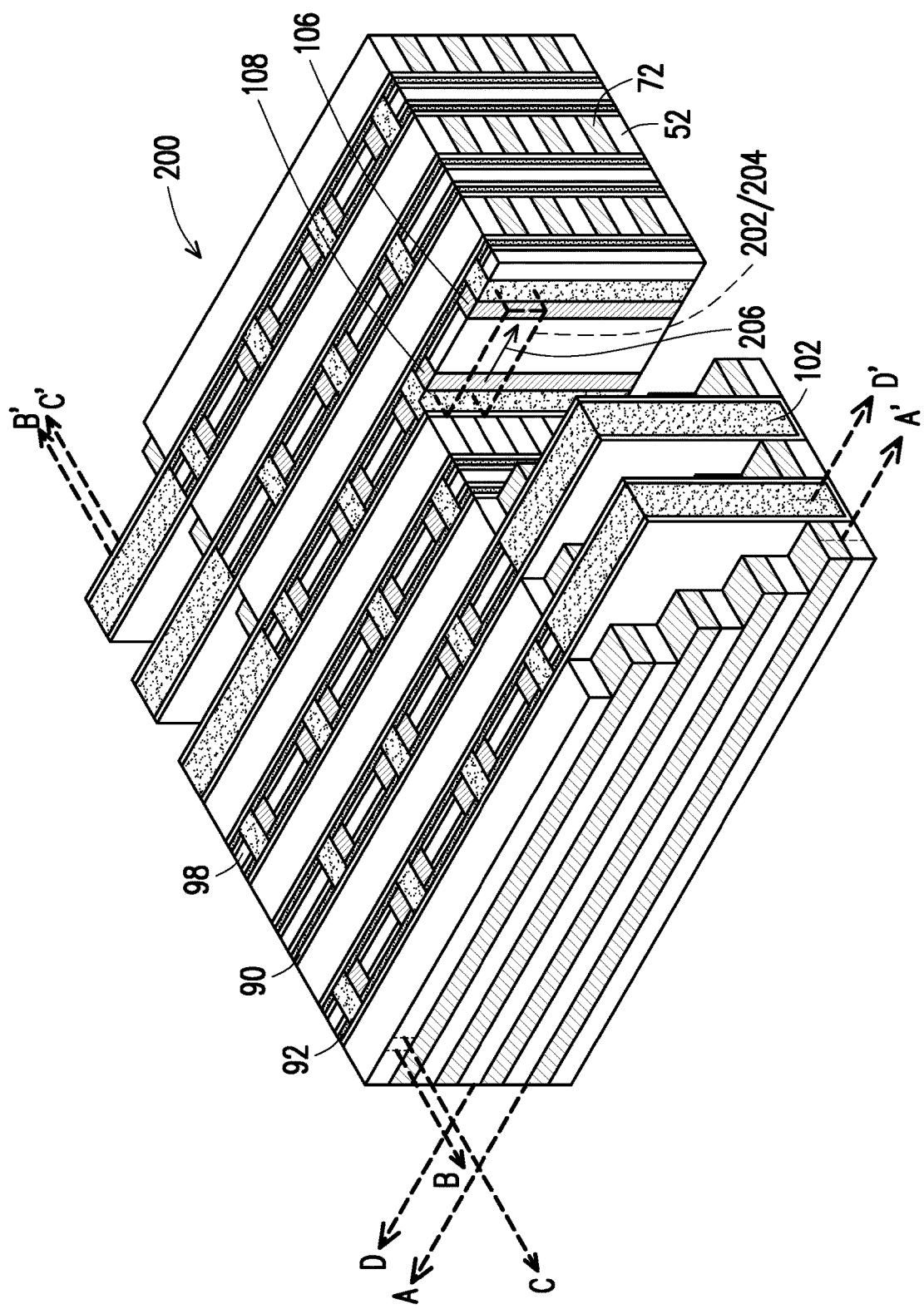
FIGS. 1A and 1B illustrate a perspective view and a circuit diagram of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a staircase structure for a 3D memory array with a plurality of stacked memory cells and a method for forming the same. The stacked memory cells may be vertically stacked over a complementary metal oxide semiconductor (CMOS) under array (CUA), which may be a logic die or the like. The stacked memory cells include word lines extending in a direction parallel to a major surface of the CUA in a staircase structure in which respective lengths of the word lines decrease in a direction away from the CUA. The staircase structure may be formed adjacent a first border and extending only partially along the first border of the memory array in a first region and adjacent a second border and extending only partially along the second border of the memory array opposite the first border in a second region. The staircase structure may be formed by depositing and patterning a hard mask over the word lines, forming a photoresist over the hard mask, and performing repeated trimming and etching processes on the photoresist and the underlying word lines. In comparison with processes in which staircase structures are formed along the entirety of the first border and the second border, forming the staircase structure along a portion of the first border in the first region and along a portion of the second border in the second region provides area saving benefits, which increases device density.

Figure 1B:
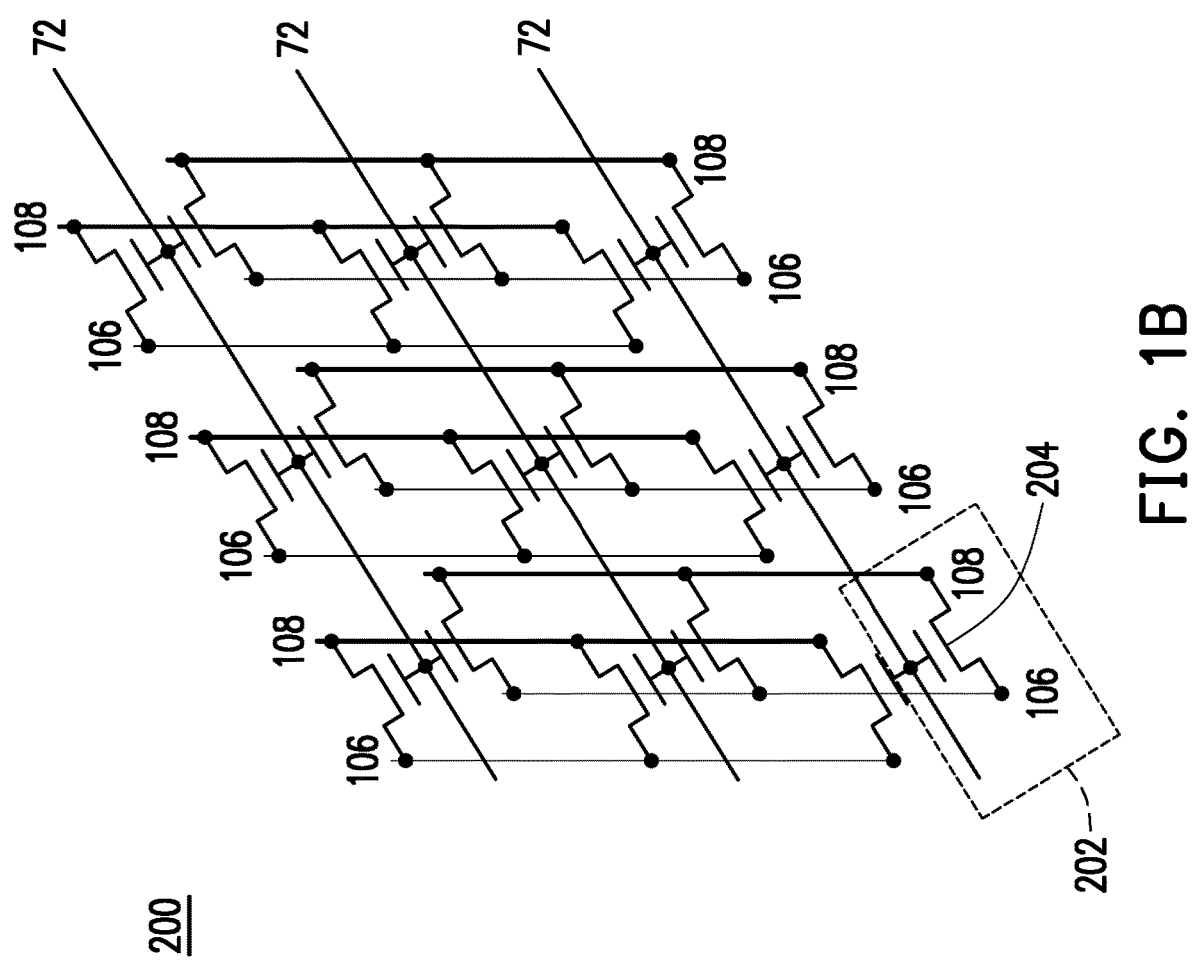

FIGS. 1A and 1B illustrate examples of a memory array 200, according to some embodiments. FIG. 1A illustrates an example of a portion of the memory array 200 in a three-dimensional view, in accordance with some embodiments, and FIG. 1B illustrates a circuit diagram of the memory array 200. The memory array 200 includes a plurality of memory cells 202, which may be arranged in a grid of rows and columns. The memory cells 202 may be further stacked vertically to provide a three dimensional memory array, thereby increasing device density. The memory array 200 may be disposed in the back end of line (BEOL) of a semiconductor die. For example, the memory array 200 may be disposed in the interconnect layers of the semiconductor die, such as above one or more active devices (e.g., transistors) formed on a semiconductor substrate.

In some embodiments, the memory array 200 is a flash memory array, such as a NOR flash memory array or the like. Each of the memory cells 202 may include a transistor 204 with a memory film 90. The memory film 90 may serve as a gate dielectric. In some embodiments, a gate of each transistor 204 is electrically coupled to a respective word line (e.g., a conductive line 72), a first source/drain region of each transistor 204 is electrically coupled to a respective bit line (e.g., a conductive line 106), and a second source/drain region of each transistor 204 is electrically coupled to a respective source line (e.g., a conductive line 108), which electrically couples the second source/drain region to ground. The memory cells 202 in a same horizontal row of the memory array 200 may share a common word line, while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not separately illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to contact an exposed portion of each of the conductive lines 72.

The memory array 200 further includes a plurality of conductive lines 106 (e.g., bit lines) and a plurality of conductive lines 108 (e.g., source lines). The conductive lines 106 and the conductive lines 108 may each extend in a direction perpendicular to the conductive lines 72. Dielectric materials 98 are disposed between and isolate adjacent ones of the conductive lines 106 and the conductive lines 108. Pairs of the conductive lines 106 and the conductive lines 108 along with an intersecting conductive line 72 define boundaries of each memory cell 202, and dielectric materials 102 are disposed between and isolate adjacent pairs of the conductive lines 106 and the conductive lines 108. In some embodiments, the conductive lines 108 are electrically coupled to ground. Although FIG. 1A illustrates a particular placement of the conductive lines 106 relative to the conductive lines 108, it should be appreciated that the placement of the conductive lines 106 and the conductive lines 108 may be flipped.

The memory array 200 may also include an oxide semiconductor (OS) layer 92. The OS layer 92 may provide channel regions for the transistors 204 of the memory cells 202. For example, when an appropriate voltage (e.g., higher than a respective threshold voltage ($V_{th}$) of a corresponding transistor 204) is applied through a corresponding conductive line 72, a region of the OS layer 92 that intersects the conductive line 72 may allow current to flow from the conductive lines 106 to the conductive lines 108 (e.g., in the direction indicated by arrow 206).

The memory film 90 is disposed between the conductive lines 72 and the OS layer 92, and the memory film 90 may provide gate dielectrics for the transistors 204. In some embodiments, the memory film 90 comprises a ferroelectric (FE) material, such as hafnium oxide, hafnium zirconium oxide, silicon-doped hafnium oxide, or the like. Accordingly, the memory array 200 may be referred to as a ferroelectric random access memory (FERAM) array. Alternatively, the memory film 90 may be a multilayer structure, a different ferroelectric material, a different type of memory layer (e.g., capable of storing a bit), or the like.

In embodiments in which the memory film 90 comprises an FE material, the memory film 90 may be polarized in one of two different directions. The polarization direction may be changed by applying an appropriate voltage differential across the memory film 90 and generating an appropriate electric field. The polarization may be relatively localized (e.g., generally contained within each boundaries of the memory cells 202) and continuous regions of the memory film 90 may extend across a plurality of memory cells 202. Depending on a polarization direction of a particular region of the memory film 90, a threshold voltage of a corresponding transistor 204 varies and a digital value (e.g., a 0 or a 1) can be stored. For example, when a region of the memory film 90 has a first electrical polarization direction, the corresponding transistor 204 may have a relatively low threshold voltage, and when the region of the memory film 90 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202, a write voltage is applied across a portion of the memory film 90 corresponding to the memory cell 202. The write voltage can be applied, for example, by applying appropriate voltages to a corresponding conductive line 72 (e.g., a corresponding word line) and the corresponding conductive lines 106 and conductive lines 108 (e.g., corresponding bit and source lines). By applying the write voltage across the portion of the memory film 90, a polarization direction of the region of the memory film 90 can be changed. As a result, the corresponding threshold voltage of the corresponding transistor 204 can be switched from a low threshold voltage to a high threshold voltage or vice versa and a digital value can be stored in the memory cell 202. Because the conductive lines 72 intersect the conductive lines 106 and the conductive lines 108, individual memory cells 202 may be selected for the write operation.

To perform a read operation on the memory cell 202, a read voltage (e.g., a voltage between the low and high threshold voltages) is applied to the corresponding conductive line 72 (e.g., the corresponding word line). Depending on the polarization direction of the corresponding region of the memory film 90, the transistor 204 of the memory cell 202 may or may not be turned on. As a result, the corresponding conductive line 106 may or may not be discharged through the corresponding conductive line 108 (e.g., the corresponding source line that is coupled to ground), and the digital value stored in the memory cell 202 can be determined. Because the conductive lines 72 intersect the conductive lines 106 and the conductive lines 108, individual memory cells 202 may be selected for the read operation.

FIG. 1A further illustrates reference cross-sections of the memory array 200 that are used in later figures. Cross-section A-A' is along longitudinal axes of conductive lines 72 and in a direction, for example, parallel to the direction of current flow across the OS layer 92 of the transistors 204. Cross-section B-B' is perpendicular to the cross-section A-A' and the longitudinal axes of the conductive lines 72. The cross-section B-B' extends through the dielectric materials 98 and the dielectric materials 102. Cross-section C-C' is parallel to the cross-section B-B' and extends through the conductive lines 106. Cross-section D-D' is parallel to the cross-section A-A' and extends through the dielectric materials 102. Subsequent figures refer to these reference cross-sections for clarity.

Figure 26A:
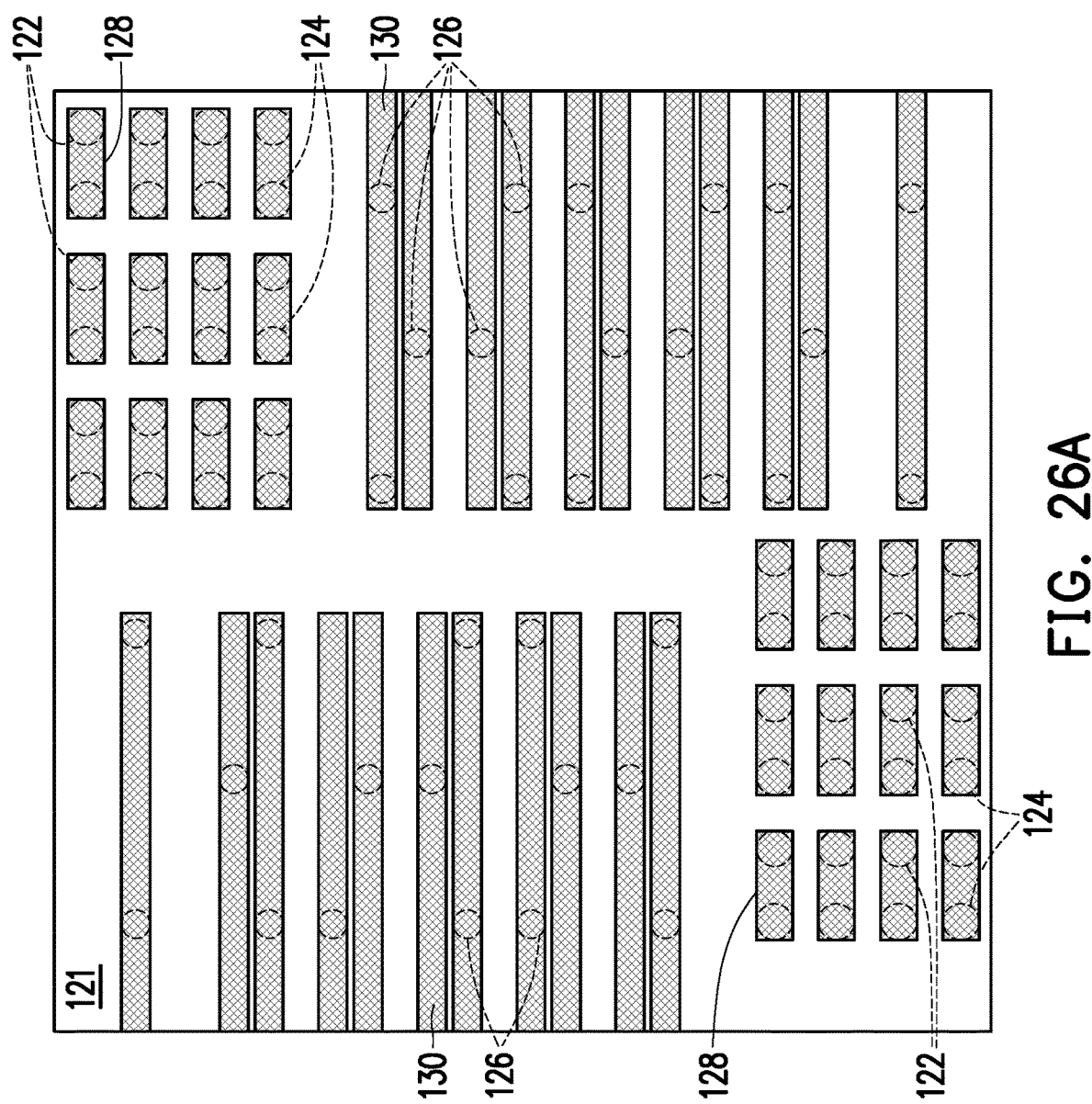
Figure 26B:
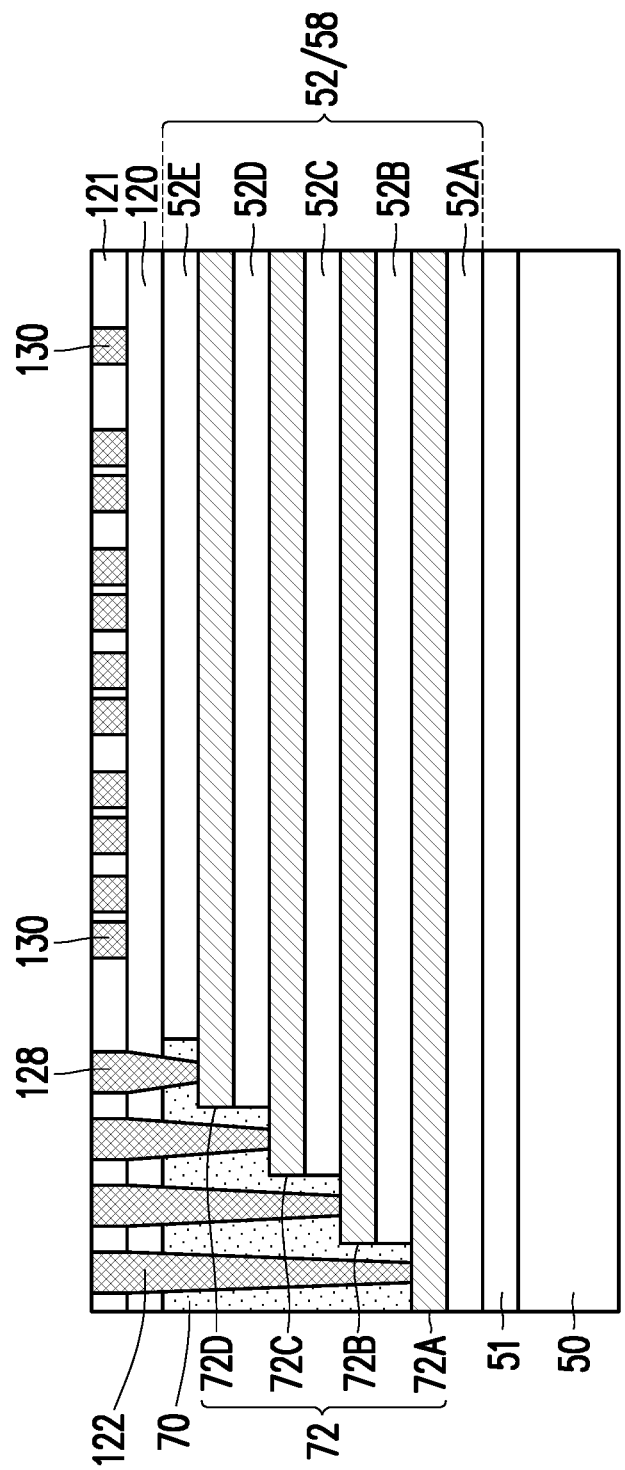
Figure 26C:
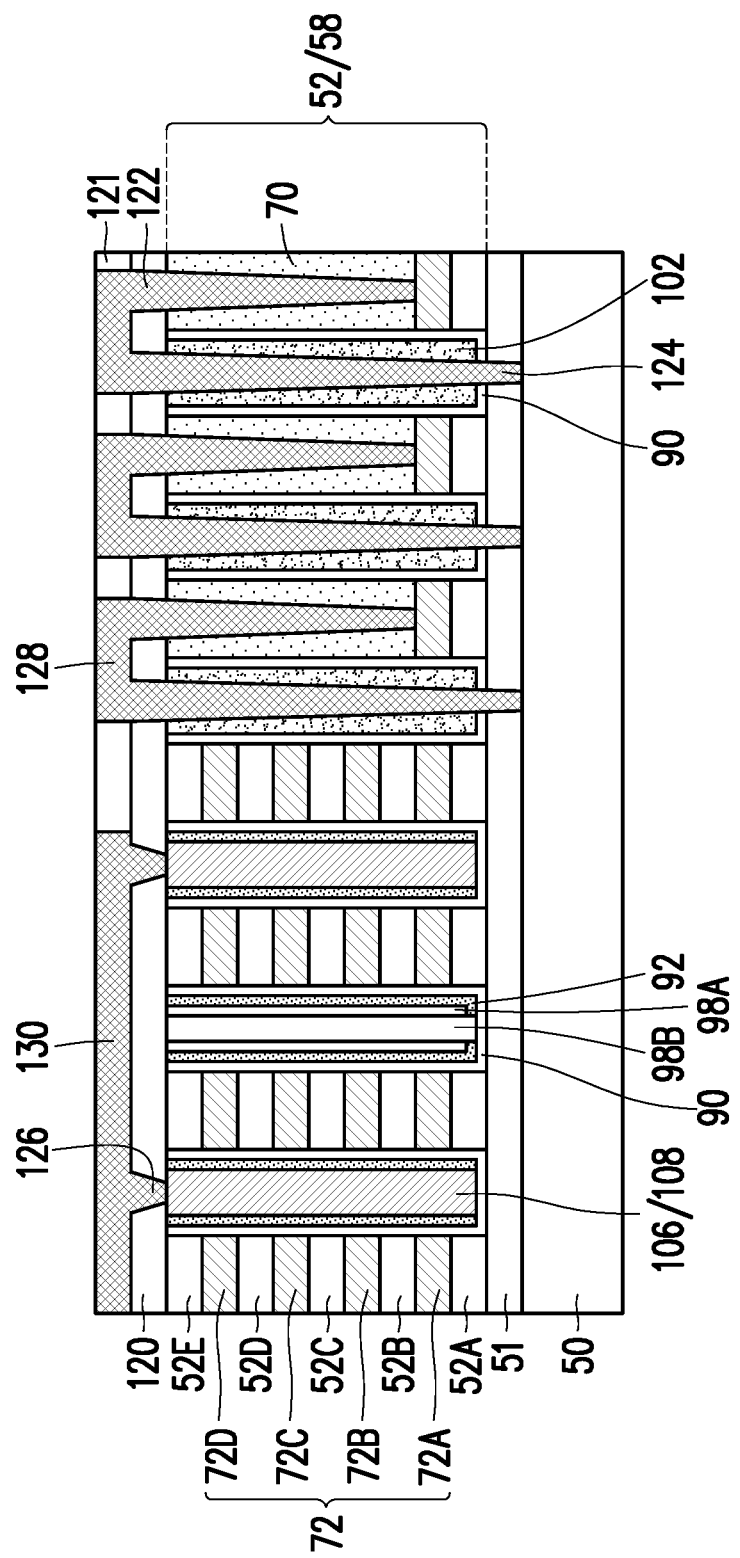
Figure 26D:
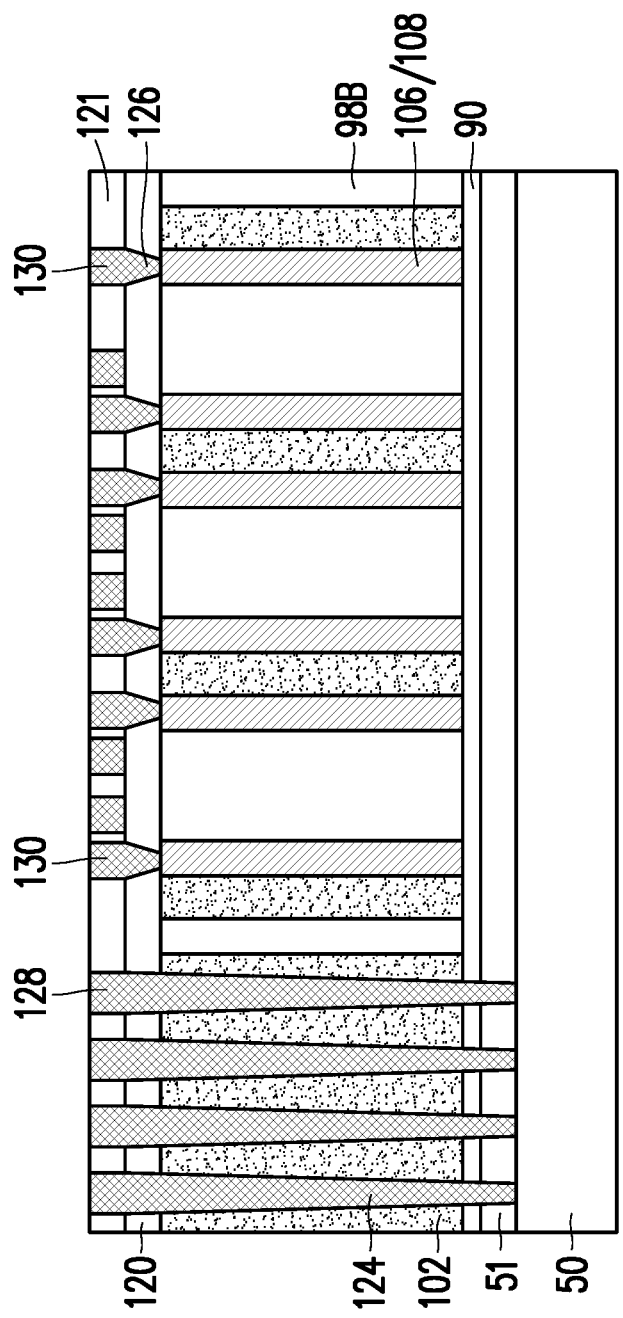
Figure 26E:
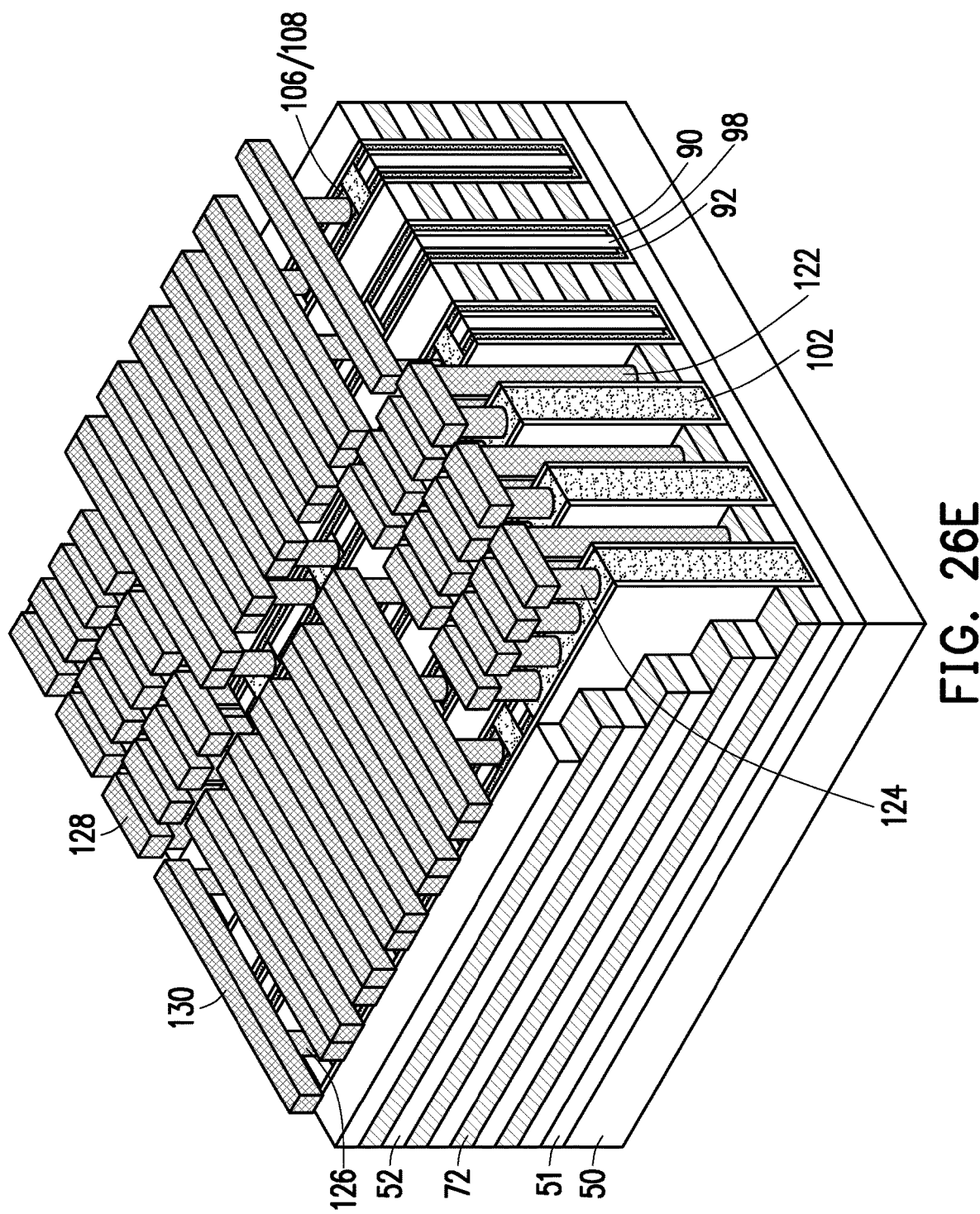

FIGS. 2 through 35 are views of intermediate stages in the manufacturing of the memory array 200, in accordance with some embodiments. FIGS. 2, 3, 4B, 5B, 6B, 7B, 8B, 9B, 10B, 11B, 12B, 15B, 24B, 25B, 26B, and 36B are illustrated along reference cross-section A-A' illustrated in FIG. 1A. FIGS. 4C, 5C, 6C, 7C, 8C, 9C, 10C, 11C, 12C, 13B, 14B, 15C, 16B, 17B, 18B, 19B, 20B, 21B, 22B, 23B, 28, 29, 30, 31, 32, 33, 34, and 35 are illustrated along reference cross-section B-B' illustrated in FIG. 1A. FIGS. 22C, 23C, 24C, 25C, 26C, and 36C are illustrated along reference cross-section C-C' illustrated in FIG. 1A. FIGS. 24D, 25D, 26D, and 36D are illustrated along reference cross-section D-D' illustrated in FIG. 1A. FIGS. 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27, and 36A illustrate top-down views. FIGS. 26E and 36E illustrate perspective views.

Figure 2:
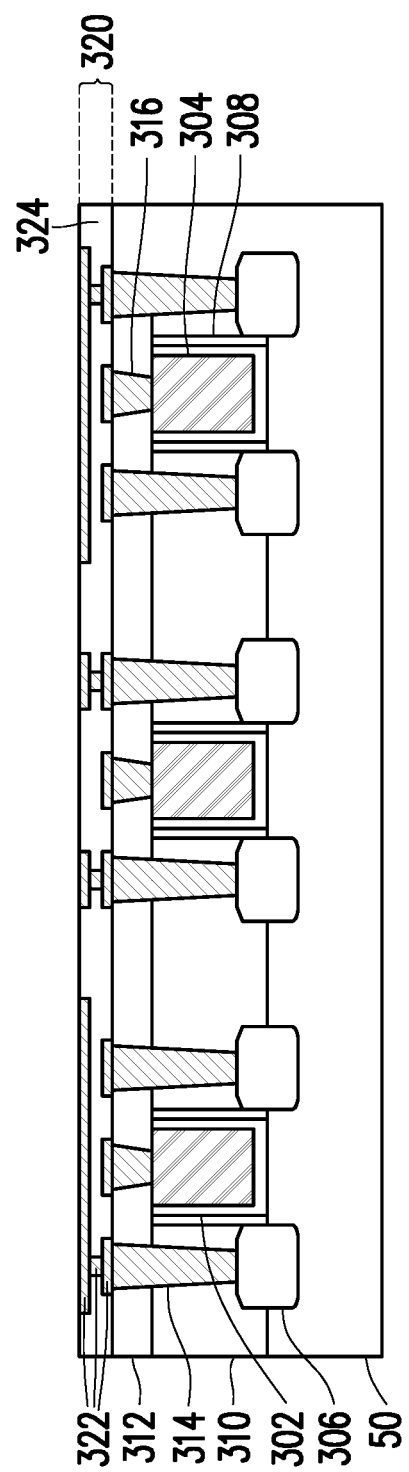

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as multi-layered or gradient substrates may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may comprise fin field effect transistors (FinFETs), nanostructure (e.g., nanosheet, nanowire, gate-all-around, or the like) FETs (nano-FETs), planar FETs, the like, or combinations thereof, and may be formed by gate-first processes or gate-last processes.

A first ILD 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 including one or more stacked dielectric layers 324 and conductive features 322 formed in the one or more dielectric layers 324 is over the second ILD 312, the source/drain contacts 314, and the gate contacts 316. The interconnect structure 320 may be electrically connected to the gate contacts 316 and the source/drain contacts 314 to form functional circuits. In some embodiments, the functional circuits formed by the interconnect structure 320 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits. The transistors, the ILDs, and the interconnect structure 320 formed over the substrate 50 may be omitted from subsequent drawings for the purposes of simplicity and clarity. The substrate 50 along with the transistors (e.g., the source/drain regions 306, the gate dielectric layers 302, and the gate electrodes 304), the gate spacers 308, the first ILD 310, the second ILD 312, and the interconnect structure 320 may be a CMOS under array (CUA), a logic die, or the like.

Figure 3:
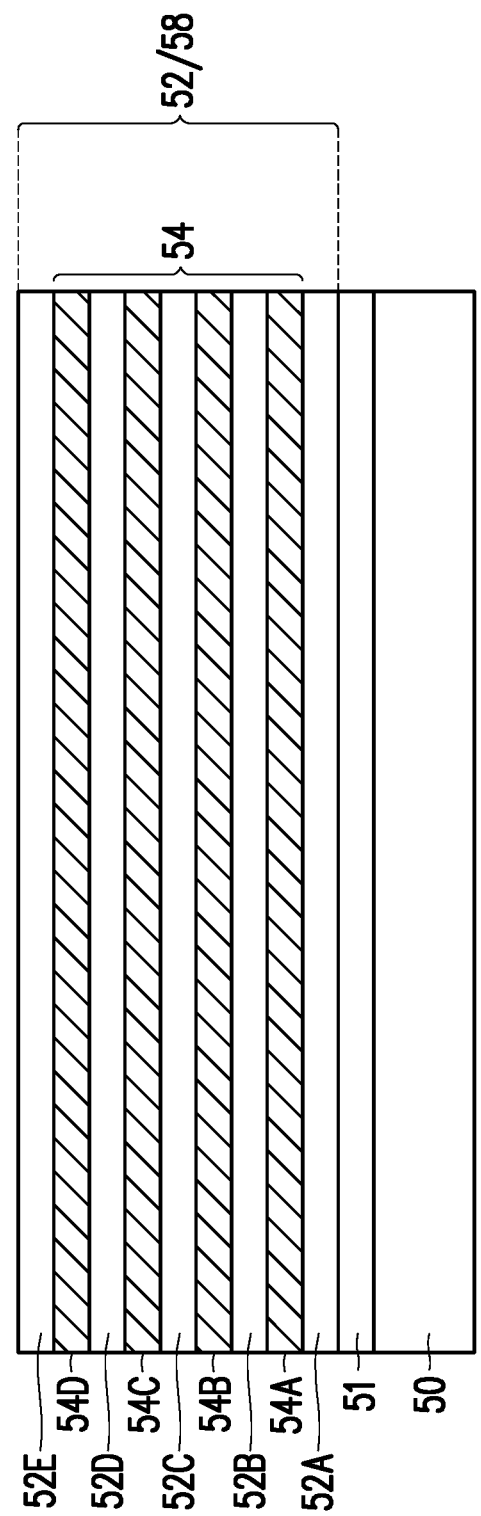

In FIG. 3, an etch stop layer 51 and a multi-layer stack 58 are formed over the substrate 50. Although the etch stop layer 51 is illustrated as contacting the substrate 50, any number of intermediate layers may be disposed between the substrate 50 and the etch stop layer 51. For example, one or more interconnect layers comprising conductive features in insulting layers (e.g., low-k dielectric layers) may be disposed between the substrate 50 and the etch stop layer 51. In some embodiments, the conductive features may be patterned to provide power, ground, and/or signal lines for the active devices on the substrate 50 and/or the memory array 200 (see FIGS. 1A and 1B).

The etch stop layer 51 may act as a stop for etching processes subsequently performed on overlying layers, such as the layers of the multi-layer stack 58. The etch stop layer 51 may be formed of a material having a high etch selectivity to the materials of the multi-layer stack 58 such that the multi-layer stack 58 may be etched without significantly etching the etch stop layer 51. In some embodiments, the etch stop layer 51 may be formed of silicon nitride, SiON, SiCON, SiC, SiOC, $SiC_xN_y$, $SiO_x$, other dielectrics, combinations thereof, or the like, and may be formed by chemical vapor deposition (CVD), atomic layer deposition (ALD), or the like.

The multi-layer stack 58 includes alternating layers of conductive layers 54A-54D (collectively referred to as conductive layers 54) and dielectric layers 52A-52E (collectively referred to as dielectric layers 52). The conductive layers 54 may be patterned in subsequent steps to define conductive lines 72 (e.g., word lines). The conductive layers 54 may comprise conductive materials, such as, copper, titanium, titanium nitride, tantalum, tantalum nitride, tungsten, ruthenium, aluminum, cobalt, silver, gold, nickel, chromium, hafnium, platinum, combinations thereof, or the like. The dielectric layers 52 may comprise insulating materials, such as silicon oxide, silicon nitride, silicon oxynitride, combinations thereof, or the like. The conductive layers 54 and the dielectric layers 52 may each be formed using, for example, CVD, ALD, physical vapor deposition (PVD), plasma enhanced CVD (PECVD), or the like. Although FIG. 3 illustrates a particular number of the conductive layers 54 and the dielectric layers 52, other embodiments may include different numbers of the conductive layers 54 and the dielectric layers 52.

Figure 4A:
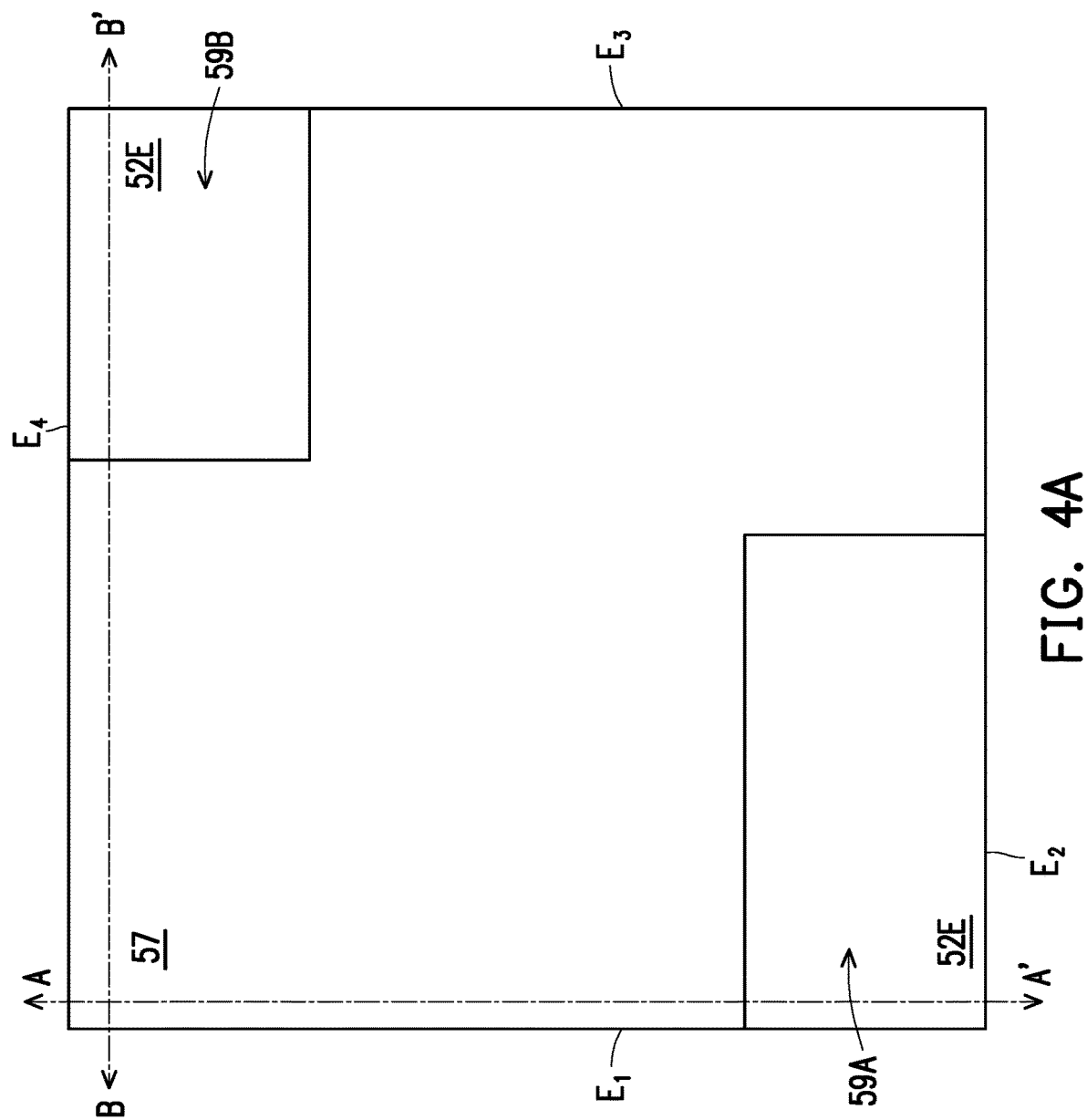
Figure 4B:
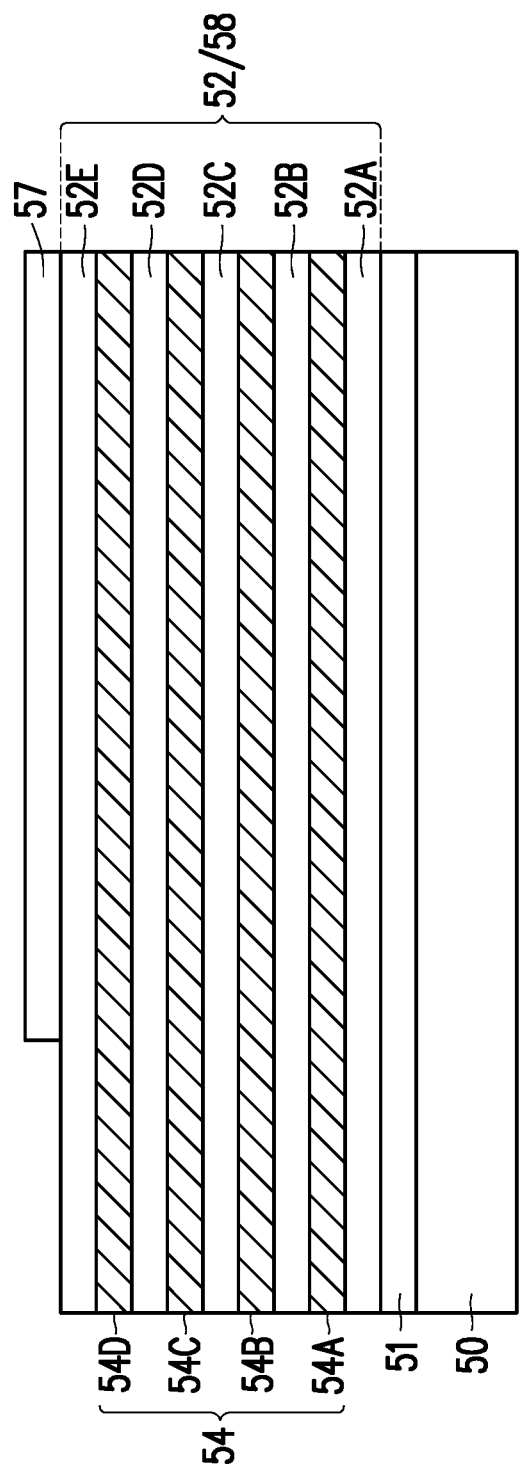
Figure 4C:
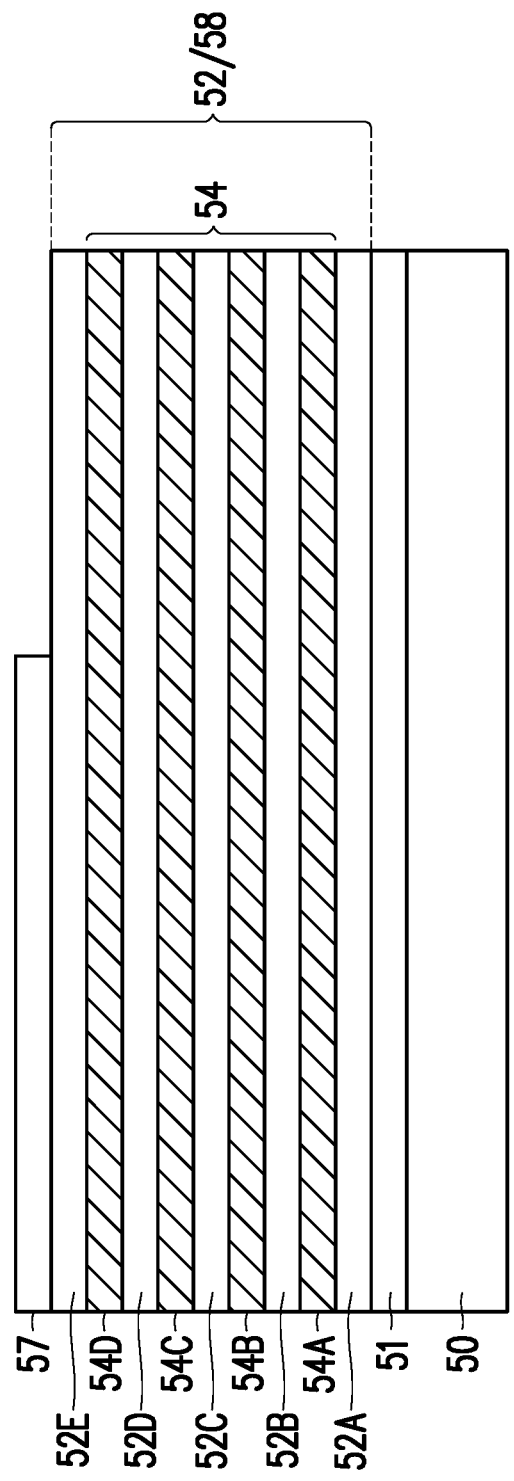
Figure 9A:
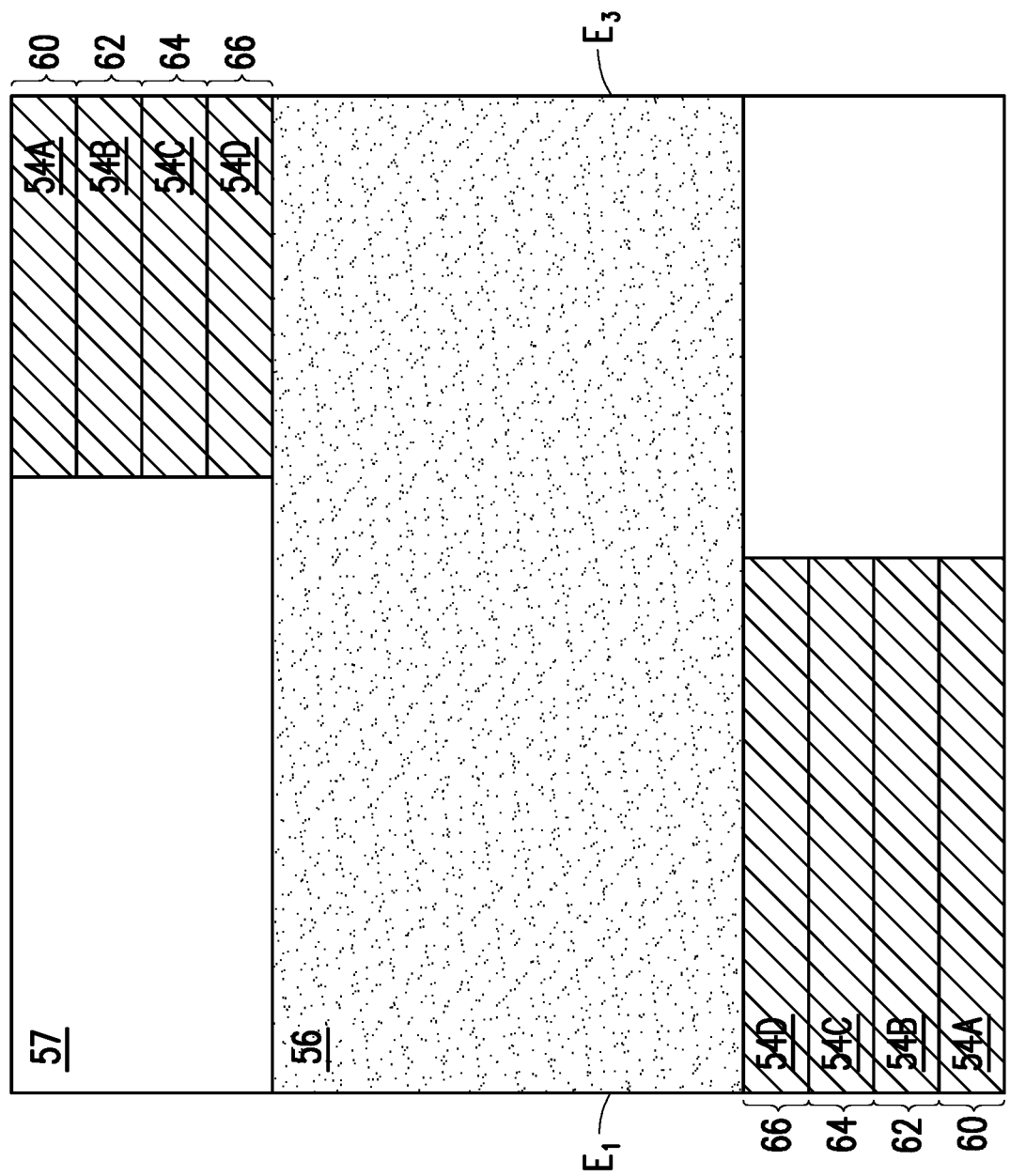
Figure 9B:
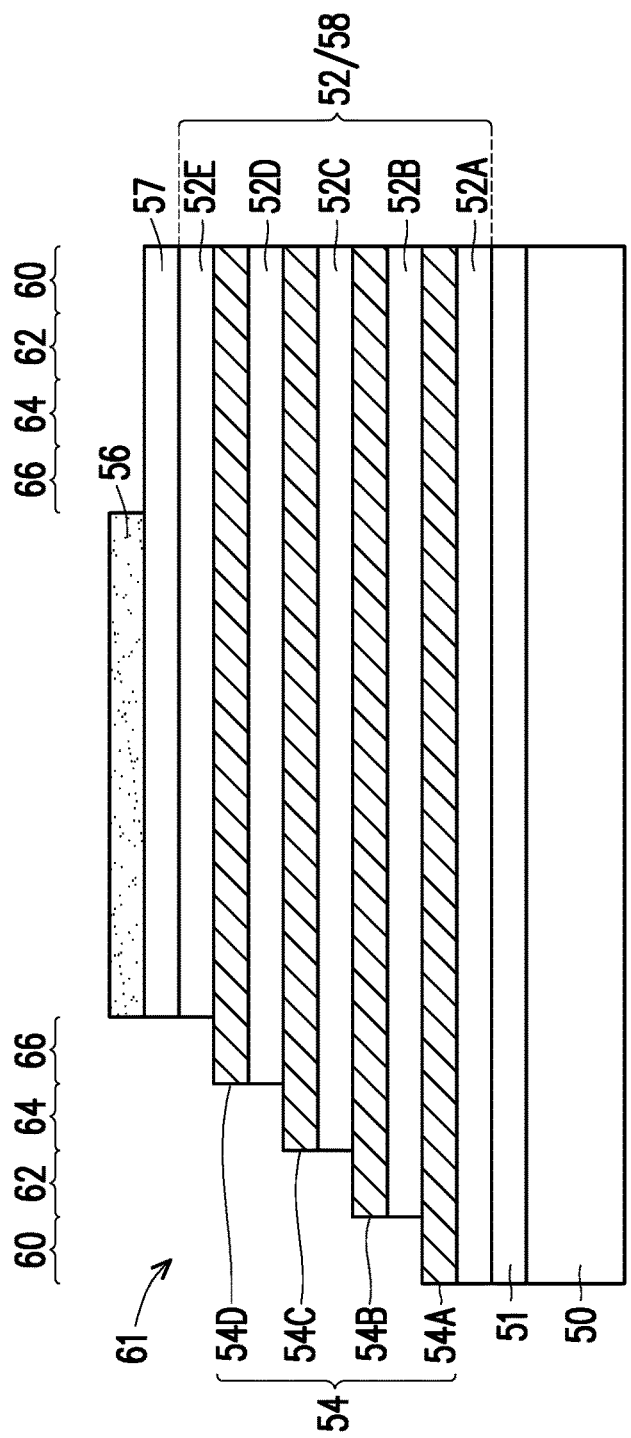
Figure 9C:
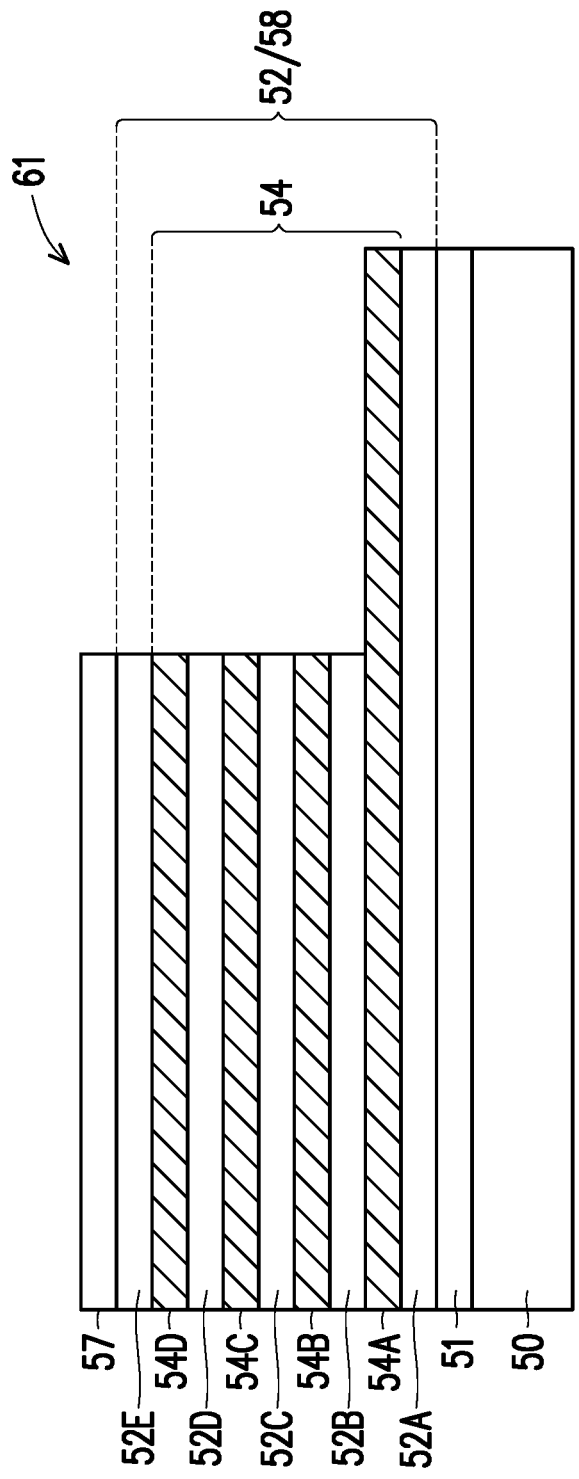
Figure 10A:
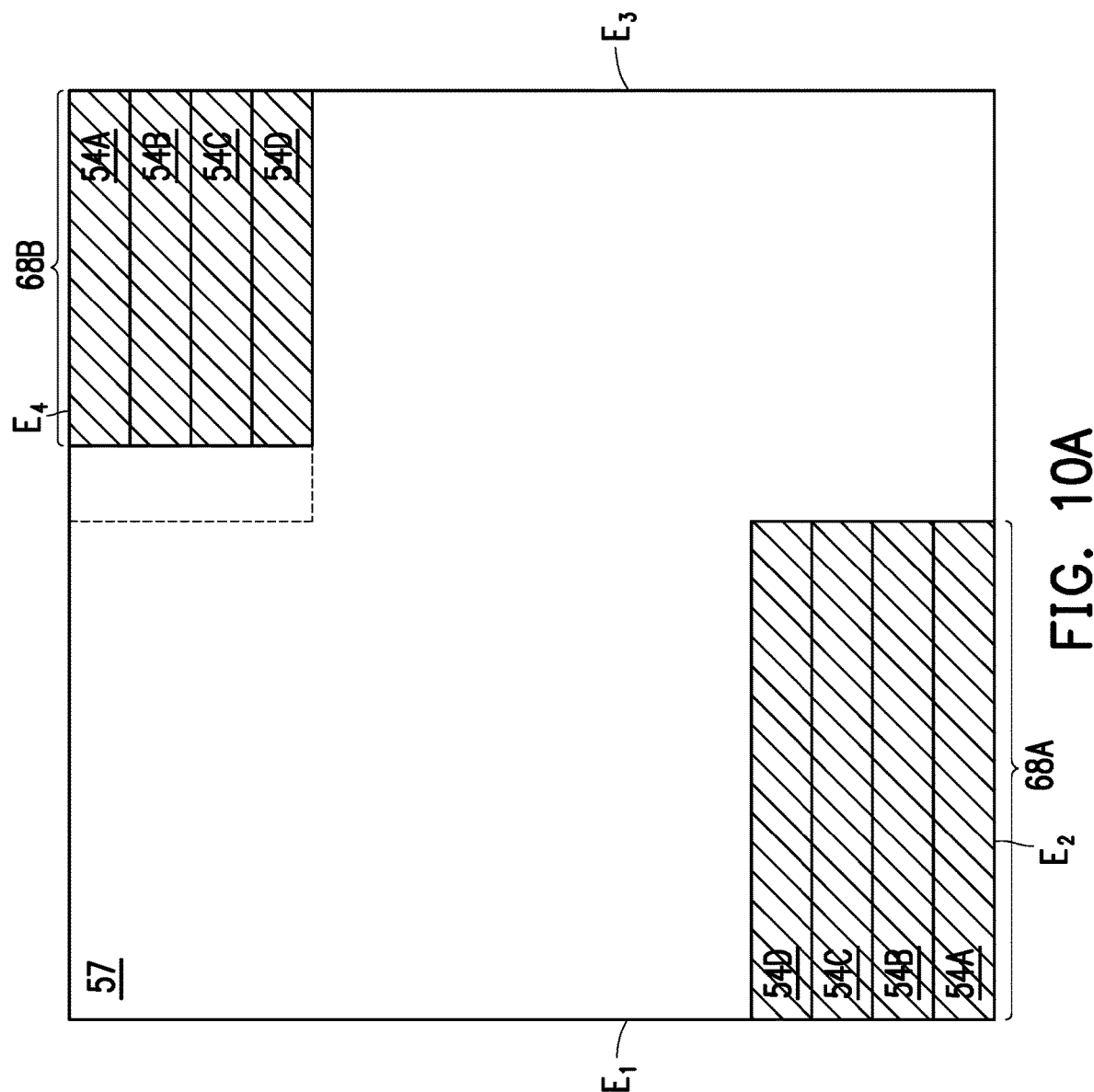
Figure 10B:
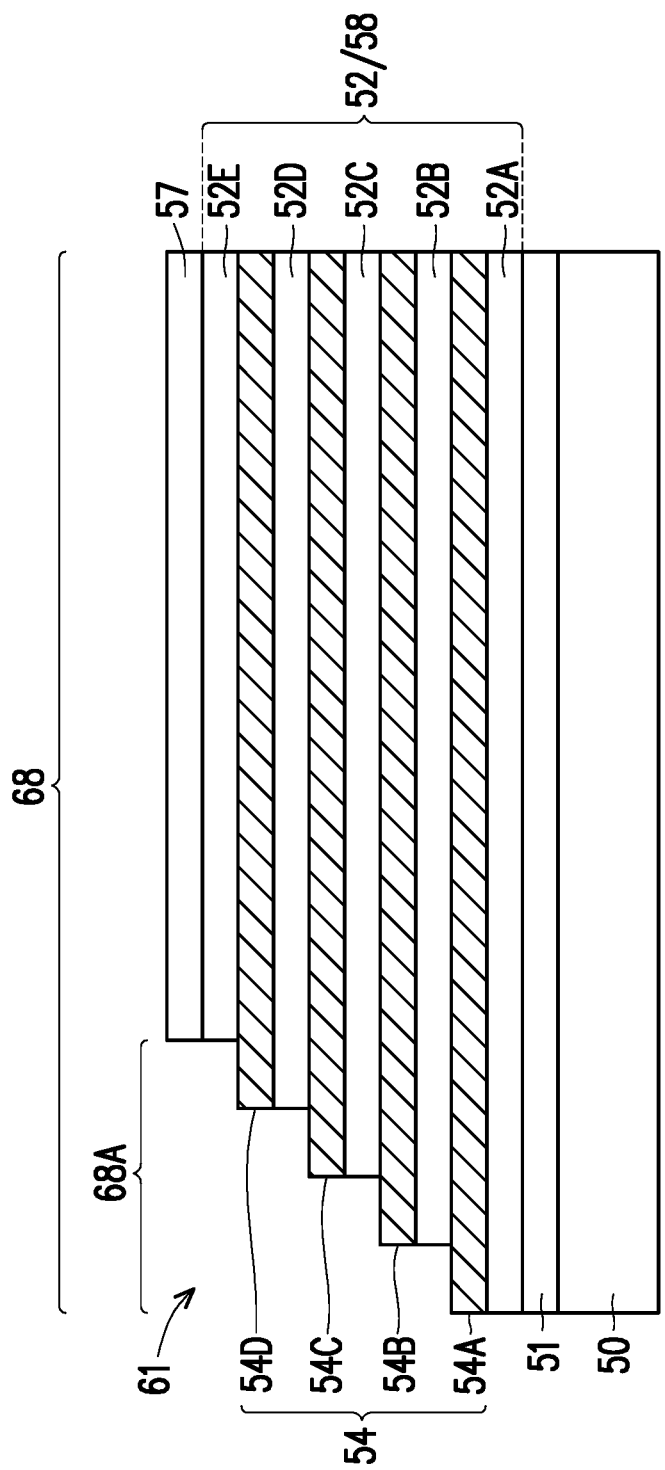
Figure 10C:
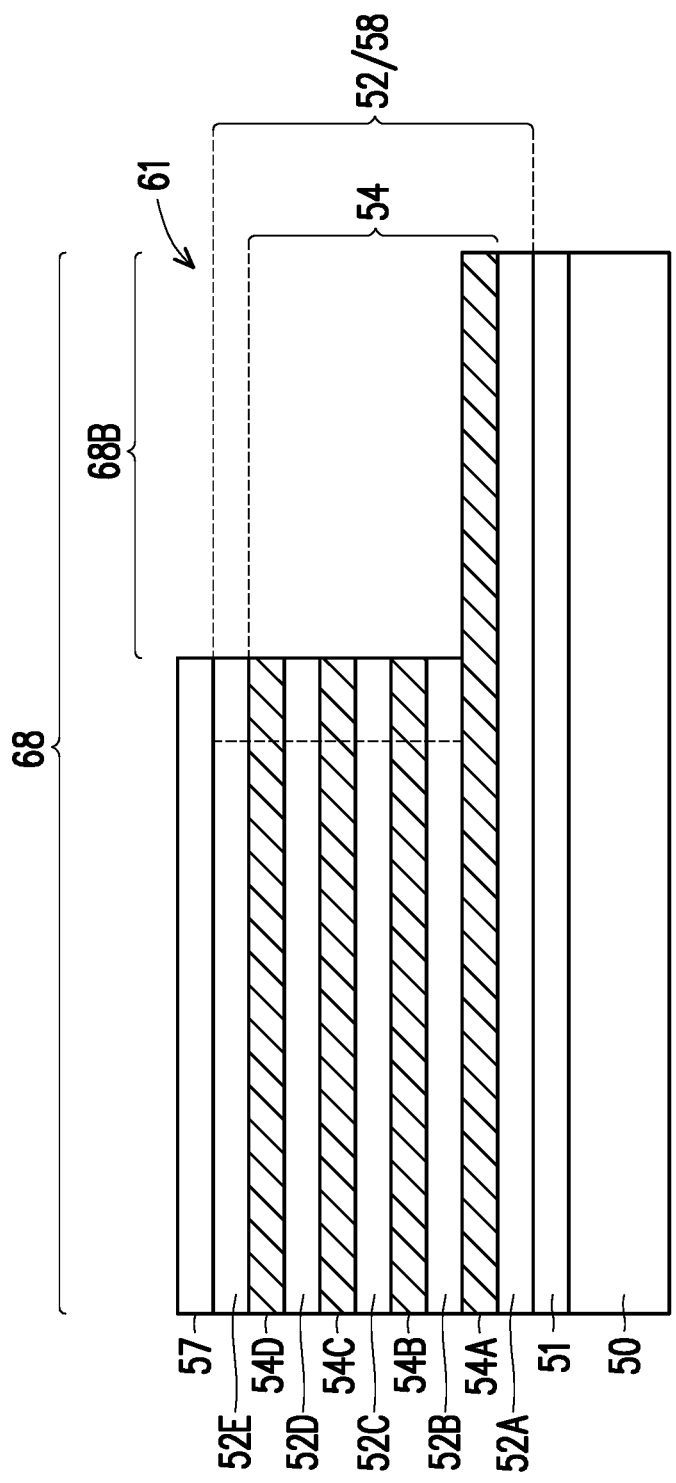

FIGS. 4A through 10C illustrate patterning the multi-layer stack 58 to form a staircase structure 68 (illustrated in FIGS. 10A through 10C). In FIGS. 4A through 4C, a patterned hard mask 57 is formed over the multi-layer stack 58. The patterned hard mask 57 may act as a mask for etching the multi-layer stack 58 to form the staircase structure 68 in selected portions of the multi-layer stack 58. In some embodiments, the selected regions of the multi-layer stack 58 may correspond to locations of the subsequently formed staircase structure 68. A hard mask layer (not separately illustrated) may be deposited on a top surface of the dielectric layer 52E. The hard mask layer may be deposited by CVD, ALD, or the like. The hard mask layer may then be patterned using a lithography process to form the patterned hard mask 57. The hard mask layer may comprise amorphous silicon (a-Si), silicon carbide (SiC), silicon oxycarbide (SiOC), silicon oxycarbonitride (SiOCN), silicon carbonitride (SiCN), a high-k dielectric material, combinations or multiple layers thereof, or the like.

As illustrated in FIG. 4A, the patterned hard mask 57 may be patterned to include a first opening 59A exposing a first portion of the dielectric layer 52E and a second opening 59B exposing a second portion of the dielectric layer 52E. The first opening 59A may be formed extending from a first edge $E_1$ and a second edge $E_2$ of the structure and the second opening 59B may be formed extending from a third edge $E_3$ and a fourth edge $E_4$ of the structure opposite the first edge $E_1$ and the second edge $E_2$. As illustrated in FIG. 4A, the first opening 59A and the second opening 59B may be staggered in a direction parallel to the second edge $E_2$ and the fourth edge $E_4$. The staircase structure 68 will subsequently be formed by patterning through the first opening 59A and the second opening 59B. Forming the first opening 59A and the second opening 59B in the staggered configuration of FIG. 4A allows for the staircase structure 68 to be formed with a staggered configuration. This allows for connections to be made between the conductive layers 54A-54D and circuits on the underlying substrate 50 proximal both the second edge $E_2$ and the fourth edge $E_4$, with area savings compared to devices which include staircase structures extending along the length of the second edge $E_2$ and the fourth edge $E_4$. Moreover, including the patterned hard mask 57 allows for patterning and trimming of a photoresist (such as the photoresist 56, discussed below with respect to FIGS. 5A through 9C) subsequently formed over the patterned hard mask 57 to be simplified, helps to protect portions of the multi-layer stack 58 from undesired etching, and improves the accuracy of patterning the staircase structure 68. This reduces costs, reduces device defects, and improves device performance.

FIG. 4A further illustrates reference cross-sections that are used in later figures. Cross-section A-A' extends through the first opening 59A along longitudinal axes of subsequently formed conductive lines (such as the conductive lines 72, discussed below with respect to FIGS. 14A and 14B). Cross-section B-B' extends through the second opening 59B in a direction perpendicular to cross-section A-A'.

Figure 5B:
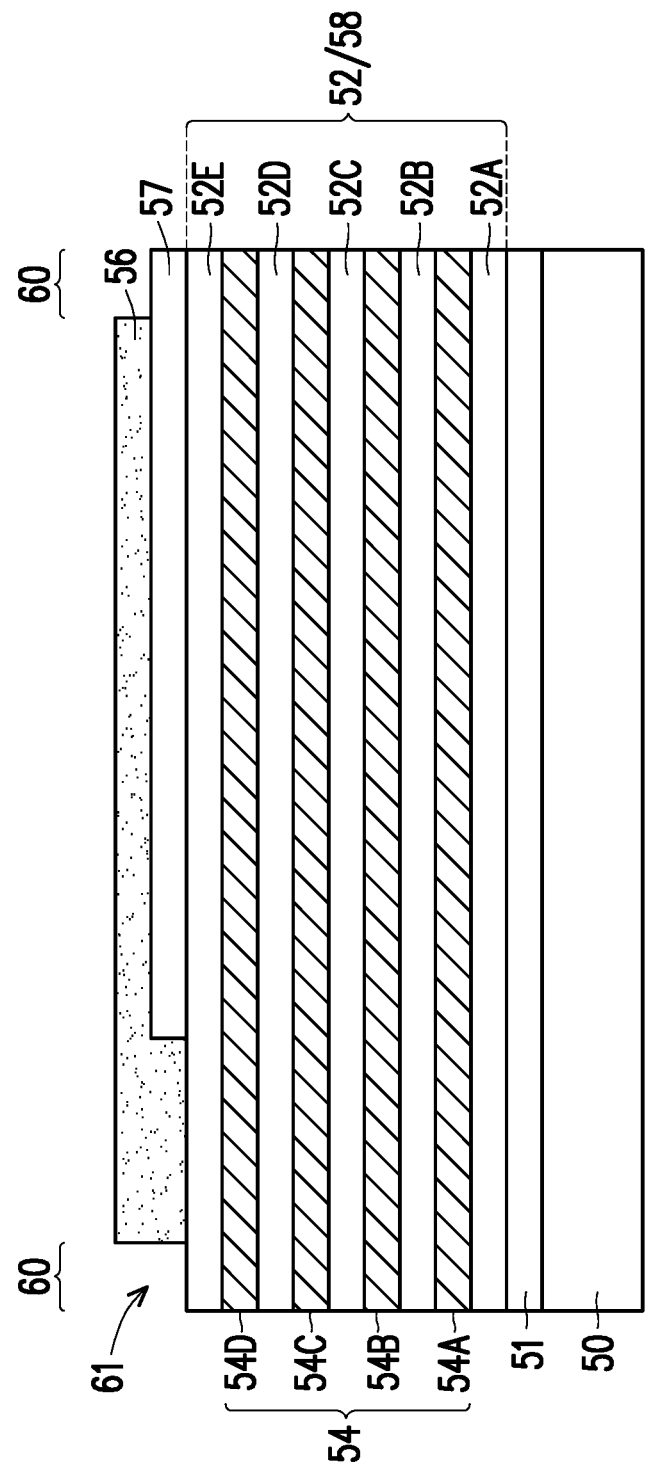

In FIGS. 5A through 5C a photoresist 56 is formed over the multi-layer stack 58 and the patterned hard mask 57. The photoresist 56 can be formed by using a spin-on technique and can be patterned using acceptable photolithography techniques. Patterning the photoresist 56 may expose the multi-layer stack 58 in a region 60, while masking remaining portions of the multi-layer stack 58. For example, a topmost layer of the multi-layer stack 58 (e.g., the dielectric layer 52E) may be exposed in the region 60.

Figure 6A:
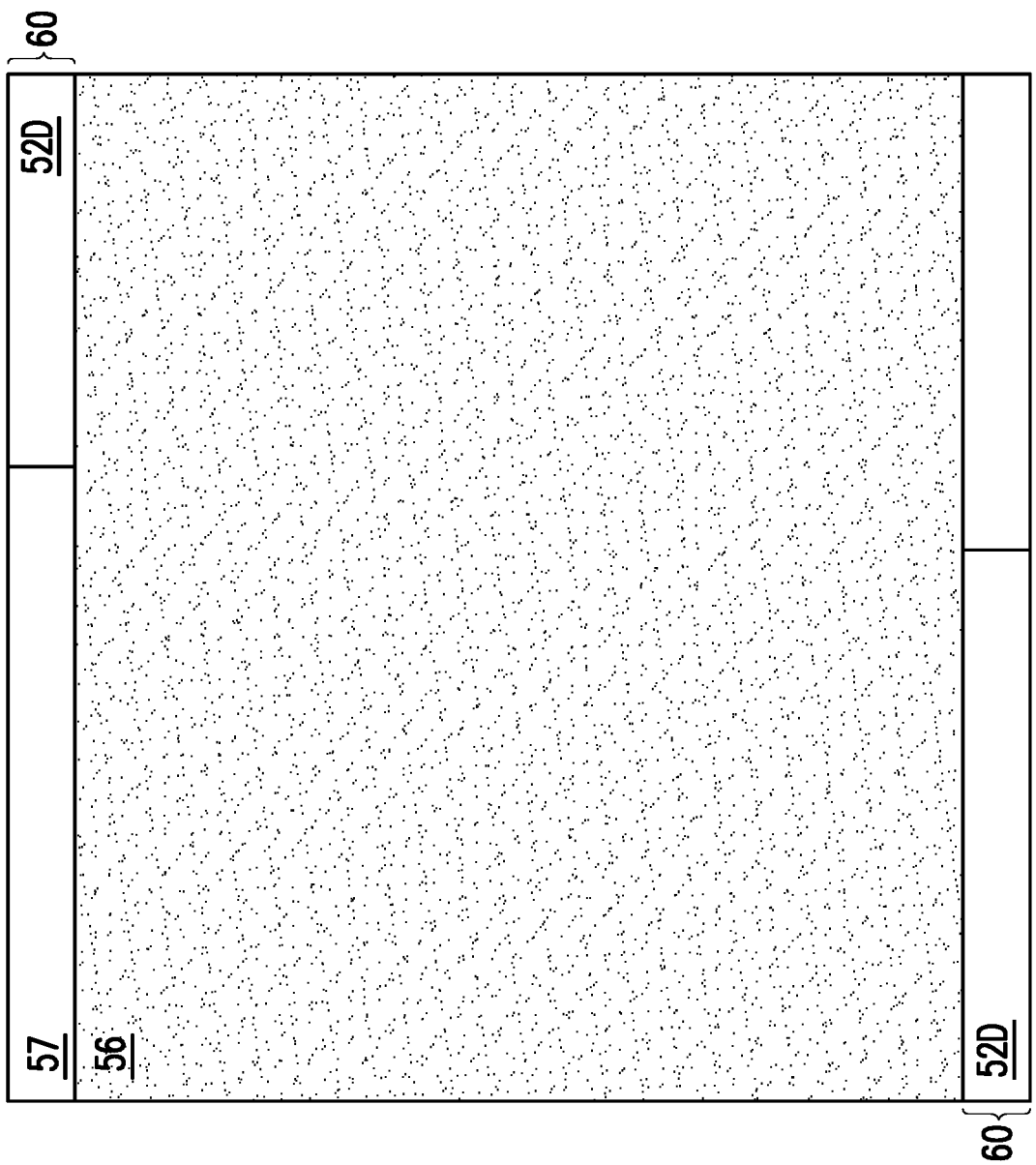
Figure 6B:
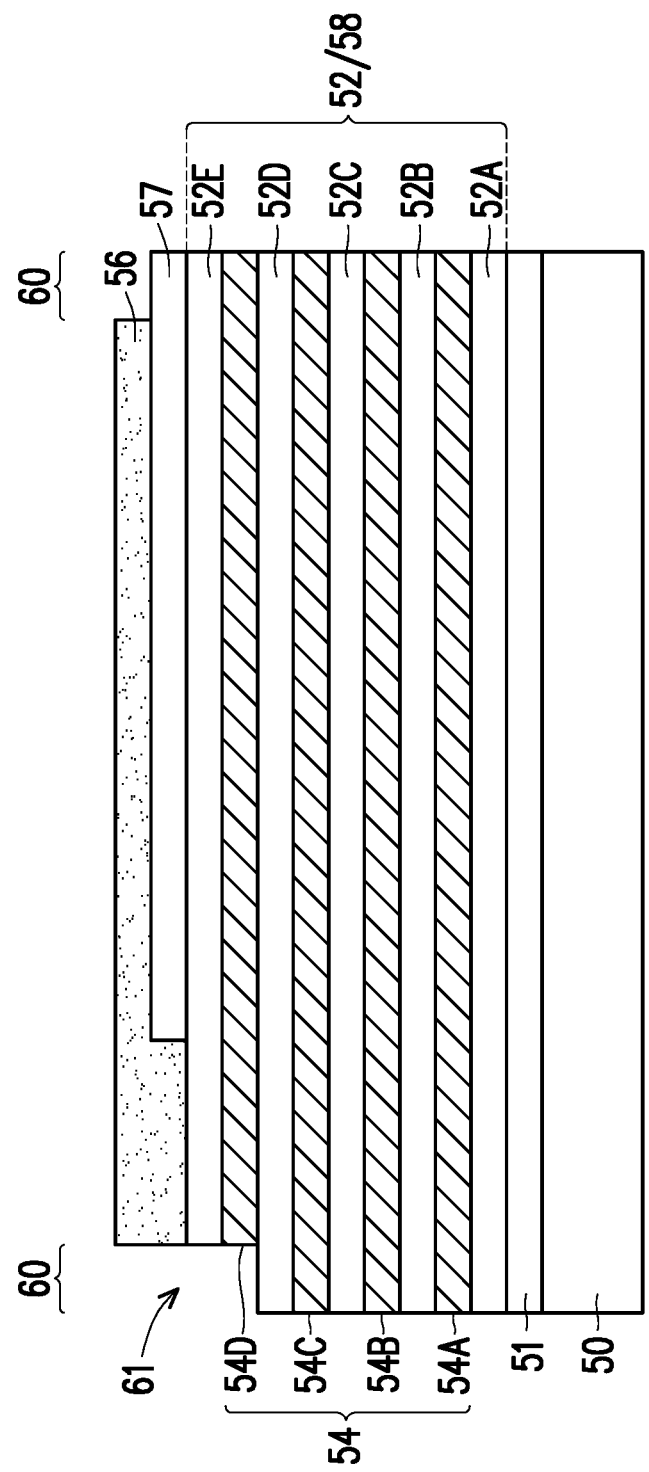
Figure 6C:
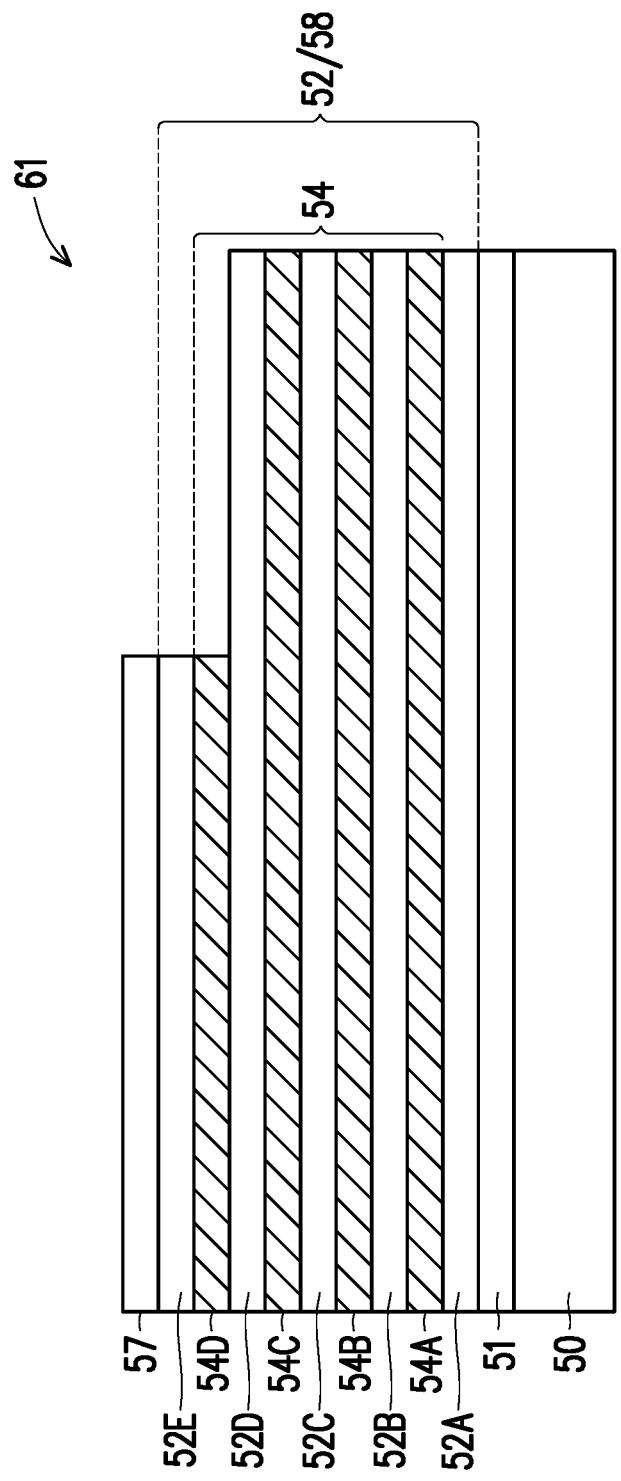

In FIGS. 6A through 6C, the exposed portions of the multi-layer stack 58 in the region 60 are etched using the photoresist 56 as a mask. The etching may be any acceptable etch process, such as wet or dry etching, RIE, NBE, the like, or a combination thereof. The etching may be anisotropic. The etching may remove portions of the dielectric layer 52E and the conductive layer 54D in the region 60 and define an opening 61. Because the dielectric layer 52E and the conductive layer 54D have different material compositions, etchants used to remove exposed portions of these layers may be different. In some embodiments, the conductive layer 54D acts as an etch stop layer while etching the dielectric layer 52E, and the dielectric layer 52D acts as an etch stop layer while etching the conductive layer 54D. As a result, the portions of the dielectric layer 52E and the conductive layer 54D may be selectively removed without removing remaining layers of the multi-layer stack 58, and the opening 61 may be extended to a desired depth. Alternatively, a timed etch processes may be used to stop the etching of the opening 61 after the opening 61 reach a desired depth. In the resulting structure, the dielectric layer 52D is exposed in the region 60.

Figure 7A:
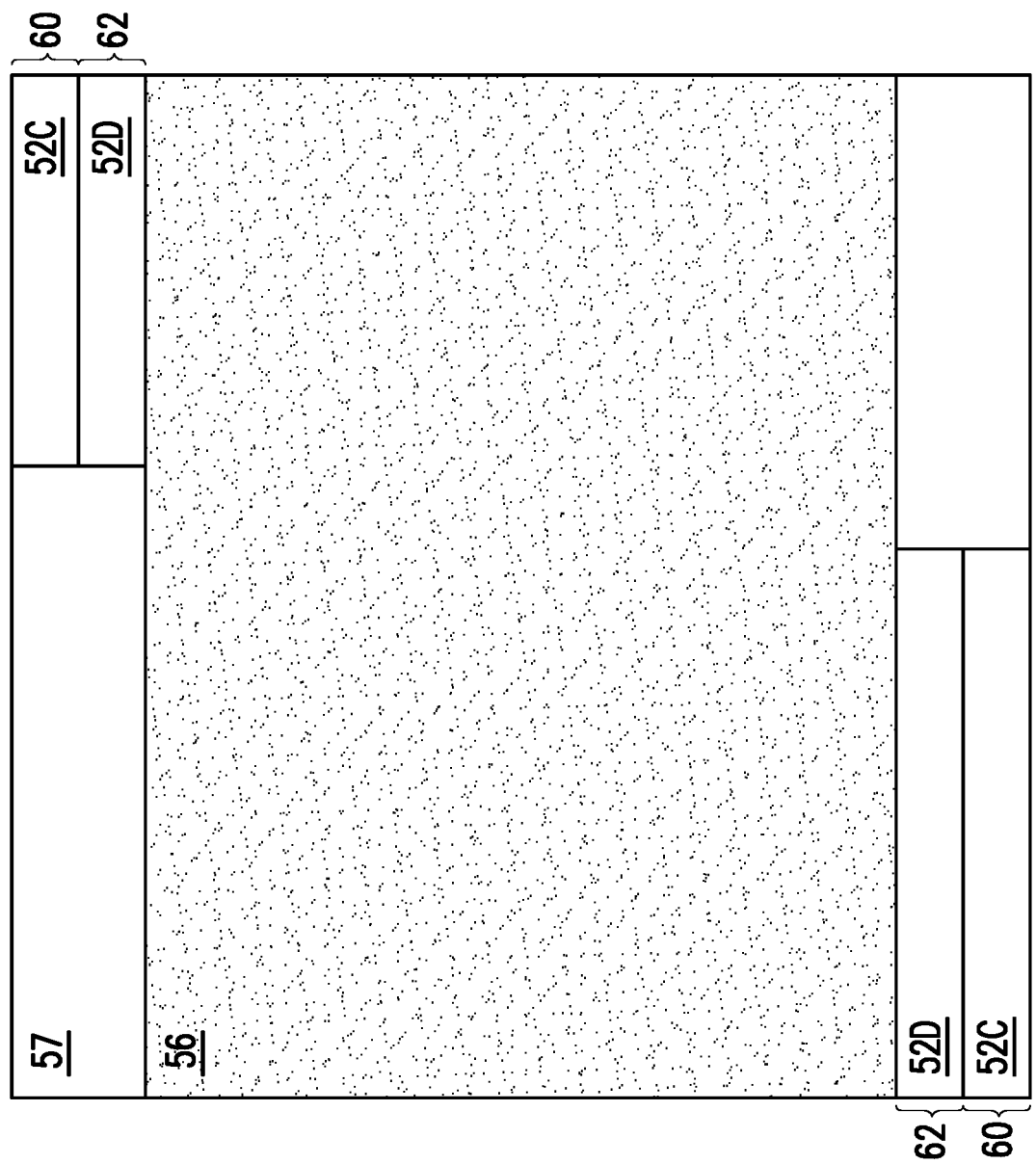
Figure 7B:
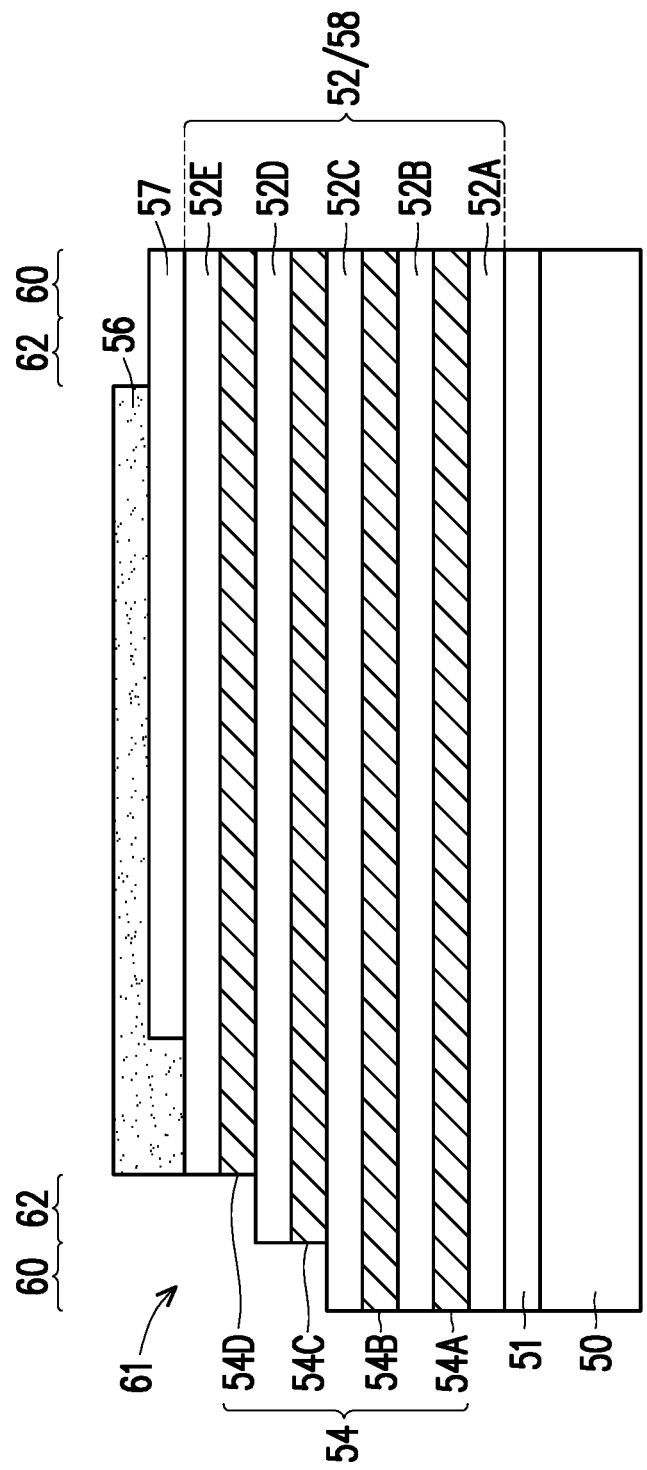
Figure 7C:
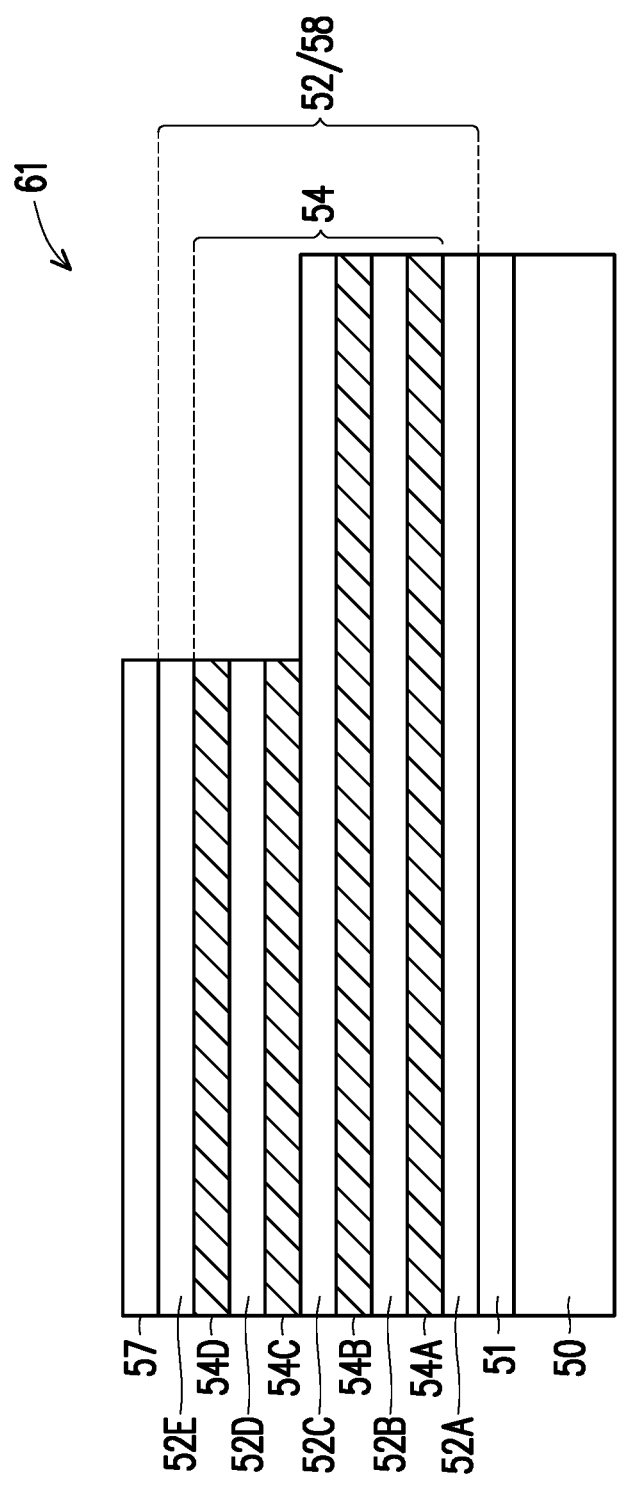

In FIGS. 7A through 7C, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60 and a region 62 are exposed. For example, top surfaces of the dielectric layer 52E in the region 62 and top surfaces of the dielectric layer 52D in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the dielectric layers 52 and the conductive layers 54 have different material compositions, etchants used to remove exposed portions of these layers may be different. In some embodiments, the conductive layers 54 act as etch stop layers while etching the dielectric layers 52, and the dielectric layers 52 act as etch stop layers while etching conductive layers 54. As a result, the portions of the dielectric layers 52 and the conductive layers 54 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, un-etched portions of the dielectric layers 52 and the conductive layers 54 act as masks for underlying layers, and as a result a previous pattern of the dielectric layer 52E and the conductive layer 54D (see FIGS. 6A through 6C) may be transferred to the underlying dielectric layer 52D and the underlying conductive layer 54C. In the resulting structure, the dielectric layer 52D is exposed in the region 62 and the dielectric layer 52C is exposed in the region 60.

Figure 8A:
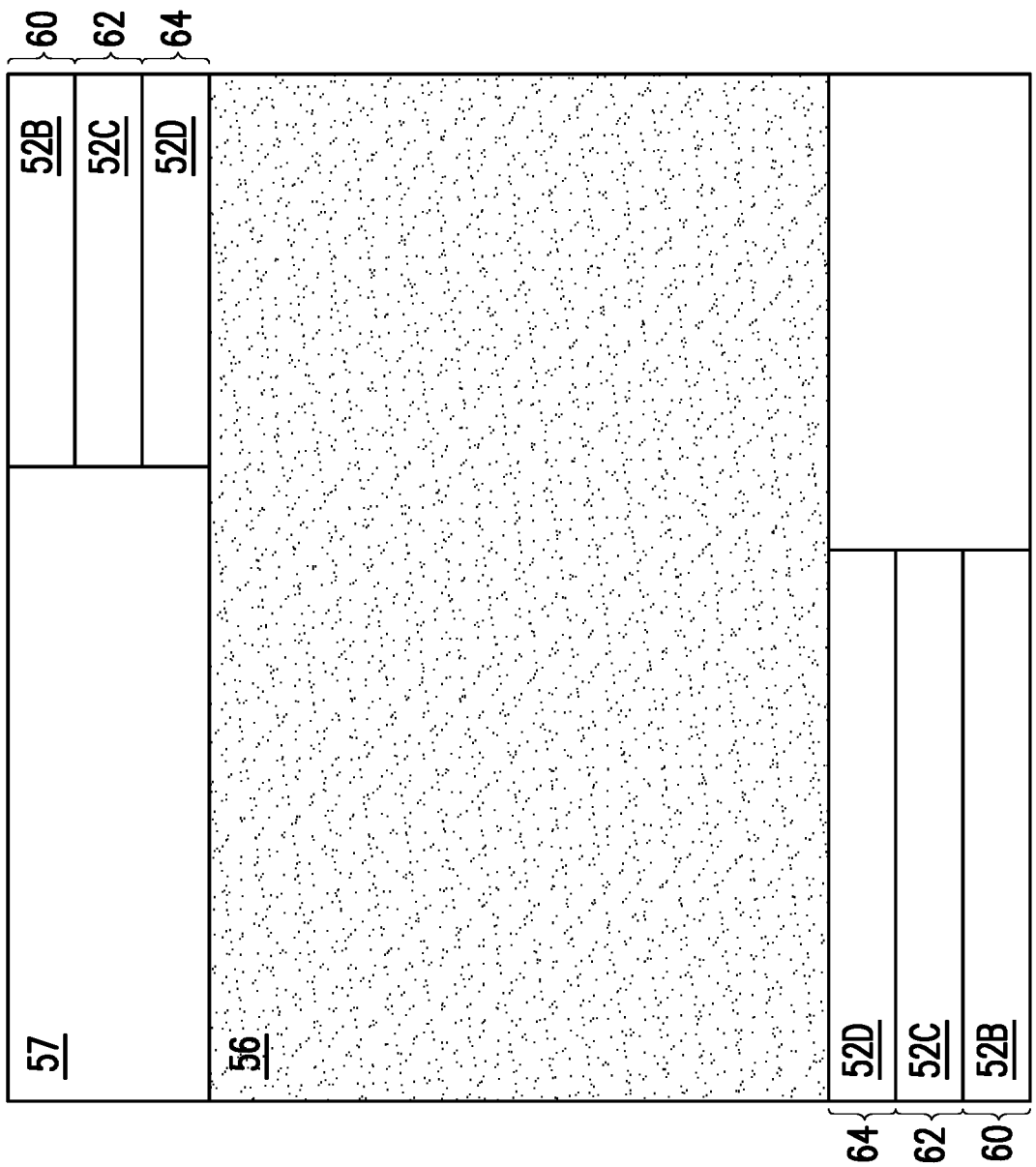
Figure 8B:
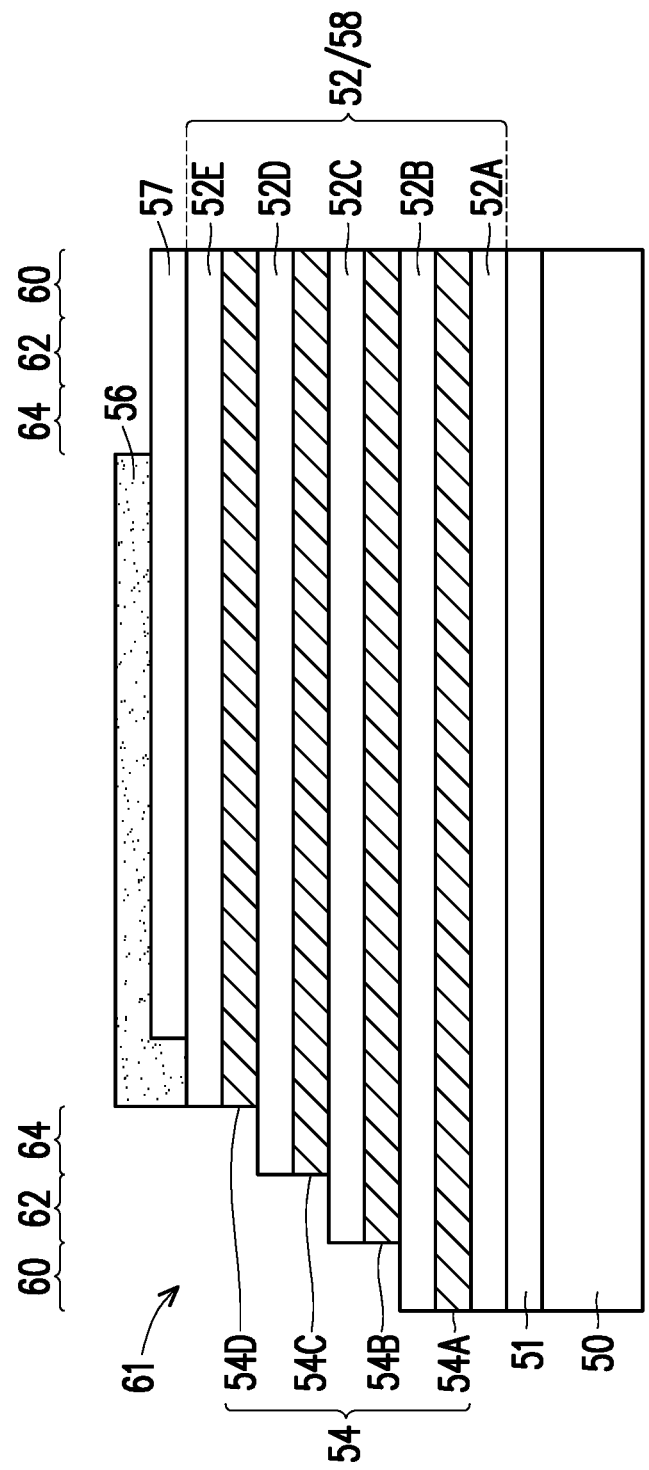
Figure 8C:
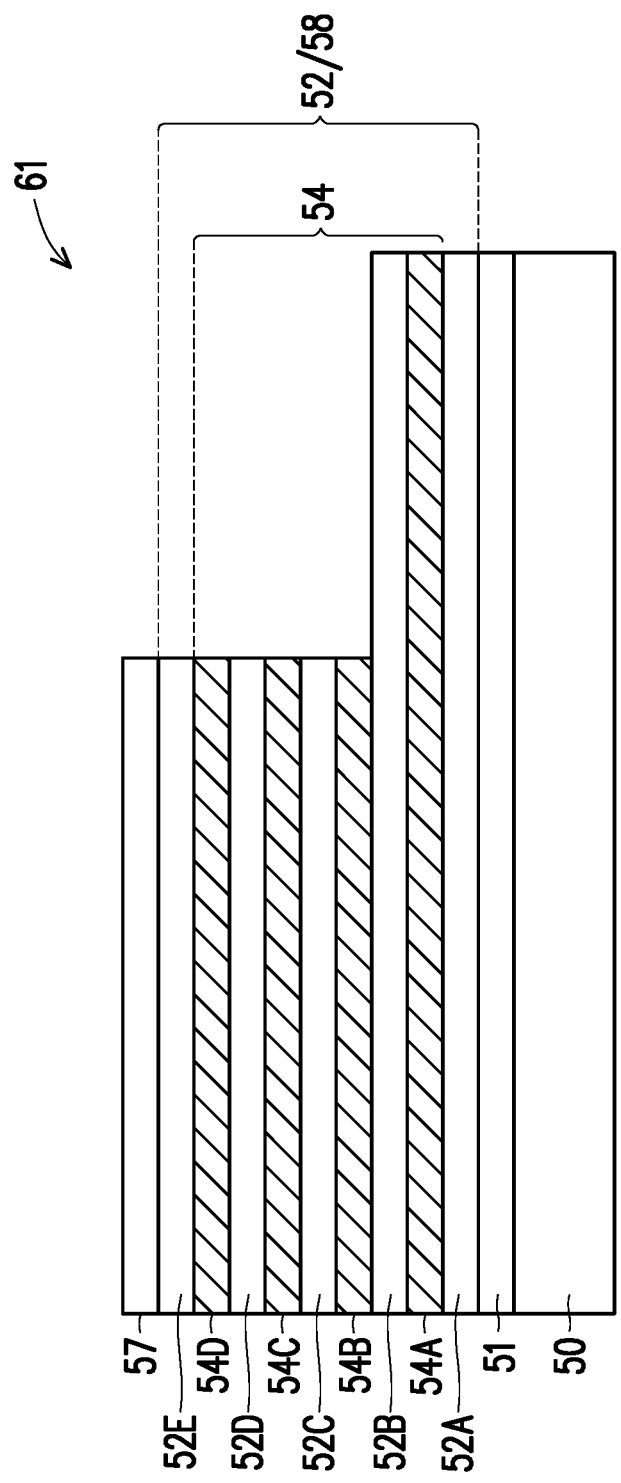

In FIGS. 8A through 8C, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60, the region 62, and a region 64 are exposed. For example, top surfaces of the dielectric layer 52E in the region 64, top surfaces of the dielectric layer 52D in the region 62, and top surfaces of the dielectric layer 52C in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the dielectric layers 52 and the conductive layers 54 have different material compositions, etchants used to remove exposed portions of these layers may be different. In some embodiments, the conductive layers 54 act as etch stop layers while etching the dielectric layers 52, and the dielectric layers 52 act as etch stop layers while etching conductive layers 54. As a result, the portions of the dielectric layers 52 and the conductive layers 54 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, un-etched portions of the dielectric layers 52 and the conductive layers 54 act as masks for underlying layers, and as a result a previous pattern of the dielectric layer 52E, the conductive layer 54D, the dielectric layer 52D, and the conductive layer 54C (see FIGS. 7A through 7C) may be transferred to the underlying dielectric layer 52C, the underlying conductive layer 54B, the underlying dielectric layer 52D, and the underlying conductive layer 54C. In the resulting structure, the dielectric layer 52D is exposed in the region 64, the dielectric layer 52C is exposed in the region 62 and the dielectric layer 52B is exposed in the region 60.

In FIGS. 9A through 9C, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60, the region 62, the region 64, and a region 66 are exposed. For example, top surfaces of the dielectric layer 52E in the region 66, top surfaces of the dielectric layer 52D in the region 64, top surfaces of the dielectric layer 52C in the region 62, and top surfaces of the dielectric layer 52B in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the dielectric layers 52 and the conductive layers 54 have different material compositions, etchants used to remove exposed portions of these layers may be different. In some embodiments, the conductive layers 54 act as etch stop layers while etching the dielectric layers 52. As a result, the portions of the dielectric layers 52 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, un-etched portions of the dielectric layers 52 and the conductive layers 54 act as masks for underlying layers, and as a result a previous pattern of the dielectric layer 52E, the conductive layer 54D, the dielectric layer 52D, the conductive layer 54C, the dielectric layer 52C, and the conductive layer 54B (see FIGS. 8A through 8C) may be transferred to the underlying dielectric layer 52B, the underlying dielectric layer 52C, and the underlying dielectric layer 52D. In the resulting structure, the conductive layer 54A is exposed in the region 60, the conductive layer 54B is exposed in the region 62, the conductive layer 54C is exposed in the region 64, and the conductive layer 54D is exposed in the region 66.

In FIGS. 10A through 10C the photoresist 56 may be removed, such as by an acceptable ashing or wet strip process. Thus, a staircase structure 68 is formed. The staircase structure 68 comprises a stack of alternating layers of the dielectric layers 52 and the conductive layers 54. As illustrated in FIGS. 10A through 10C, forming the staircase structure 68 allows for portions of each of the conductive layers 54A-54D to be exposed from overlying conductive layers 54 and dielectric layers 52. As a result, conductive contacts can be made from above the staircase structure 68 to each of the conductive layers 54 in subsequent processing steps.

As illustrated in FIG. 10A, the staircase structure 68 includes a first portion 68A and a second portion 68B opposite the first portion 68A. The first portion 68A may be disposed in a first corner of the memory array 200 and the second portion 68B may be disposed in a second corner of the memory array 200 opposite (e.g., kitty corner) the first corner. The patterned hard mask layer 57 may cover a third corner of the memory array 200 between the first corner and the second corner and a fourth corner of the memory array 200 opposite (e.g., kitty corner) the third corner. The first portion 68A extends only partially along the second edge $E_2$ of the memory array 200 and the second portion 68B extends only partially along the fourth edge $E_4$ of the memory array 200. The conductive layers 54 may be subsequently etched to form conductive lines (e.g. word lines, such as the conductive lines 72, discussed below with respect to FIGS. 14A and 14B). Forming the staircase structure 68 including the first portion 68A and the second portion 68B which extend partially along the second edge $E_2$ and the fourth edge $E_4$, respectively, allows for connections (such as the conductive contacts 122, discussed below with respect to FIGS. 26A through 26E) to be made to each of the conductive lines, while consuming a minimal footprint of the memory array 200. This allows for device density to be increased. In FIGS. 4A through 10C, a sidewall of the patterned hard mask 57 which defines the second portion 68B of the staircase structure 68 is illustrated as being misaligned from a sidewall of the patterned hard mask 57 which defines the first portion 68A of the staircase structure 68. However, as illustrated by the dotted line in FIG. 10A, the sidewalls of the patterned hard mask 57 which define the first portion 68A and the second portion 68B of the staircase structure 68 may be aligned.

The conductive layers 54 may be continuous outside of the first portion 68A and the second portion 68B of the staircase structure 68. As such, conductive lines formed from portions of the conductive layers 54 extending into the first portion 68A may extend to the fourth edge $E_4$ and conductive lines formed from portions of the conductive layers 54 extending into the second portion 68B may extend to the second edge $E_2$. As illustrated in FIG. 10B, edges of the conductive layers 54 and the dielectric layers 52 opposite the first portion 68A of the staircase structure 68 may be coterminous with edges of the etch stop layer 51 and the substrate 50. As illustrated in FIG. 10C, edges of the conductive layers 54 and the dielectric layers 52 opposite the second portion 68B of the staircase structure 68 may be coterminous with edges of the etch stop layer 51 and the substrate 50.

Figure 11A:
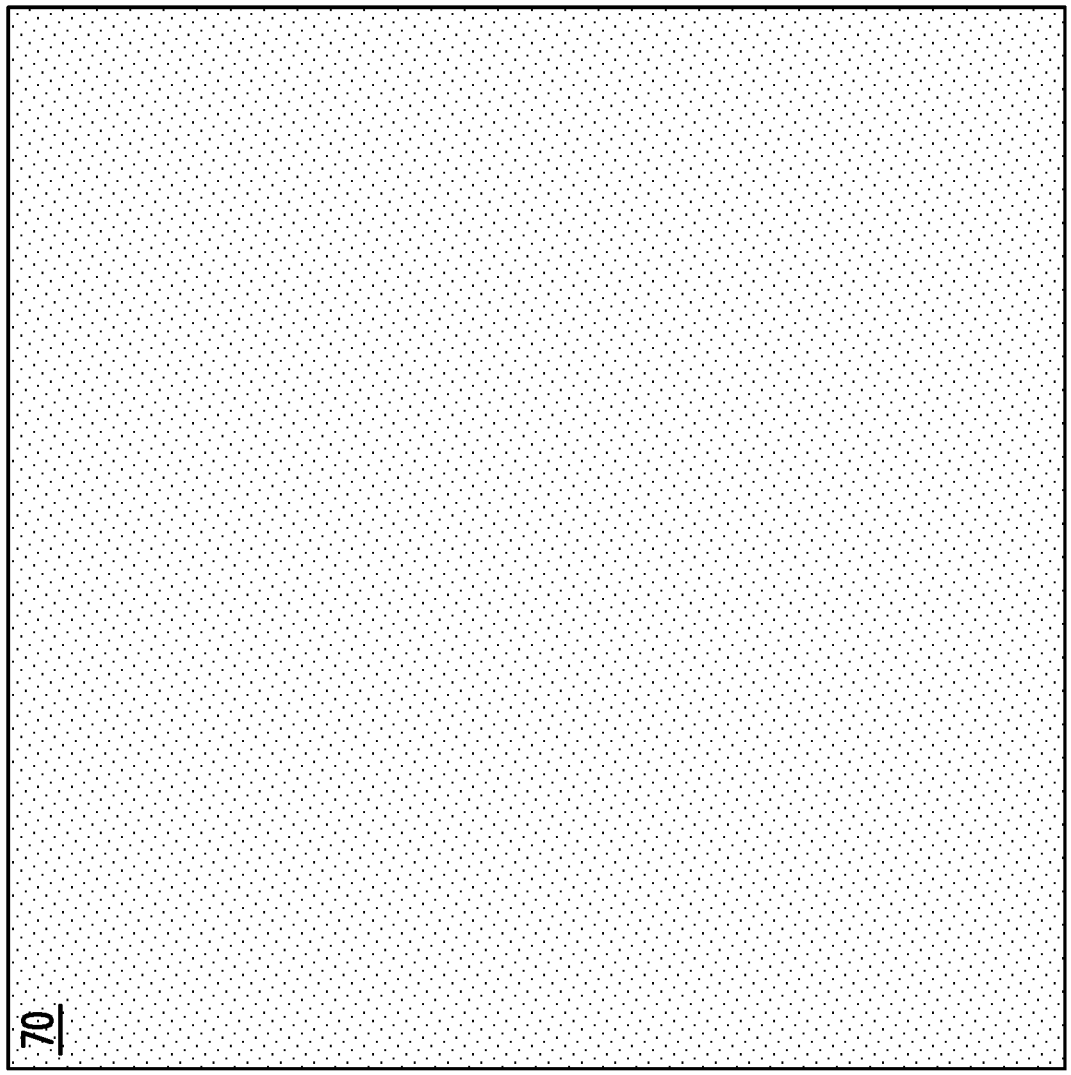
Figure 11B:
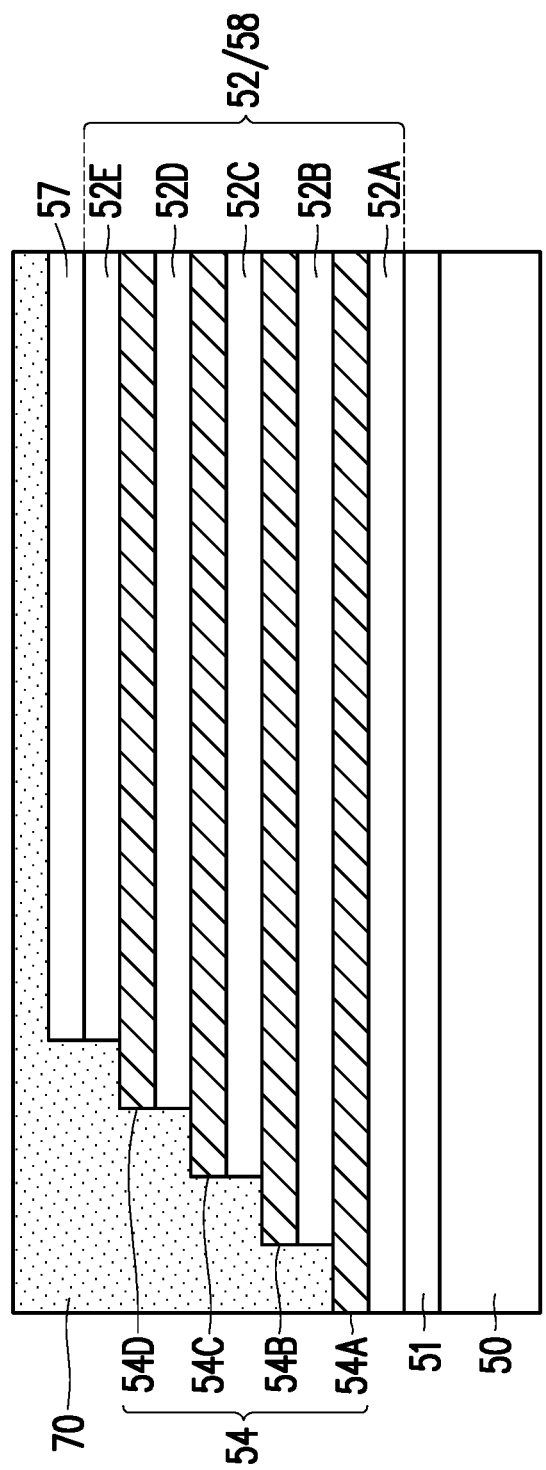
Figure 11C:
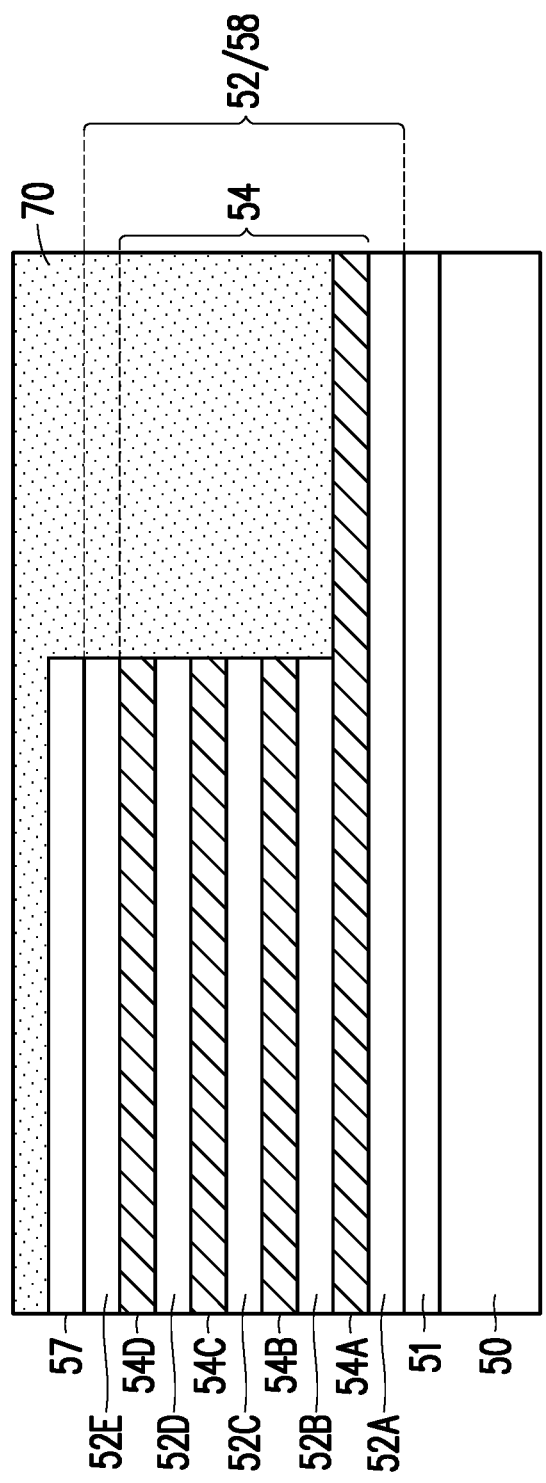

In FIGS. 11A through 11C, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may comprise an oxide (e.g., silicon oxide or the like), a nitride (e.g., silicon nitride or the like), a combination thereof or the like. Other dielectric materials formed by any acceptable process may be used. The IMD 70 extends along sidewalls of the conductive layers 54B-54D, sidewalls of the dielectric layers 52B-52E, sidewalls of the patterned hard mask 57, top surfaces of the conductive layers 54A-54D, and top surfaces of the patterned hard mask 57.

Figure 12A:
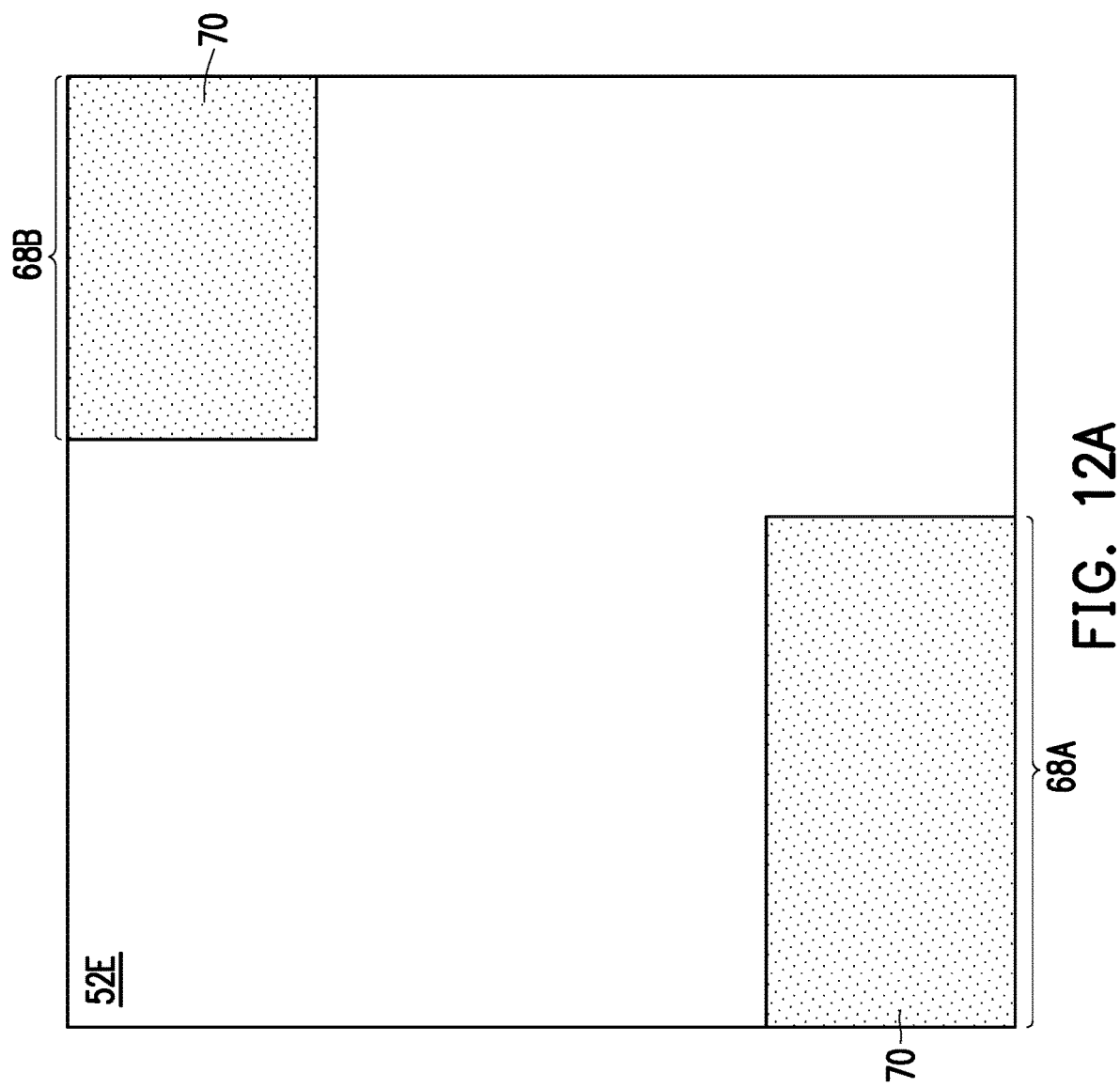
Figure 12B:
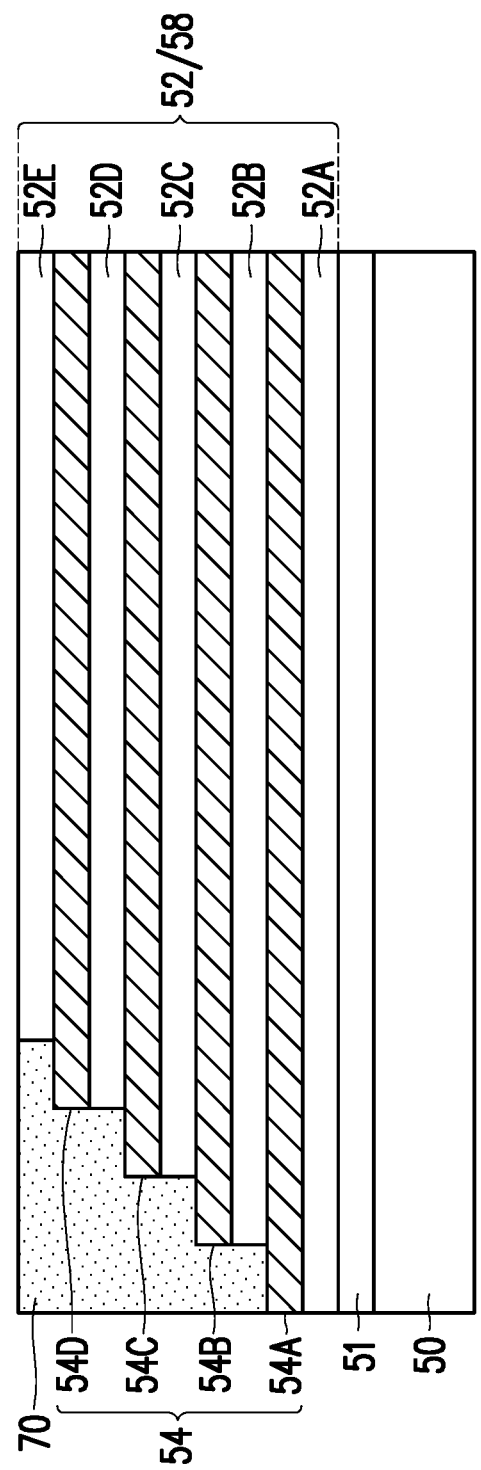

In FIGS. 12A through 12C, a removal process is applied to the IMD 70 and the patterned hard mask 57 to remove excess materials over the multi-layer stack 58. In some embodiments, a planarization process such as a chemical mechanical planarization (CMP) process, an etch-back process, a combination thereof, or the like may be utilized. In the embodiment illustrated in FIGS. 12A through 12C, the patterned hard mask 57 may be completely removed. The planarization process exposes the multi-layer stack 58 such that a top surface of the multi-layer stack 58 (e.g., the dielectric layer 52E) is level with top surfaces of the IMD 70 after the planarization process is complete.

In FIGS. 13A through 15C, trenches 86 are formed in the multi-layer stack 58, thereby defining conductive lines 72. The conductive lines 72 may correspond to word lines in the memory array 200 and the conductive lines 72 may provide gate electrodes for the resulting transistors 204 of the memory array 200 (see FIGS. 1A and 1B).

Figure 13A:
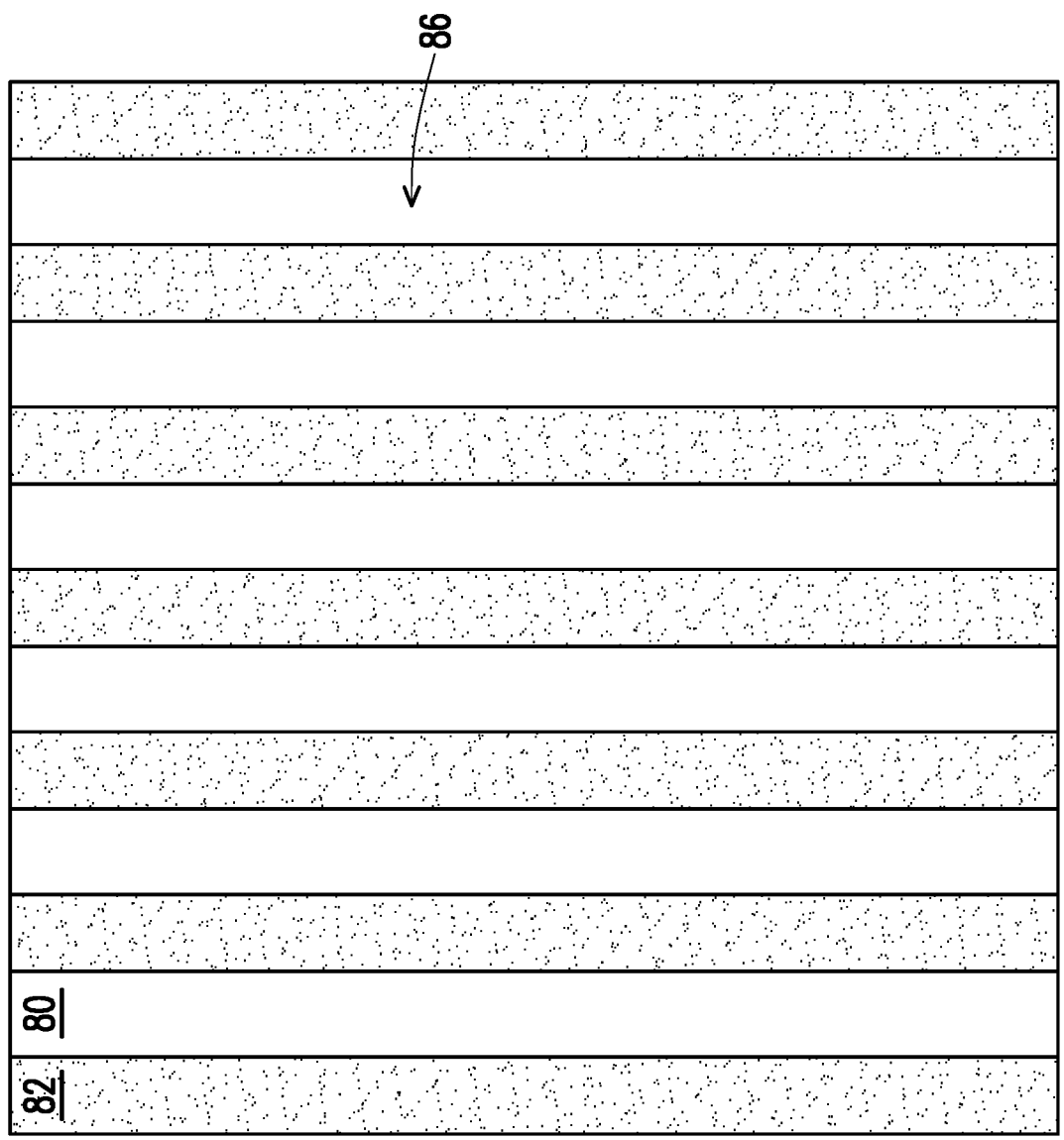
Figure 13B:
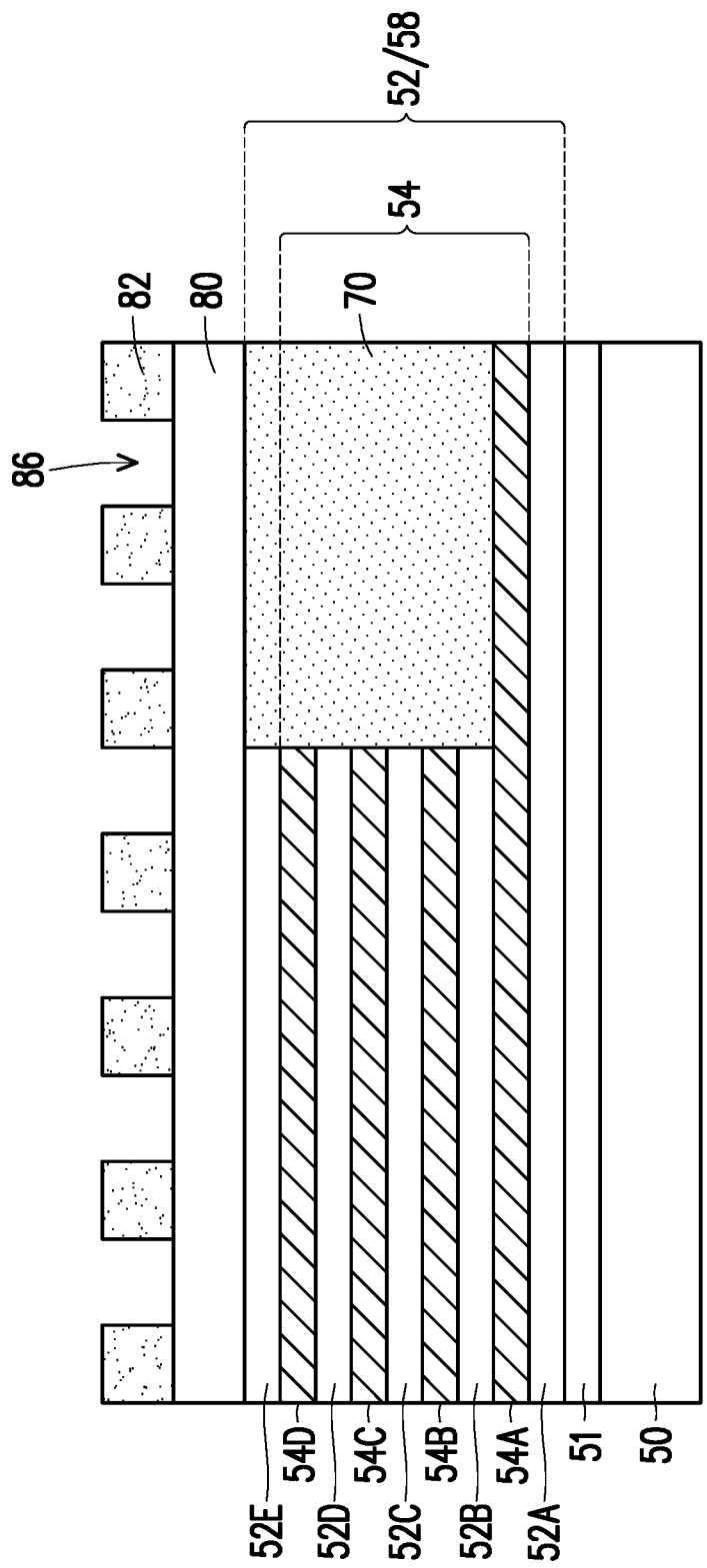

In FIGS. 13A and 13B a hard mask 80 is deposited over the multi-layer stack 58. The hard mask 80 may include, for example, silicon nitride, silicon oxynitride, or the like, which may be deposited by CVD, PVD, ALD, PECVD, or the like. The hard mask 80 can be formed by using a spin-on technique and can be patterned using acceptable photolithography techniques. A photoresist 82 is formed and patterned over the hard mask 80. The photoresist 82 may be patterned to form trenches 86 exposing portions of a top surface of the hard mask 80.

Figure 14B:
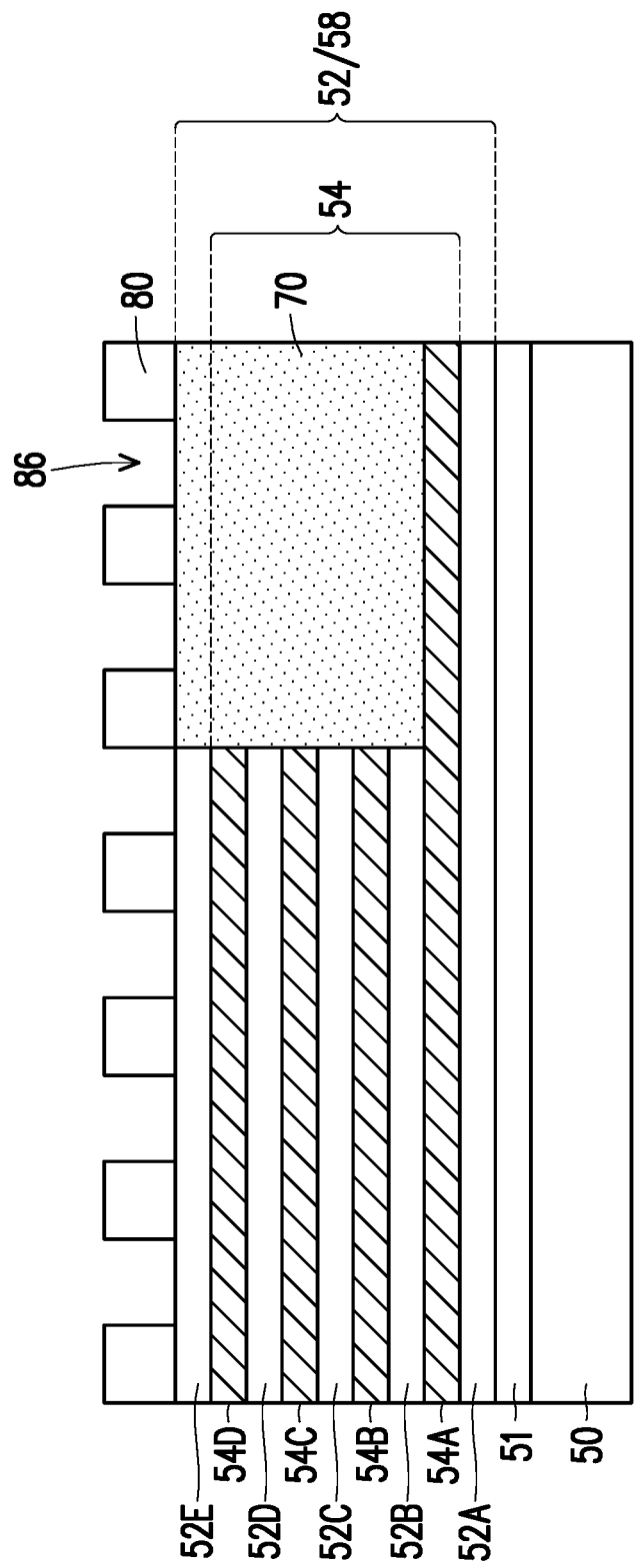

In FIGS. 14A and 14B, a pattern of the photoresist 82 is transferred to the hard mask 80 using an acceptable etching process, such as wet or dry etching, RIE, NBE, the like, or a combination thereof. The etching may be anisotropic. The etching may expose top surfaces of the multi-layer stack 58, such as top surfaces of the dielectric layer 52E. Thus, the trenches 86 are transferred to the hard mask 80. Further in FIGS. 14A and 14B, the photoresist 82 may be removed by an acceptable process, such as a wet etching process, a dry etching process, a combination thereof, or the like.

Figure 15A:
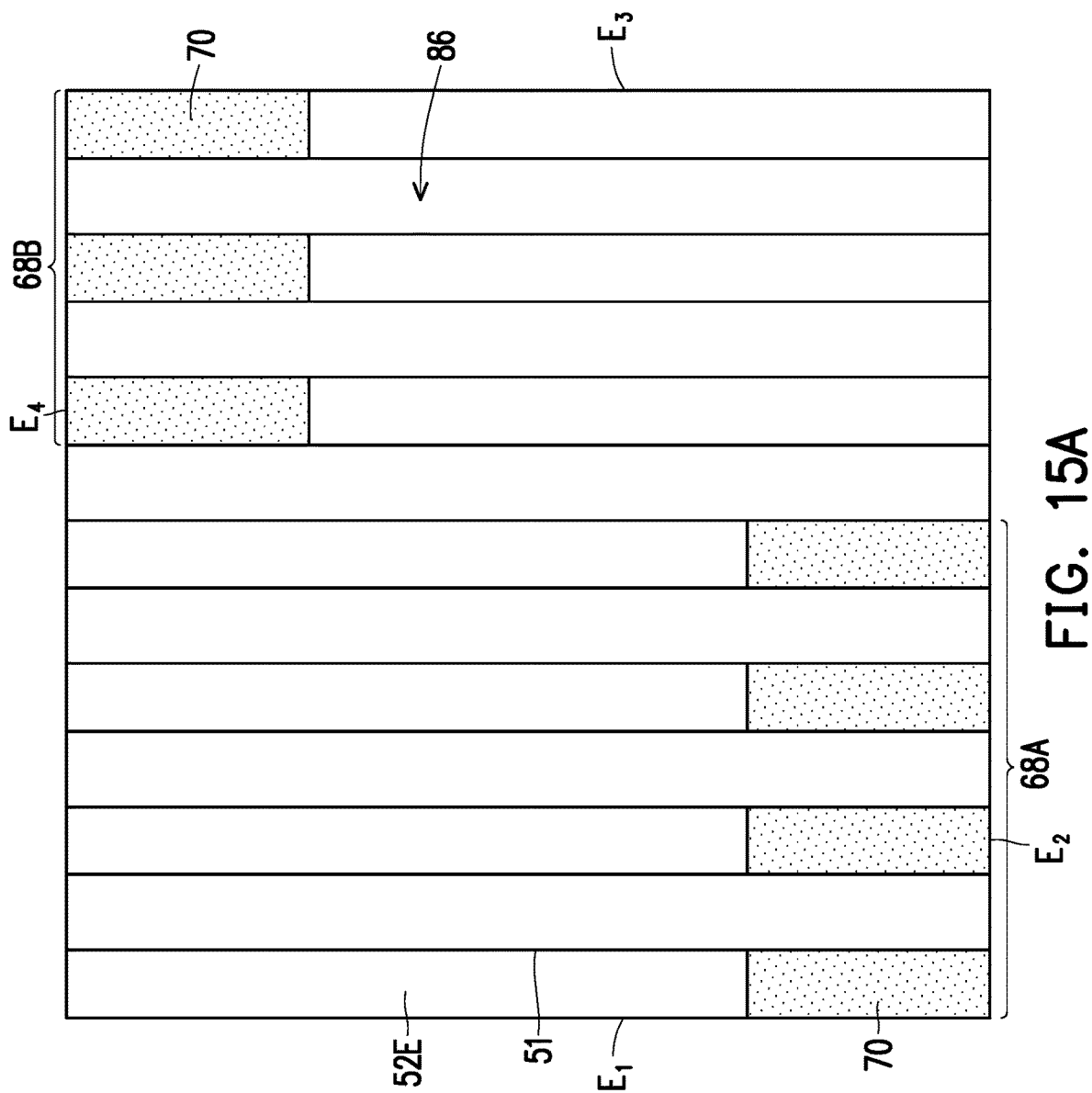
Figure 15B:
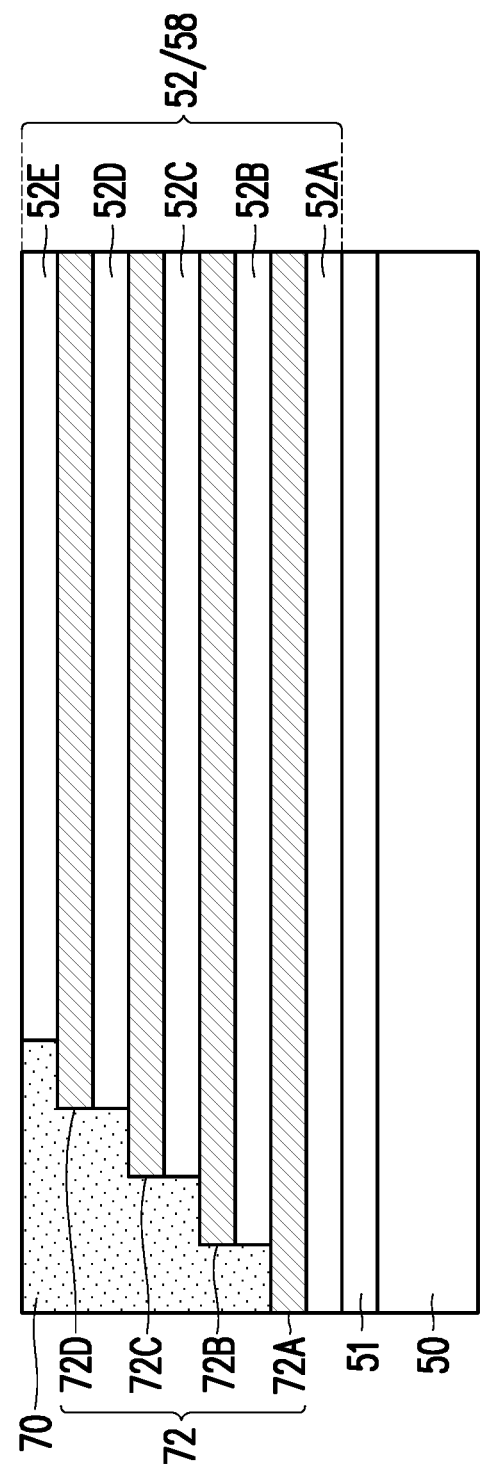
Figure 15C:
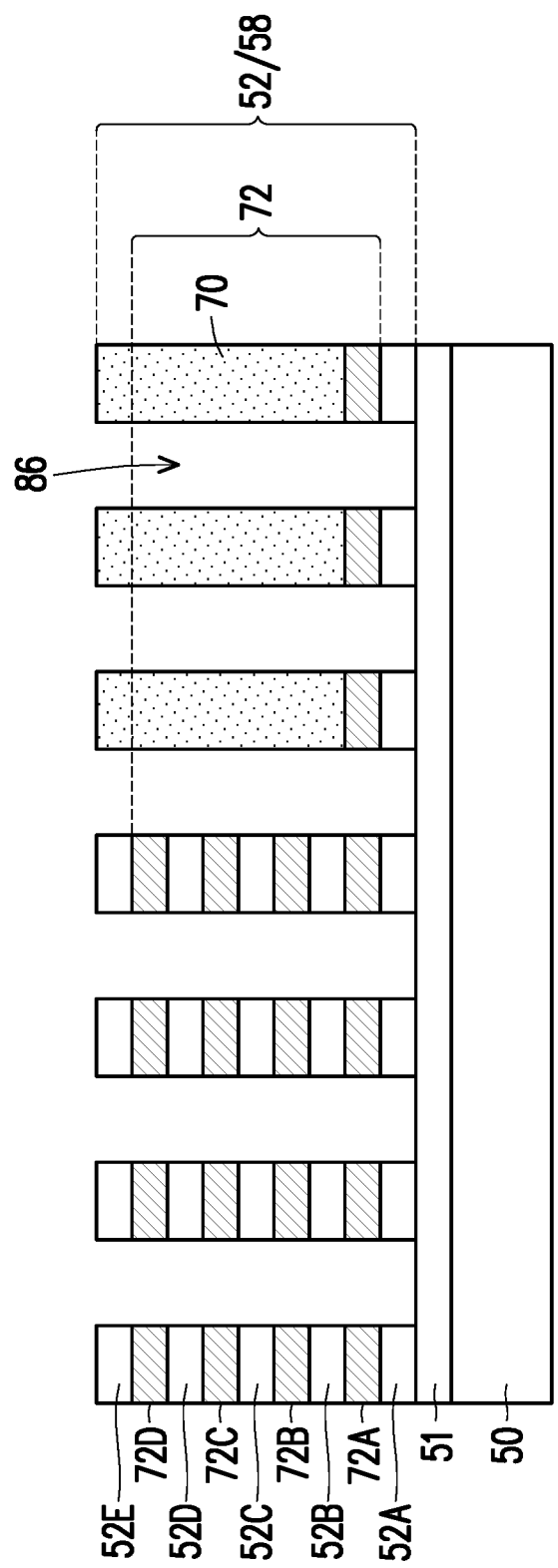

In FIGS. 15A through 15C, a pattern of the hard mask 80 is transferred to the multi-layer stack 58 using one or more acceptable etching processes, such as wet or dry etching, RIE, NBE, the like, or a combination thereof. The etching processes may be anisotropic. Thus, the trenches 86 are extended through the multi-layer stack 58. The trenches 86 may expose top surfaces of the etch stop layer 51. The conductive lines 72A-72D (e.g., word lines, collectively referred to as conductive lines 72) are formed from the conductive layers 54A-54D by etching the trenches 86. More specifically, by etching the trenches 86 through the conductive layers 54, adjacent conductive lines 72 can be separated from each other. The conductive lines 72 may be continuous outside of the first portion 68A and the second portion 68B of the staircase structure 68. The conductive lines 72 formed from portions of the conductive layers 54 extending into the first portion 68A may extend to the fourth edge $E_4$ and the conductive lines 72 formed from portions of the conductive layers 54 extending into the second portion 68B may extend to the second edge $E_2$. Further in FIGS. 15A through 15C, the hard mask 80 may be removed by an acceptable process, such as a wet etching process, a dry etching process, a planarization process, combinations thereof, or the like.

Opposite end surfaces of the conductive lines 72A and the dielectric layer 52A may be coterminous with the second edge $E_2$ and the fourth edge $E_4$ of the IMD 70. First ends of the conductive lines 72B-72D and the dielectric layers 52B-52E in the first portion 68A and the second portion 68B of the staircase structure 68 may contact the IMD 70 and opposite second ends of the same conductive lines 72B-72D and the dielectric layers 52B-52E may be coterminous with the opposite IMD 70. This aids in maximizing the use of available area in the memory array 200, as no extra area is taken up by the IMD along end surfaces of the conductive lines 72A and the dielectric layer 52A, and memory cells 202 can be formed along the lengths of the conductive lines 72 and the dielectric layers 52 outside of the first portion 68A and the second portion 68B of the staircase structure 68.

Figure 16B:
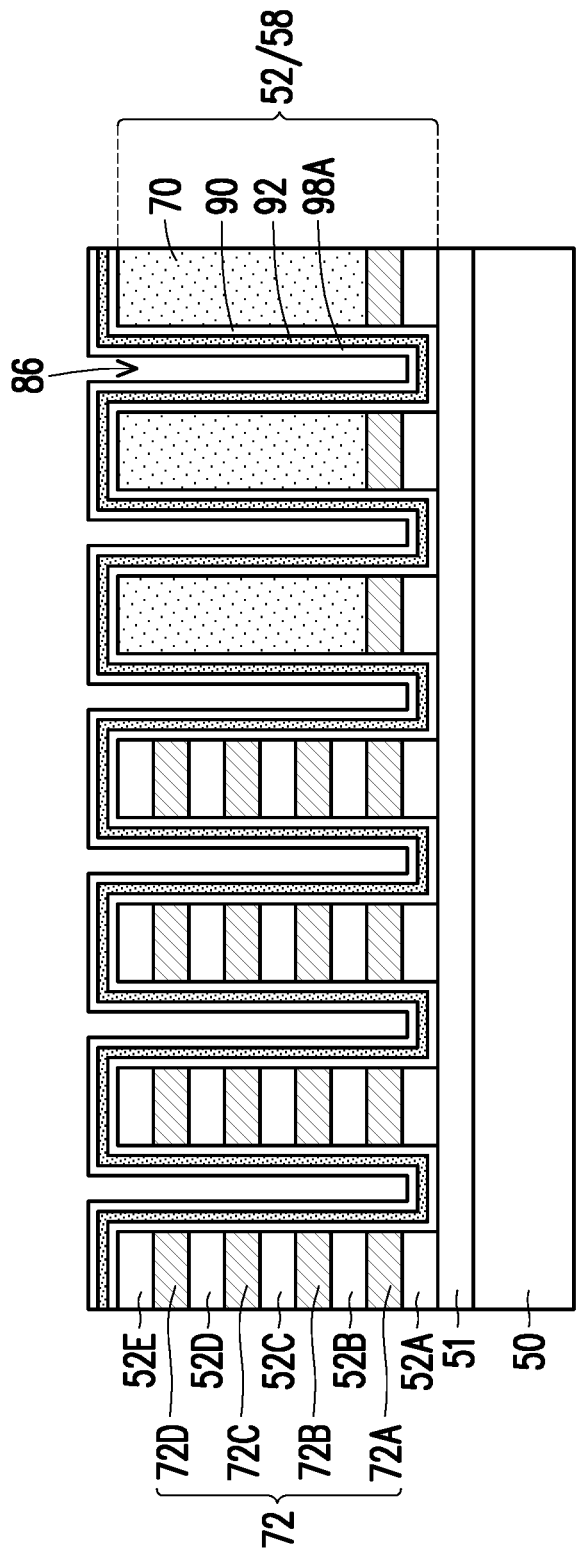

FIGS. 16A through 19B illustrate forming and patterning channel regions for the transistors 204 (see FIGS. 1A and 1B) in the trenches 86. In FIGS. 16A and 16B, a memory film 90, an OS layer 92, and a first dielectric layer 98A are deposited in the trenches 86. The memory film 90 may be deposited conformally in the trenches 86 along sidewalls of the conductive lines 72, the dielectric layers 52, and the IMD 70 and along top surfaces of the dielectric layer 52E, the etch stop layer 51, and the IMD 70. The memory film 90 may be deposited by CVD, PVD, ALD, PECVD, or the like.

The memory film 90 may provide gate dielectrics for the transistors 204 formed in the memory array 200. The memory film 90 may comprise a material that is capable of switching between two different polarization directions by applying an appropriate voltage differential across the memory film 90. The memory film 90 may be a high-k dielectric material, such as a hafnium (Hf) based dielectric material or the like. In some embodiments, the memory film 90 comprises a ferroelectric (FE) material, such as hafnium oxide, hafnium zirconium oxide, silicon-doped hafnium oxide, or the like. In some embodiments, the memory film 90 may comprise different ferroelectric materials or different types of memory materials. In some embodiments, the memory film 90 may be a multilayer memory structure comprising a layer of $SiN_x$ between two $SiO_x$ layers (e.g., an ONO structure).

The OS layer 92 is conformally deposited in the trenches 86 over the memory film 90. The OS layer 92 comprises materials suitable for providing channel regions for the transistors 204 (see FIGS. 1A and 1B). For example, the OS layer 92 may include zinc oxide (ZnO), indium tungsten oxide (InWO), indium gallium zinc oxide (InGaZnO, IGZO), indium zinc oxide (InZnO), indium tin oxide (ITO), polycrystalline silicon (poly-Si), silicon (Si), amorphous silicon (a-Si), combinations thereof, or the like. The OS layer 92 may be deposited by CVD, PVD, ALD, PECVD, or the like. The OS layer 92 may extend along sidewalls and bottom surfaces of the trenches 86 over the memory film 90.

The first dielectric layer 98A is deposited in the trenches 86 over the OS layer 92. The first dielectric layer 98A may include, for example, silicon oxide, silicon nitride, silicon oxynitride, or the like, which may be deposited by CVD, PVD, ALD, PECVD, or the like. The first dielectric layer 98A may extend along sidewalls and bottom surfaces of the trenches 86 over the OS layer 92. As discussed below with respect to FIGS. 17A and 17B, the first dielectric layer 98A may be subsequently patterned and used as a mask to etch the underlying OS layer 92.

Figure 17A:
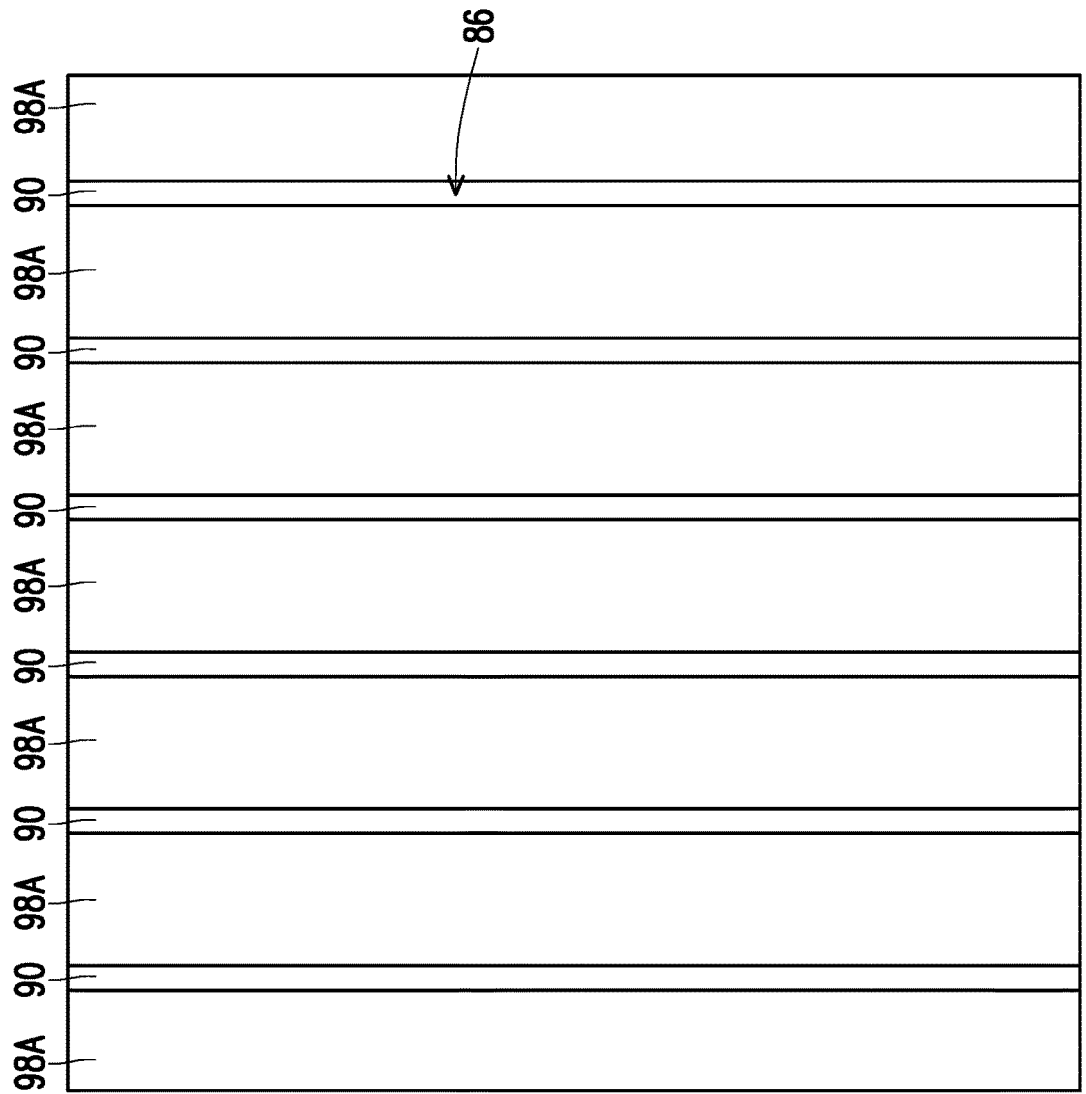
Figure 17B:
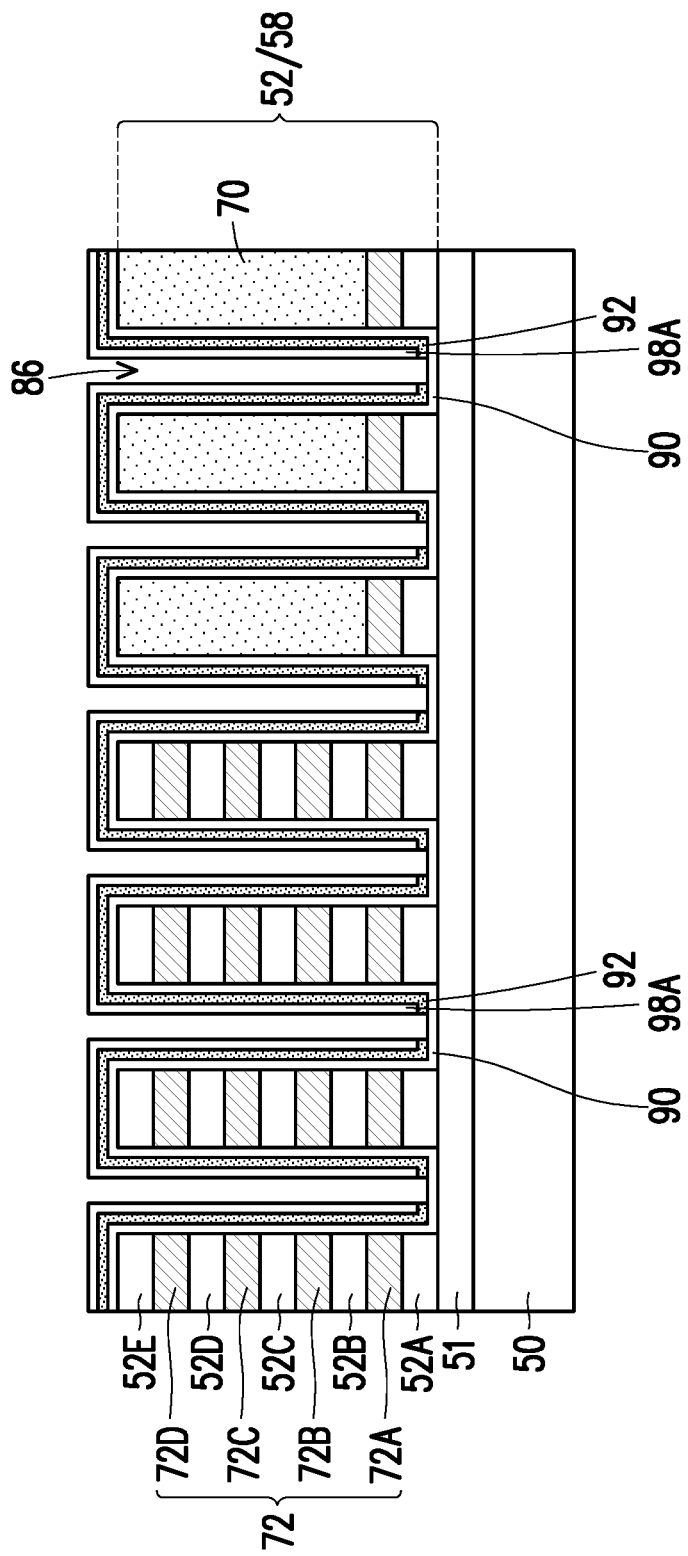

In FIGS. 17A and 17B, bottom portions of the first dielectric layer 98A and the OS layer 92 are removed in the trenches 86. The bottom portions of the first dielectric layer 98A may be removed using a combination of photolithography and etching. The etching may be any acceptable etch process, such as wet or dry etching, RIE, NBE, the like, or a combination thereof. The etching may be anisotropic.

The first dielectric layer 98A may then be used as an etch mask to etch through the bottom portions of the OS layer 92 in the trenches 86. The etching may be any acceptable etch process, such as wet or dry etching, RIE, NBE, the like, or a combination thereof. The etching may be anisotropic. Etching the OS layer 92 may expose portions of the memory film 90 on bottom surfaces of the trenches 86. Thus, portions of the OS layer 92 on opposing sidewalls of the trenches 86 may be separated from each other, which improves isolation between the memory cells 202 of the memory array 200 (see FIGS. 1A and 1B).

In some embodiments (not separately illustrated), the OS layer 92 may then be used as an etch mask to etch through the bottom portions of the memory film 90 in the trenches 86. The etching may be any acceptable etch process, such as wet or dry etching, RIE, NBE, the like, or a combination thereof. The etching may be anisotropic. Etching the memory film 90 may expose portions of the etch stop layer 51 on bottom surfaces of the trenches 86. Thus, portions of the memory film 90 on opposing sidewalls of the trenches 86 may be separated from each other, which further improves isolation between the memory cells 202 of the memory array 200 (see FIGS. 1A and 1B).

Figure 18B:
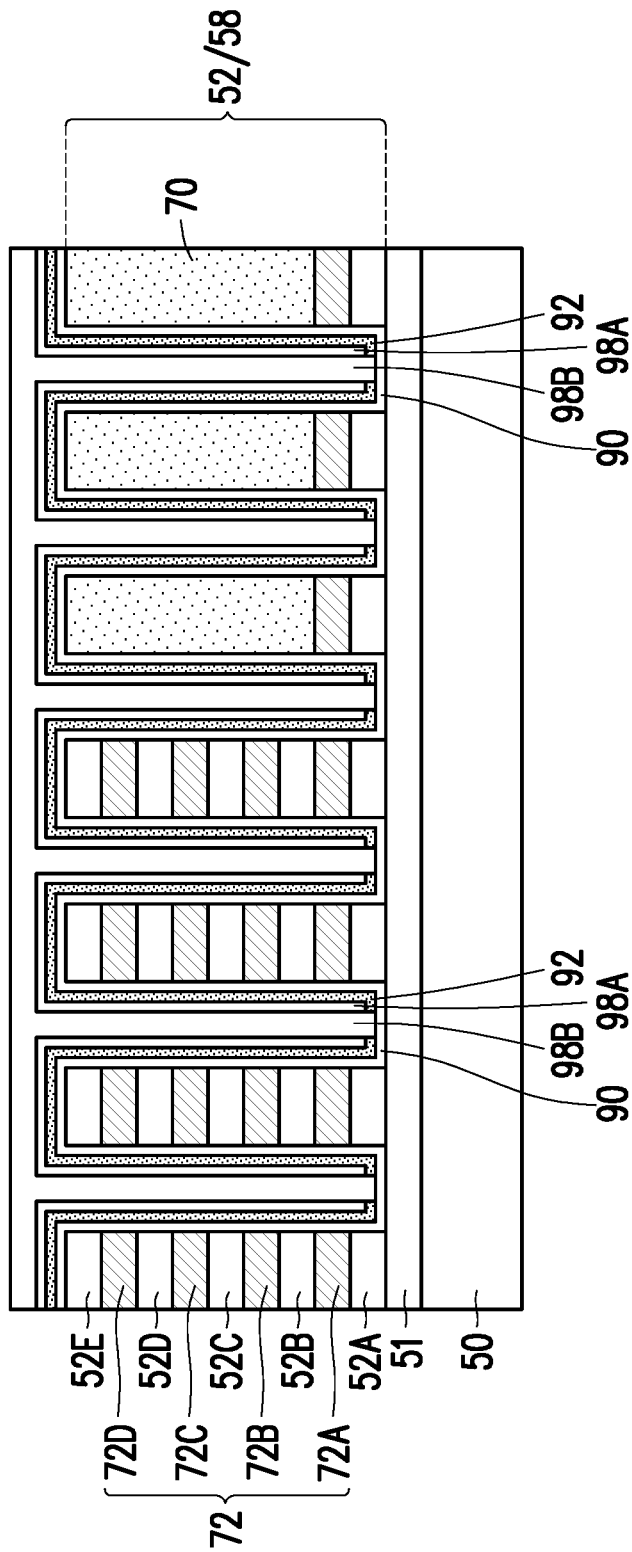

In FIGS. 18A and 18B, additional dielectric materials 98B are deposited to fill remaining portions of the trenches 86. The additional dielectric materials 98B may be formed of materials and by processes the same as or similar to those of the first dielectric layer 98A. The additional dielectric materials 98B and the first dielectric layer 98A may be referred to collectively as dielectric materials 98.

Figure 19B:
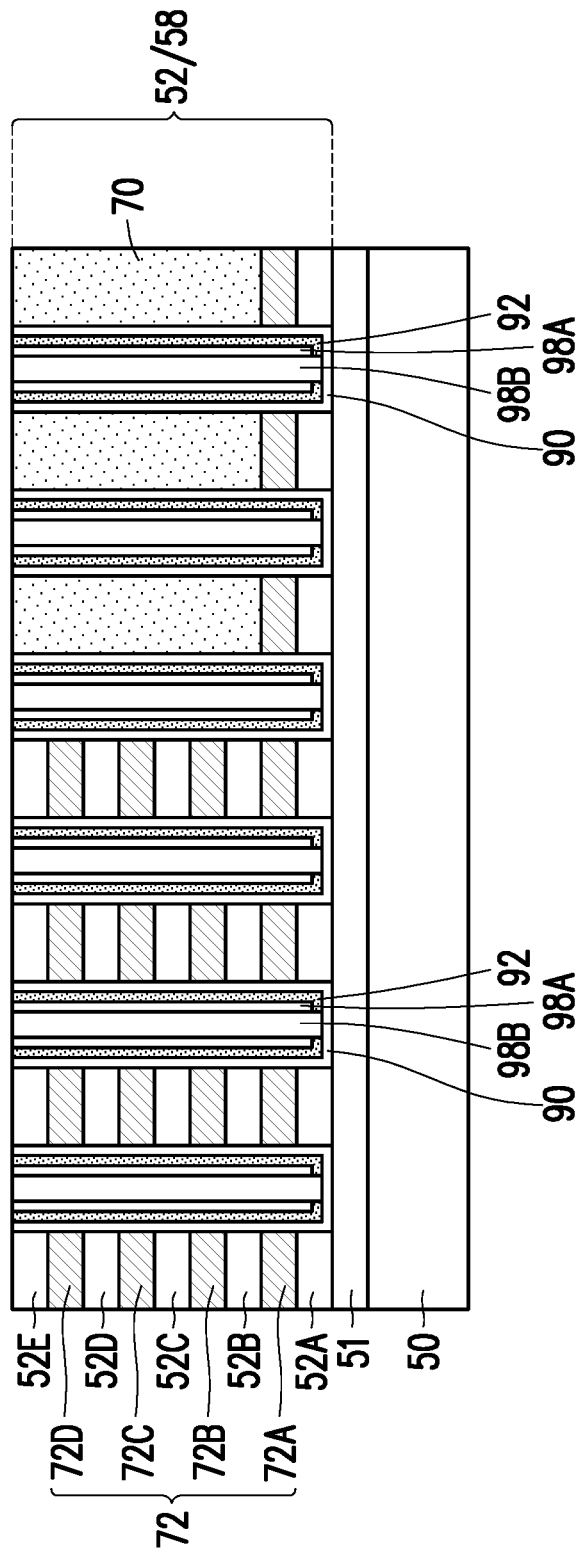

In FIGS. 19A and 19B, a removal process is applied to the dielectric materials 98, the OS layer 92, and the memory film 90 to remove excess materials over the multi-layer stack 58. In some embodiments, a planarization process such as a CMP, an etch-back process, combinations thereof, or the like may be utilized. The planarization process exposes the multi-layer stack 58 and the IMD 70 such that top surfaces of the multi-layer stack 58 (e.g., the dielectric layer 52E), the IMD 70, the memory film 90, the OS layer 92, and the dielectric materials 98 are level after the planarization process is complete.

FIGS. 20A through 23C illustrate intermediate steps of manufacturing dielectric materials 102, conductive lines 106 (e.g., bit lines), and conductive lines 108 (e.g., source lines) in the memory array 200. The conductive lines 106 and the conductive lines 108 may extend in a direction perpendicular to the conductive lines 72 such that individual memory cells 202 of the memory array 200 may be selected for read and write operations.

Figure 20A:
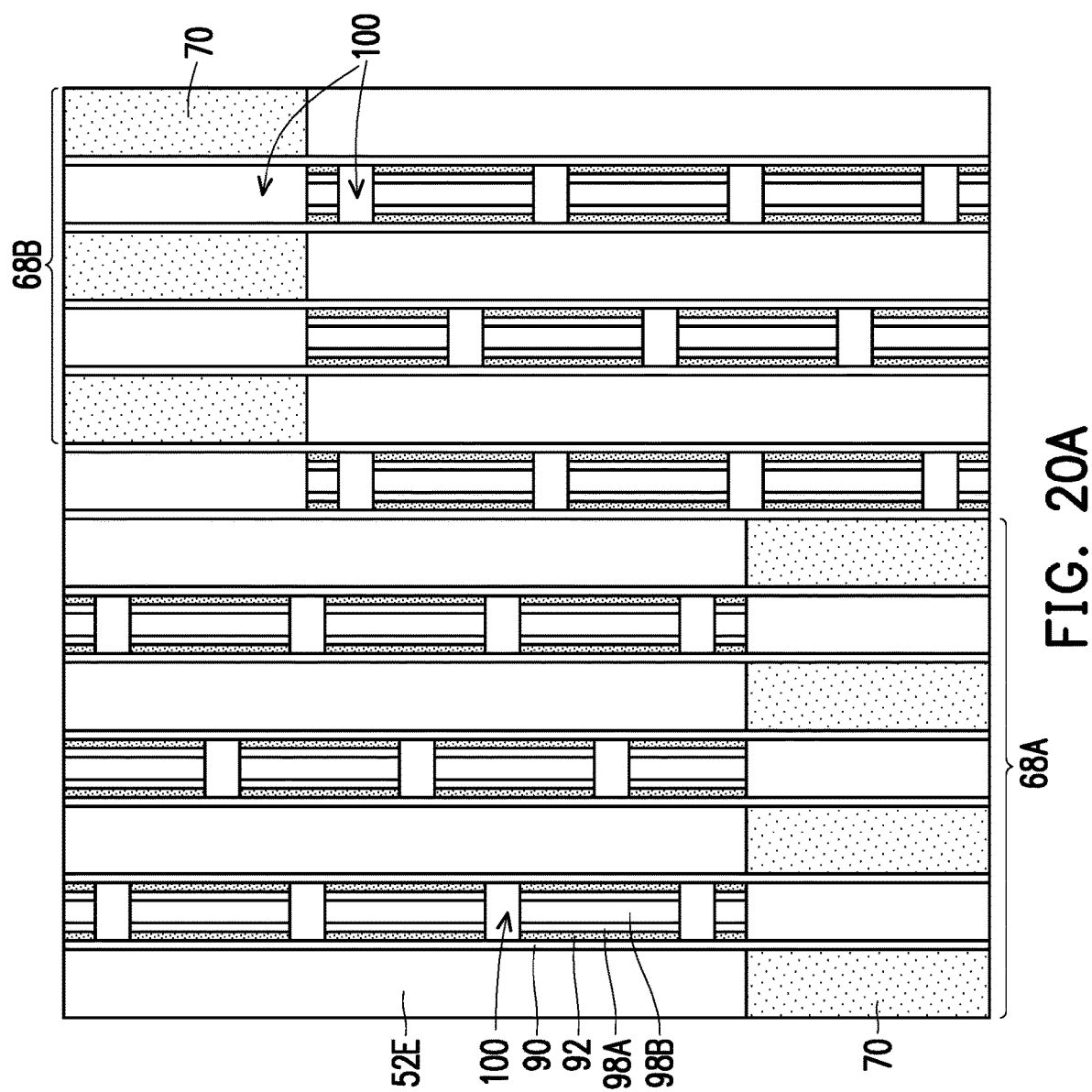
Figure 20B:
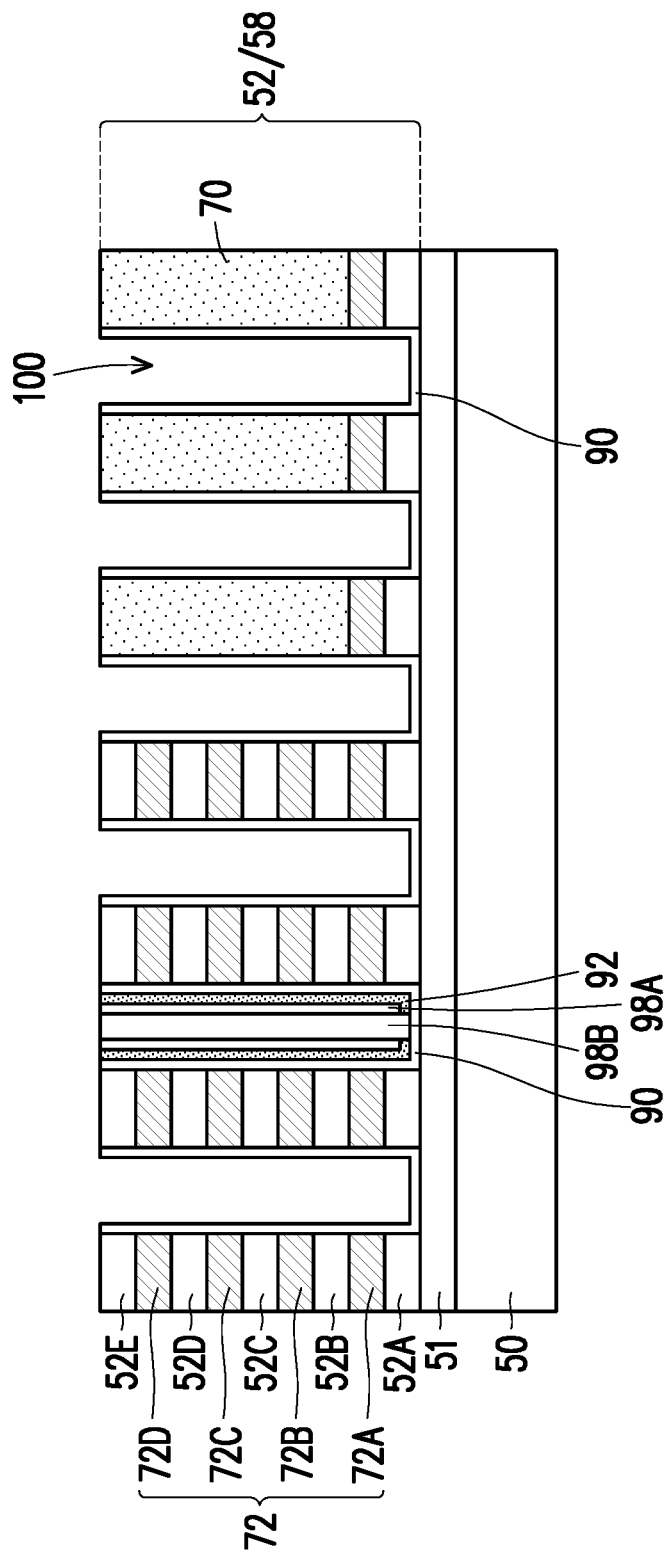

In FIGS. 20A and 20B, trenches 100 are patterned through the dielectric materials 98 and the OS layer 92. The trenches 100 may be patterned in the dielectric materials 98 and the OS layer 92 through a combination of photolithography and etching. The etching may be any acceptable etching processes, such as wet or dry etching, RIE, NBE, the like, or a combination thereof. The etching may be anisotropic. The trenches 100 may be disposed between opposing sidewalls of the memory film 90 and the trenches 100 may physically separate adjacent stacks of the memory cells 202 in the memory array 200 (see FIG. 1A). The dielectric materials 98 and the OS layer 92 may be completely removed in the first portion 68A and the second portion 68B of the staircase structure 68 adjacent the IMD 70, the conductive lines 72, and the dielectric layers 52. Portions of the dielectric materials 98 and the OS layer 92 adjacent the second portion 68B of the staircase structure 68 in a direction parallel to the second edge $E_2$ and the fourth edge $E_4$ may also be removed.

In some embodiments (not separately illustrated), the trenches 100 may also be patterned through the memory film 90. As such, the trenches 100 may be disposed between opposing sidewalls of the multi-layer stack 58 and the trenches 100 may physically separate adjacent stacks of the memory cells 202 in the memory array 200 (see FIG. 1A). The dielectric materials 98, the OS layer 92, and the memory film 90 may be completely removed in the first portion 68A and the second portion 68B of the staircase structure 68 adjacent the IMD 70, the conductive lines 72, and the dielectric layers 52. Portions of the dielectric materials 98, the OS layer 92, and the memory film 90 adjacent the second portion 68B of the staircase structure 68 in a direction parallel to the second edge $E_2$ and the fourth edge $E_4$ may also be removed.

Figure 21A:
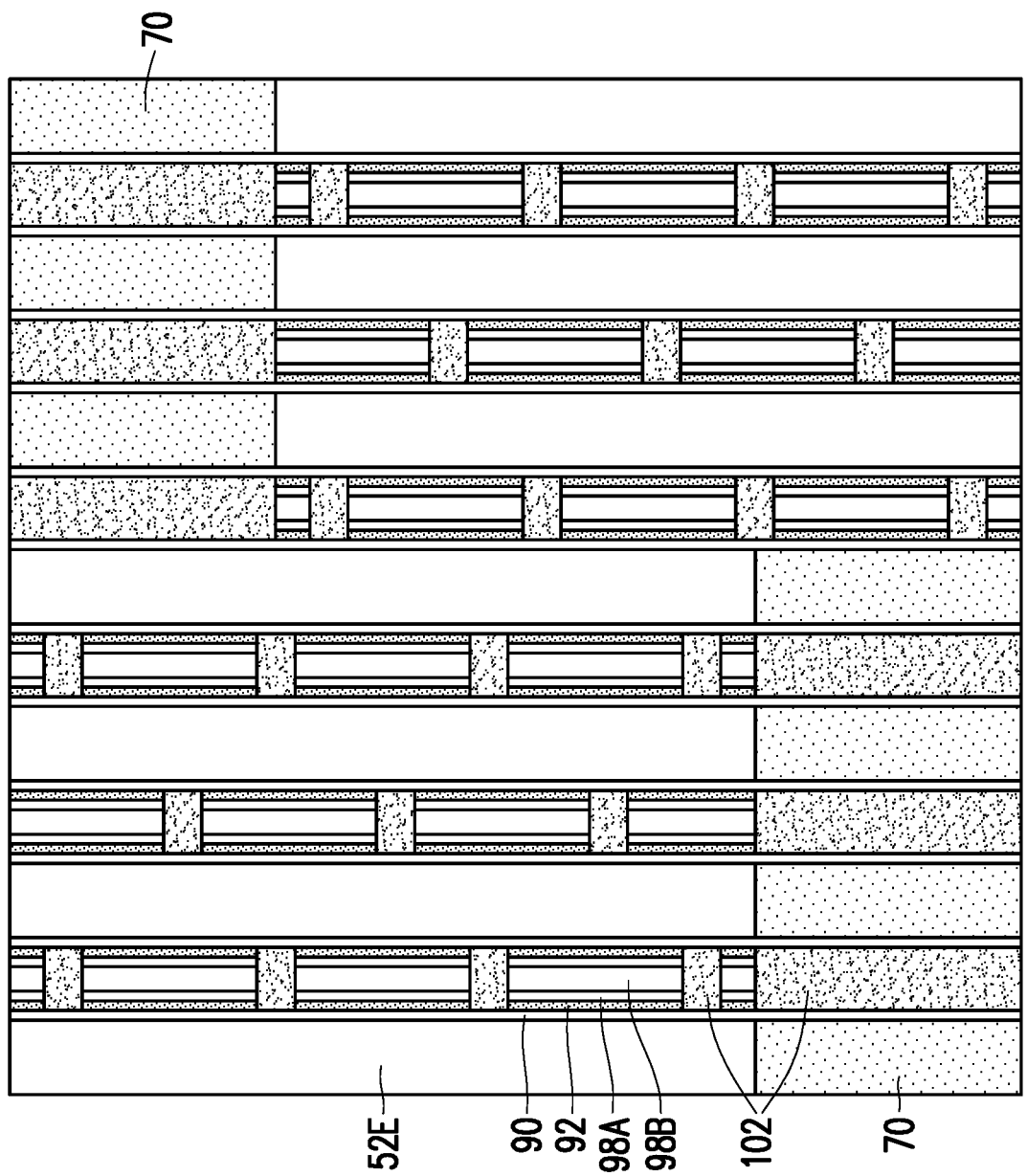
Figure 21B:
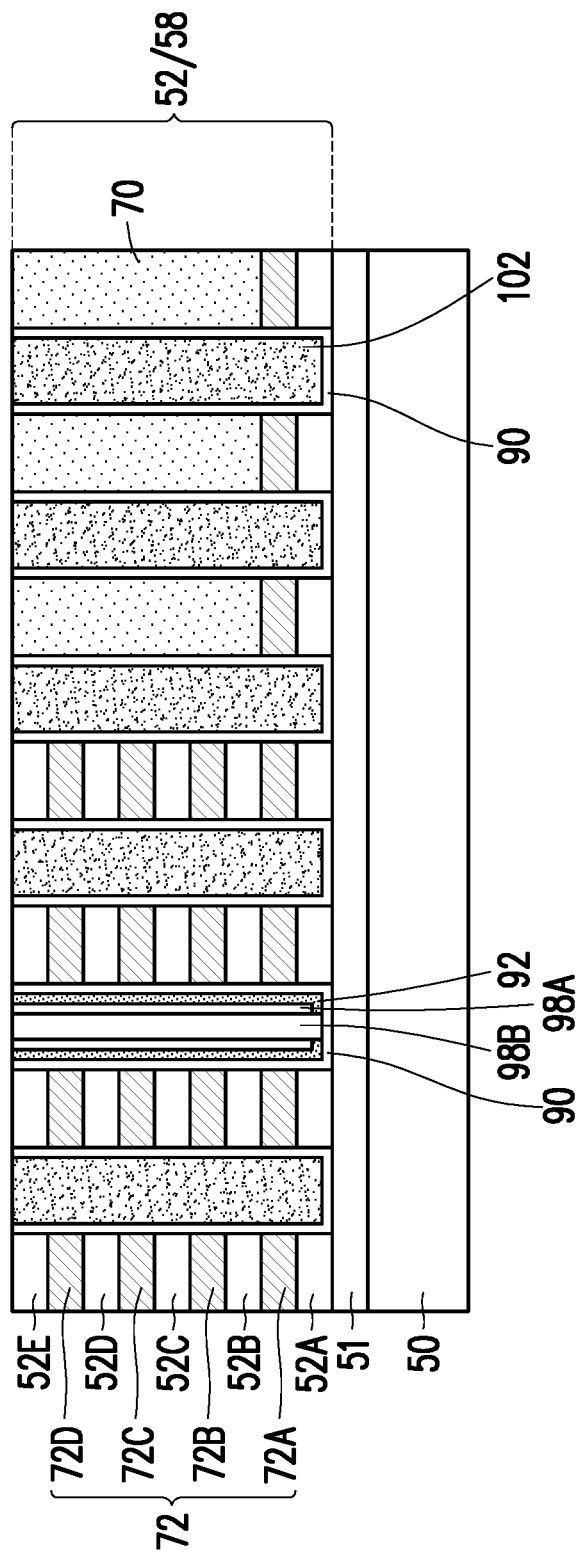

In FIGS. 21A and 21B, dielectric materials 102 are deposited in and fill the trenches 100. The dielectric materials 102 may include, for example, silicon oxide, silicon nitride, silicon oxynitride, or the like, which may be deposited by CVD, PVD, ALD, PECVD, or the like. The dielectric materials 102 may extend along sidewalls and bottom surfaces of the trenches 100 over the OS layer 92. After deposition, a planarization process (e.g., a CMP, an etchback, or the like) may be performed to remove excess portions of the dielectric materials 102. In the resulting structure, top surfaces of the multi-layer stack 58, the memory film 90, the OS layer 92, the dielectric materials 98, and the dielectric materials 102 may be substantially level (e.g., within process variations) with one another.

In some embodiments, materials of the dielectric materials 98 and the dielectric materials 102 may be selected so that they may be etched selectively relative to each other. For example, in some embodiments, the dielectric materials 98 are an oxide and the dielectric materials 102 are a nitride. In some embodiments, the dielectric materials 98 are a nitride and the dielectric materials 102 are an oxide. Other materials are also possible.

Figure 22A:
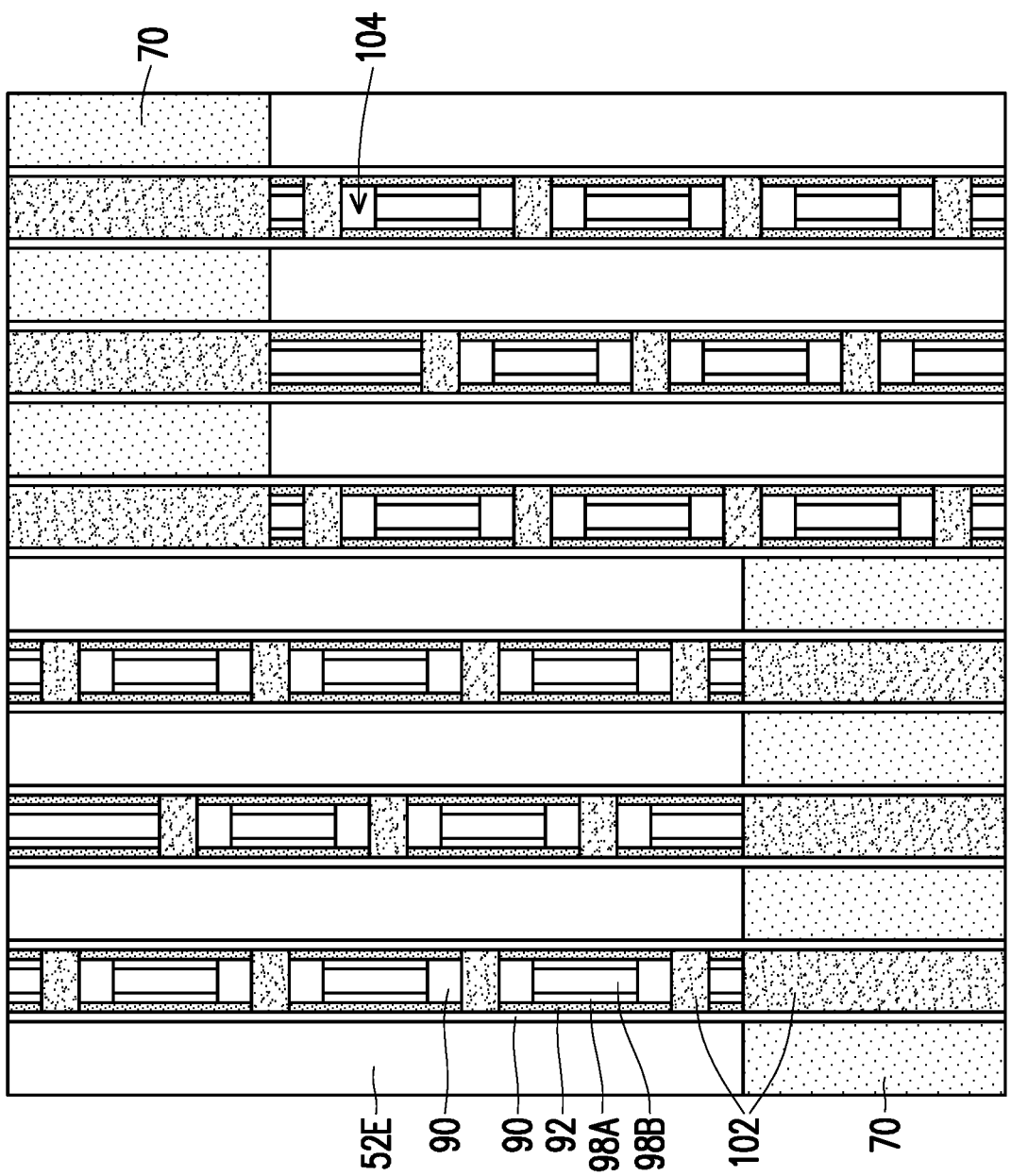
Figure 22B:
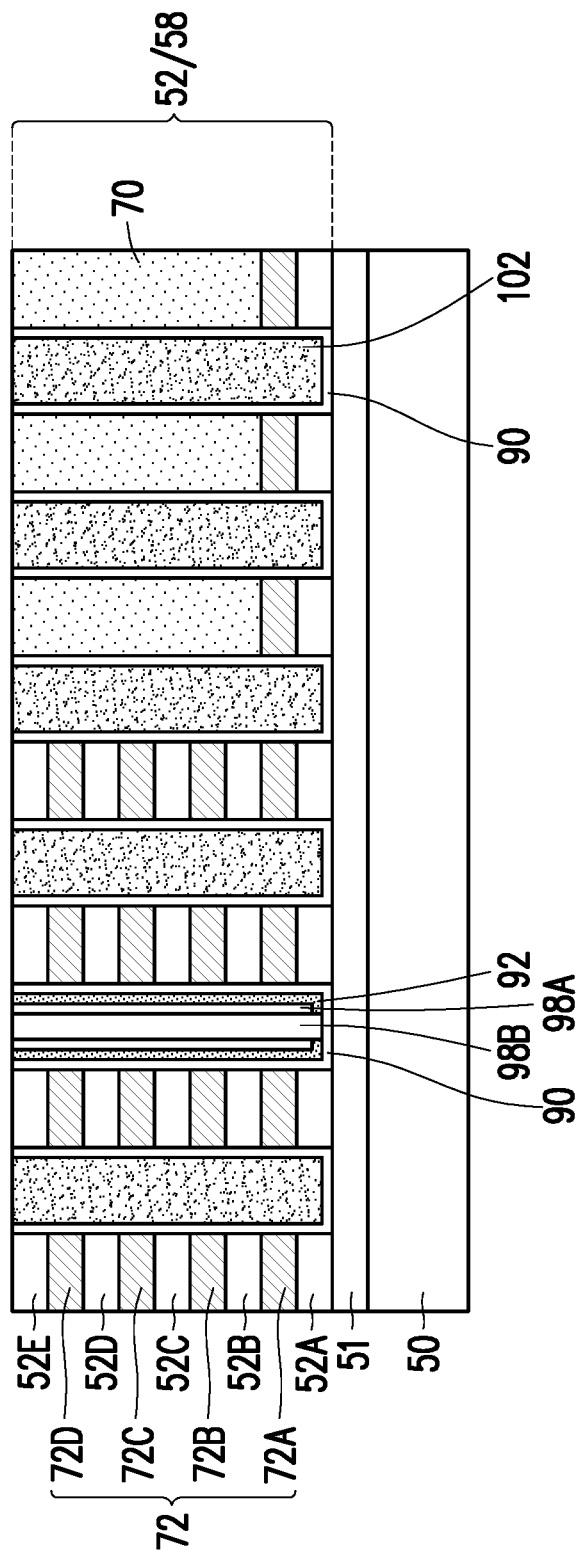
Figure 22C:
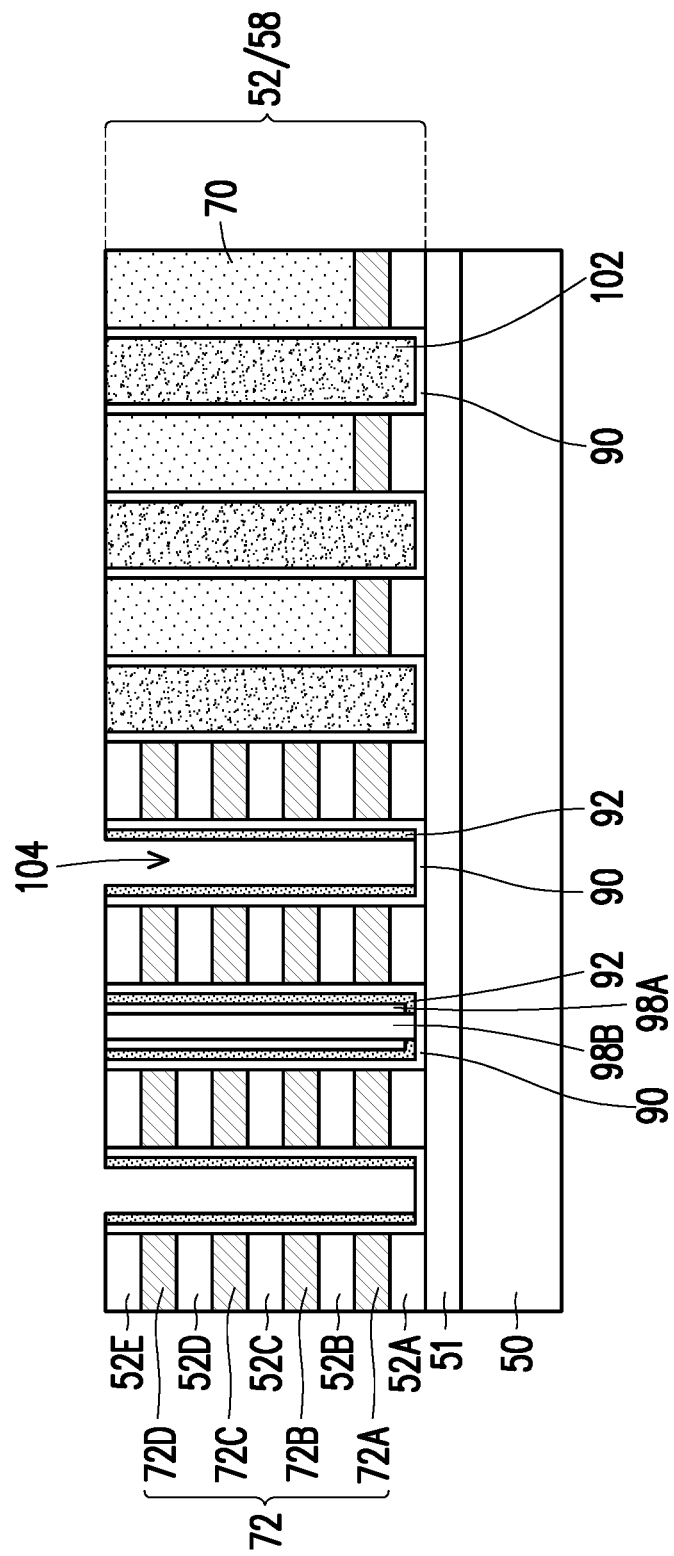

In FIGS. 22A and 22B, trenches 104 are patterned through the dielectric materials 98. The trenches 104 may be subsequently used to form conductive lines. The trenches 104 may be patterned through the dielectric materials 98 using a combination of photolithography and etching. The etching may be any acceptable etch process, such as wet or dry etching, RIE, NBE, the like, or a combination thereof. The etching may be anisotropic. The etching may use etchants that etch the dielectric materials 98 without significantly etching the dielectric materials 102, the OS layer 92, or the memory film 90. A pattern of the trenches 104 may correspond to that of subsequently formed conductive lines (such as the conductive lines 106 and the conductive lines 108, discussed below with respect to FIGS. 23A through 23C). Portions of the dielectric materials 98 may remain between each pair of the trenches 104, and the dielectric materials 102 may be disposed between adjacent pairs of the trenches 104. Further, portions of the OS layer 92 and the memory film 90 may remain adjacent the trenches 104 between the trenches 104 and each of the dielectric layers 52 and the conductive lines 72. The portions of the OS layer 92 and the memory film 90 may be used as part of subsequently formed transistors 204. In some embodiments, a different etching may be used to pattern the trenches 104 as opposed to the process used to pattern the trenches 100 in order to selectively etch the material of the dielectric materials 98 with respect to the OS layer 92 and the memory film 90.

Figure 23A:
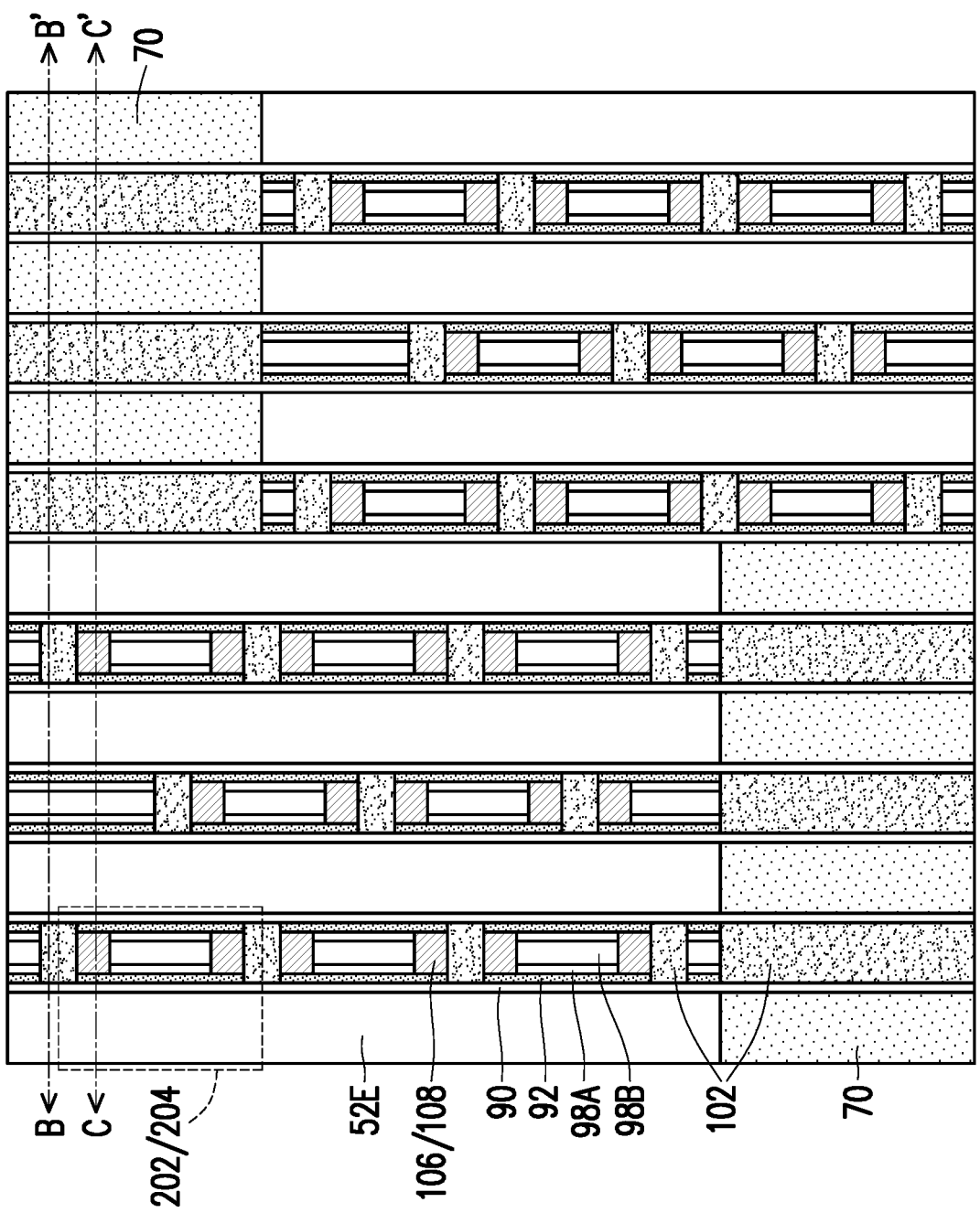
Figure 23B:
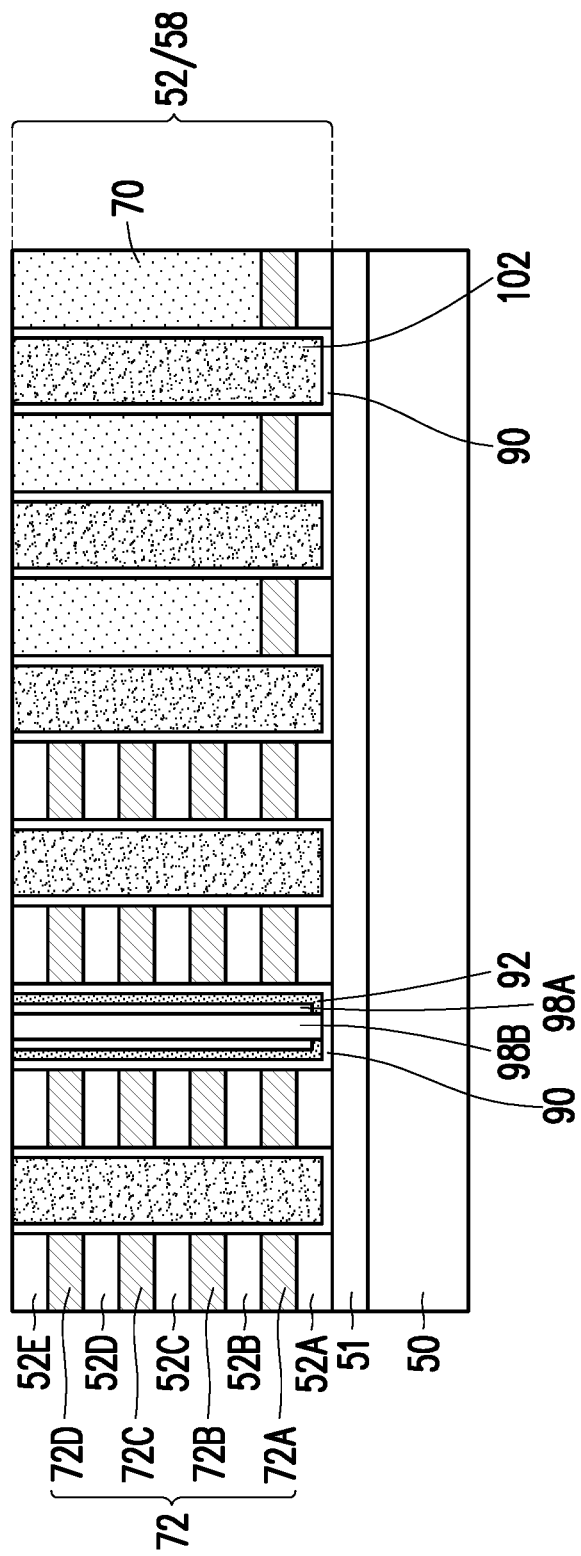
Figure 23C:
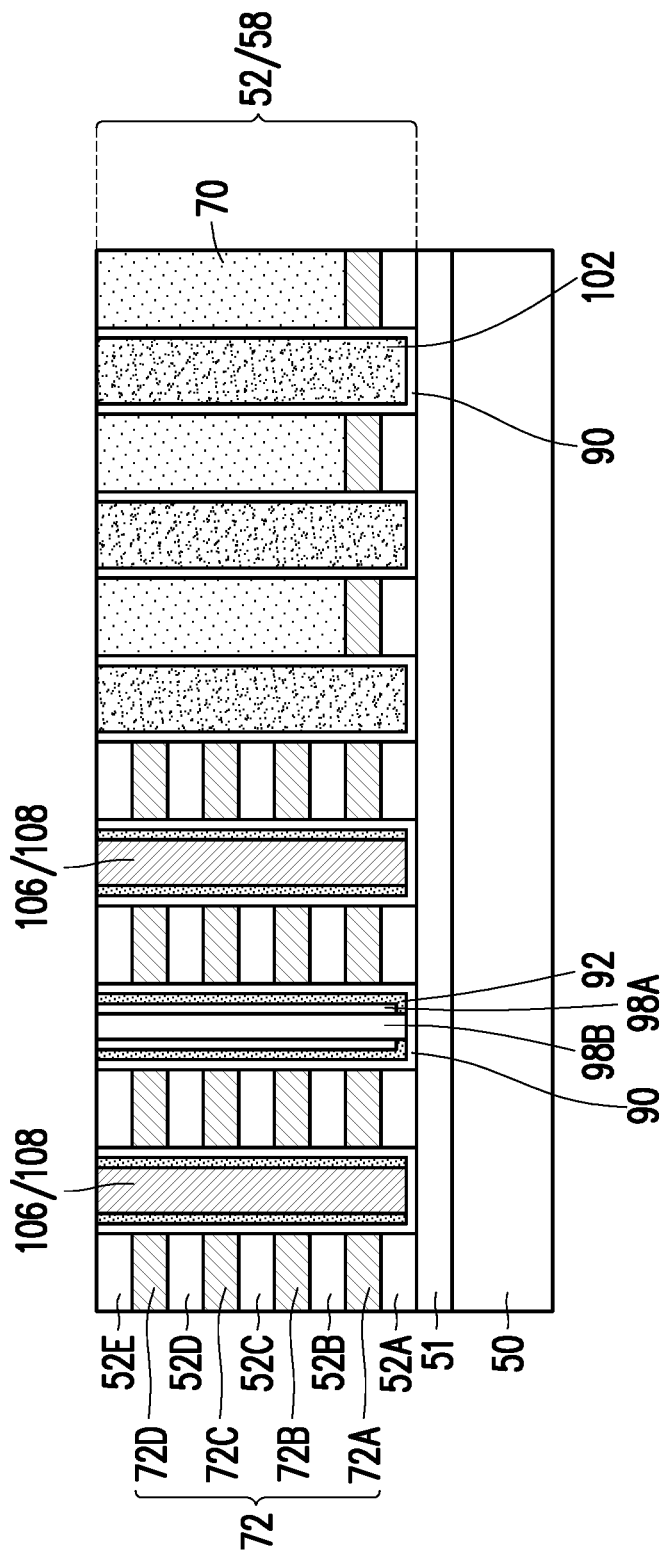

In FIGS. 23A through 23C, the trenches 104 are filled with a conductive material to form conductive lines 106 and conductive lines 108. FIG. 23A illustrates reference cross-sections that are used in later figures. Cross-section B-B' extends in a direction perpendicular to longitudinal axes of the conductive lines 72 and extends through the dielectric materials 98. Cross-section C-C' extends in a direction parallel to cross-section B-B' and extends through the conductive lines 106 and/or the conductive lines 108. Memory cells 202 and transistors 204 are formed, which each include a conductive line 106, a conductive line 108, a conductive line 72 a portion of the memory film 90, and a portion of the OS layer 92. The conductive lines 106 and the conductive lines 108 may each comprise conductive materials such as copper, titanium, titanium nitride, tantalum, tantalum nitride, tungsten, ruthenium, aluminum, combinations thereof, or the like. The conductive lines 106 and the conductive lines 108 may be formed using, for example, CVD, ALD, PVD, PECVD, or the like. After the conductive materials are deposited, a planarization (e.g., a CMP, an etch-back, or the like) may be performed to remove excess portions of the conductive materials, thereby forming the conductive lines 106 and the conductive lines 108. In the resulting structure, top surfaces of the multi-layer stack 58, the IMD 70, the memory film 90, the OS layer 92, the dielectric materials 98, the dielectric materials 102, the conductive lines 106, and the conductive lines 108 may be substantially level (e.g., within process variations) with one another.

The conductive lines 106 may correspond to bit lines in the memory array 200 and the conductive lines 108 may correspond to source lines in the memory array 200. Further, the conductive lines 106 and the conductive lines 108 may provide source/drain electrodes for the transistors 204 in the memory array 200. Although FIG. 23C illustrates a cross-sectional view that only shows the conductive lines 106, a cross-sectional view of the conductive lines 108 may be similar.

Although the channel regions for the transistors 204, the conductive lines 106, and the conductive lines 108 have been discussed as being formed after forming the staircase structure 68, in some embodiments, the staircase structure 68 may be formed after forming the channel regions for the transistors 204, the conductive lines 106, and the conductive lines 108. For example, the manufacturing steps illustrated in and described with respect to FIGS. 4A through 12C to form the staircase structure 68 may be performed after the manufacturing steps illustrated in and described with respect to FIGS. 13A through 23C. The same or similar processes may be used in staircase-first and staircase-last embodiments.

In FIGS. 24A through 24D, a dielectric layer 120 is formed over the multi-layer stack 58, the IMD 70, the memory film 90, the OS layer 92, the dielectric materials 98, the dielectric materials 102, the conductive lines 106, and the conductive lines 108. The dielectric layer 120 may comprise a dielectric material, such as a low-k dielectric material, an extra low-k (ELK) dielectric material, or the like. In some embodiments, the dielectric layer 120 may comprise insulating materials, such as silicon oxide, silicon nitride, silicon oxynitride, combinations thereof, or the like. The dielectric layer 120 may be deposited using an appropriate process, such as, CVD, ALD, PVD, PECVD, or the like.

FIG. 24A further illustrates reference cross-sections that are used in later figures. Cross-section A-A' extends through the first portion 68A of the staircase structure 68 along longitudinal axes of the conductive lines 72. Cross-section C-C' extends through the conductive lines 106 in the second portion 68B of the staircase structure 68 in a direction perpendicular to cross-section A-A'. Cross-section D-D' extends through the dielectric materials 98 and the dielectric materials 102 adjacent the conductive lines 72 in a direction parallel to the cross-section A-A'.

Further in FIGS. 24A through 24D, trenches 110 are formed in the dielectric layer 120 and the IMD 70, trenches 112 are formed in the dielectric layer 120, the dielectric materials 98, the memory film 90, and the etch stop layer 51, and trenches 114 are formed in the dielectric layer 120. The trenches 110, the trenches 112, and the trenches 114 may subsequently be used to form conductive contacts. More specifically, the trenches 110 may be subsequently used to form conductive contacts extending to the conductive lines 72 (e.g., to form word line contacts, gate contacts, or the like), the trenches 112 may be subsequently used to form conductive contacts extending to the circuits formed over the substrate 50, and the trenches 114 may be subsequently used to form conductive contacts extending to the conductive lines 106 and the conductive lines 108 (e.g., to form bit line contacts, source line contacts, or the like).

Figure 24B:
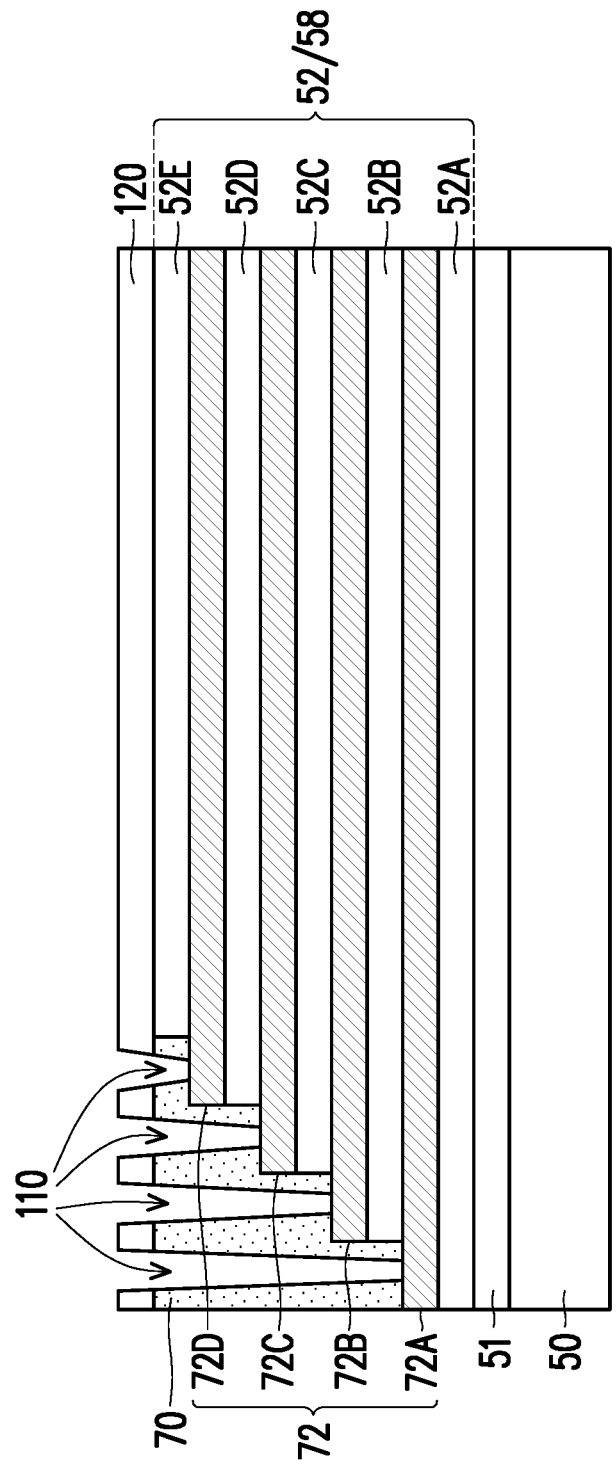
Figure 24C:
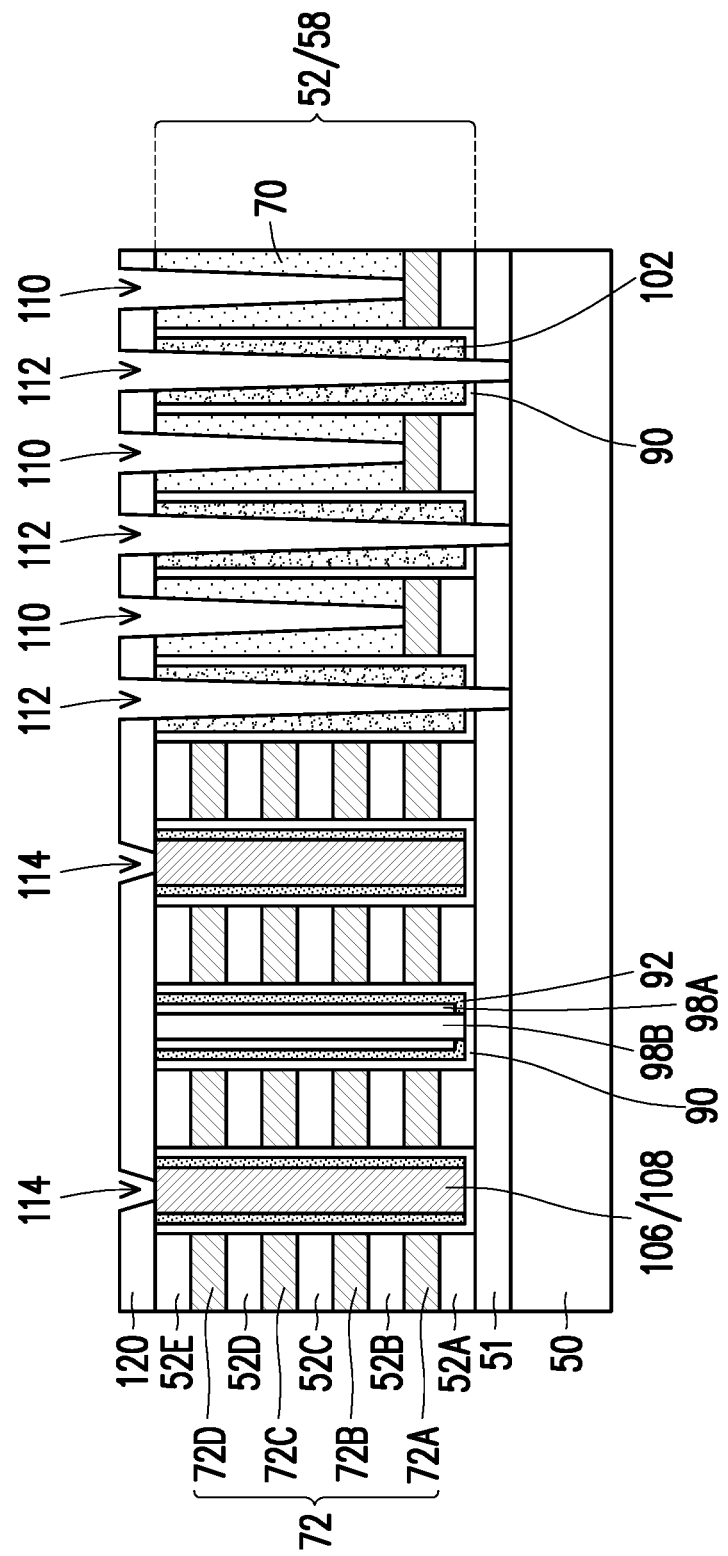
Figure 24D:
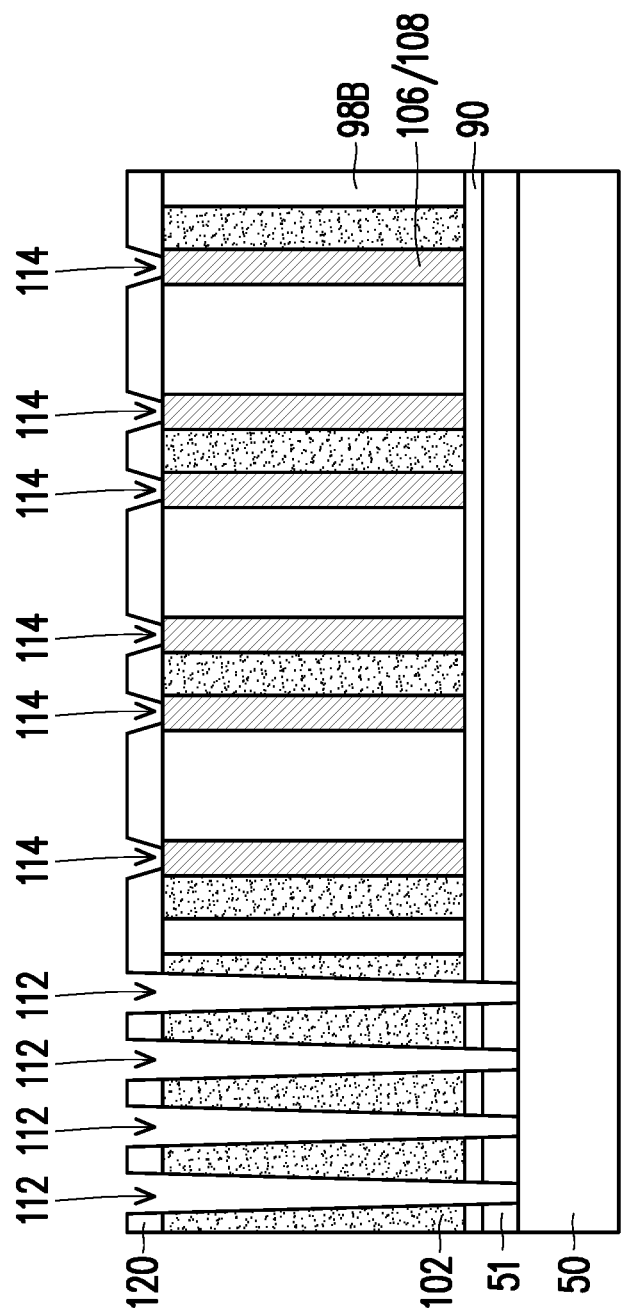
Figure 25A:
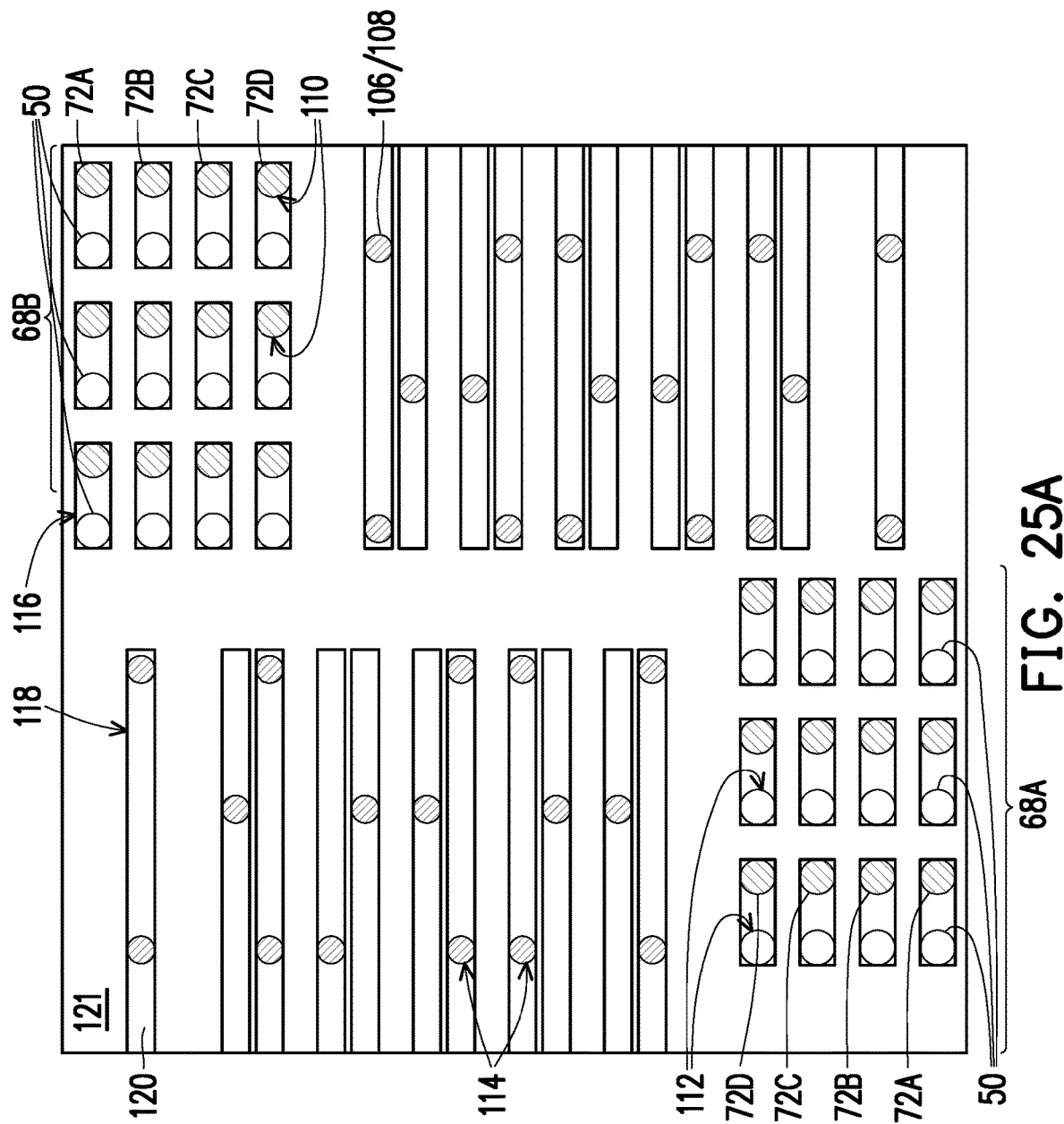
Figure 25B:
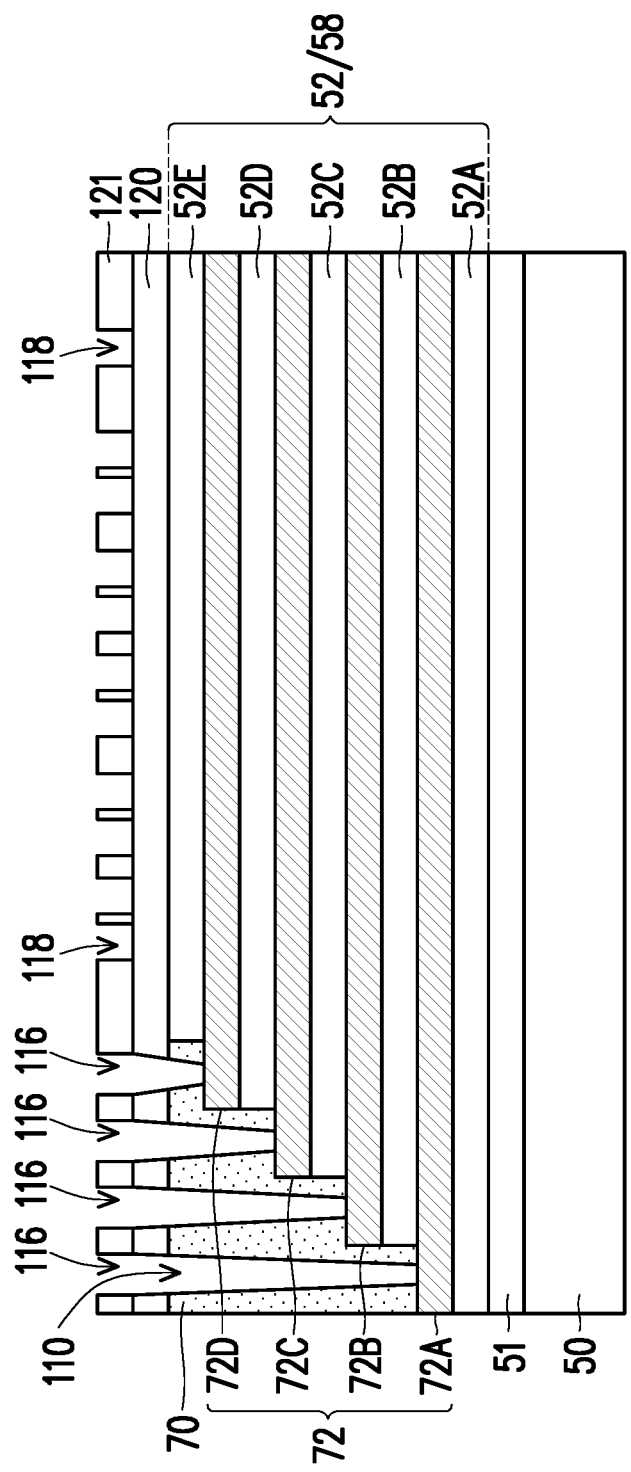
Figure 25C:
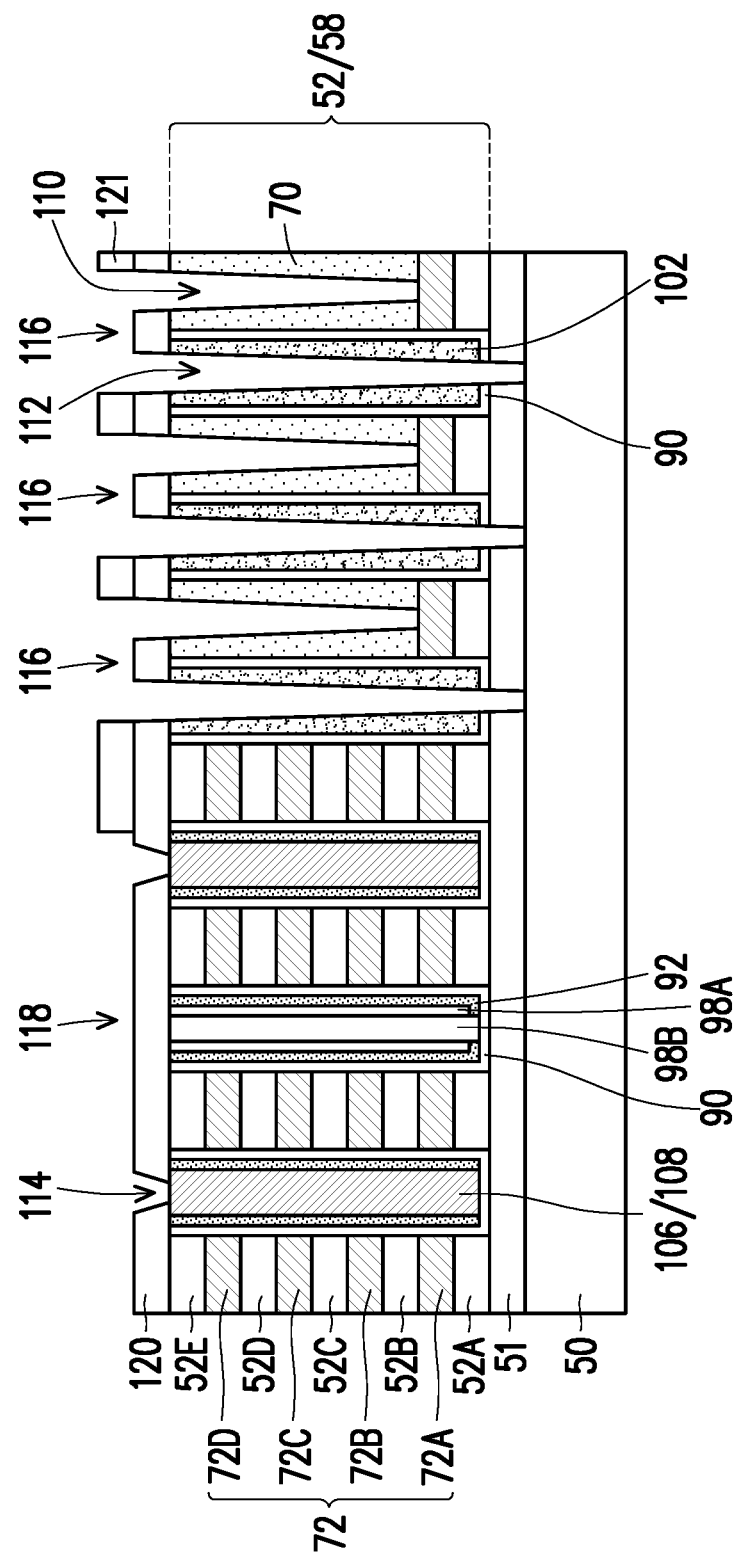
Figure 25D:
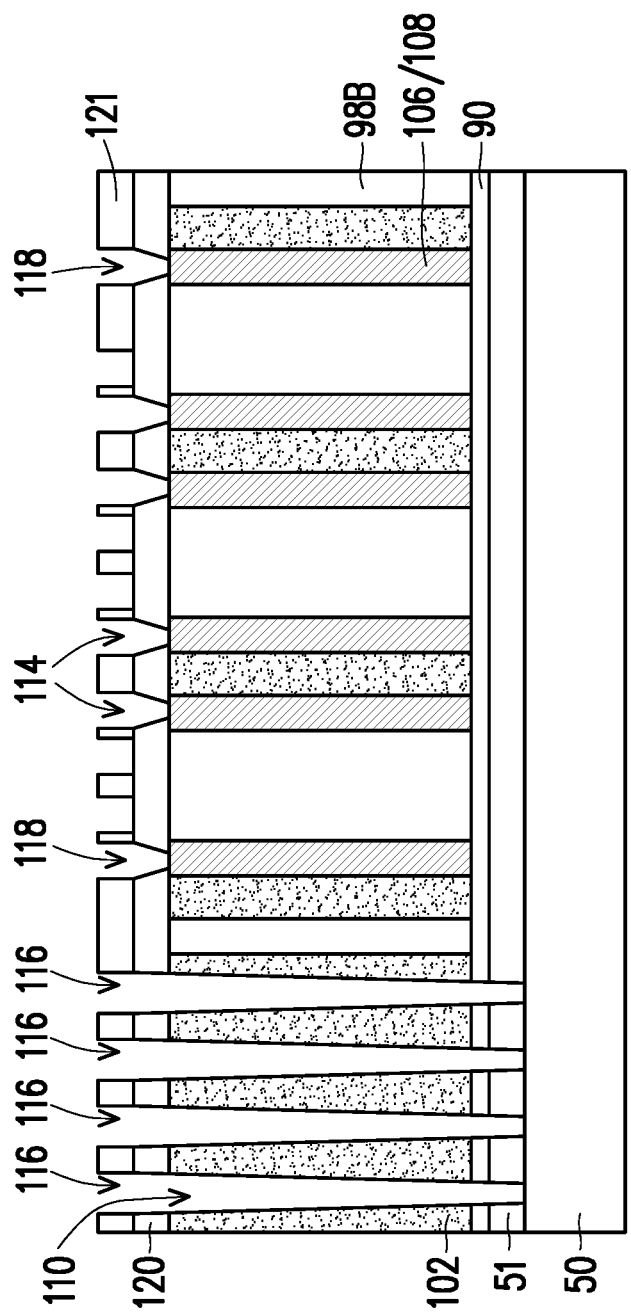

As illustrated in FIGS. 24B and 24C, the trenches 110 may extend through the dielectric layer 120 and the IMD 70 and may expose top surfaces of the conductive lines 72. The staircase shape of the conductive lines 72 provides surfaces on each of the conductive lines 72 to which the trenches 110 may extend. As illustrated in FIGS. 24C and 24D, the trenches 112 may extend through the dielectric layer 120, the dielectric materials 102, the memory film 90, and the etch stop layer 51. In embodiments in which bottom portions of the memory film 90 are removed, the trenches 112 may extend through the dielectric layer 120, the dielectric materials 102, and the etch stop layer 51 only. The trenches 112 may expose top surfaces of the substrate 50. In embodiments in which the interconnect structure 320 is formed over the substrate 50 (see FIG. 2) the trenches 112 may expose top surfaces of the conductive features 322 of the interconnect structure 320. As illustrated in FIGS. 24A and 24C, the trenches 110 and the trenches 112 may extend through adjacent portions of the dielectric layer 120, the IMD 70, the dielectric materials 102, the memory film 90, and the etch stop layer 51 in a same cross-section, which cross-section is perpendicular to longitudinal axes of the conductive lines 72.

As will be discussed in greater detail below, conductive contacts (such as the conductive contacts 122 and the conductive contacts 124, discussed below with respect to FIGS. 26A through 26E) may be formed in the trenches 110 and the trenches 112 and the conductive contacts may be electrically coupled to one another through conductive lines (such as the conductive lines 128, discussed below with respect to FIGS. 26A through 26E). Forming the first portion 68A and the second portion 68B of the staircase structure 68 along opposite edges of the memory array 200 allows for connections to be made from each of the conductive lines 72 to different portions of the underlying substrate 50. Because the first portion 68A and the second portion 68B of the staircase structure 68 are formed along only portions of the second edge $E_2$ and the fourth edge $E_4$, the memory cells 202 may be formed along the remainder of the second edge $E_2$ and the fourth edge $E_4$. This allows for device density to be increased.

As illustrated in FIGS. 24C and 24D, the trenches 114 may extend through the dielectric layer 120 and may expose the conductive lines 106 and the conductive lines 108. The trenches 114 may be used subsequently to form conductive contacts (e.g., source line contacts and bit line contacts, such as the conductive contacts 126 and the conductive contacts 124, discussed below with respect to FIGS. 26A through 26E) electrically coupled to the conductive lines 106 and the conductive lines 108.

The trenches 110, the trenches 112, and the trenches 114 may be formed using a combination of photolithography and etching. The etching may be any acceptable etch process, such as wet or dry etching, RIE, NBE, the like, or a combination thereof. The etching may be anisotropic. In some embodiments, trenches 110, the trenches 112, and the trenches 114 may be formed simultaneously; however, the trenches 110, the trenches 112, and the trenches 114 may also be formed separately using multiple etching processes.

In FIGS. 25A through 25D, a dielectric layer 121 is formed over the dielectric layer 120. The dielectric layer 121 may comprise a dielectric material, such as a low-k dielectric material, an extra low-k (ELK) dielectric material, or the like. In some embodiments, the dielectric layer 121 may comprise insulating materials, such as silicon oxide, silicon nitride, silicon oxynitride, combinations thereof, or the like. The dielectric layer 121 may be deposited using an appropriate process, such as, CVD, ALD, PVD, PECVD, or the like. Further in FIGS. 25A through 25D, trenches 116 and trenches 118 are formed in the dielectric layer 121. The trenches 116 and the trenches 118 may subsequently be used to form conductive lines. More specifically, the trenches 116 may be subsequently used to form conductive lines electrically coupling subsequently formed conductive contacts to one another and to underlying structures, such as circuits formed on the substrate 50.

In FIGS. 26A through 26E, conductive contacts 122 are formed in the trenches 110, conductive contacts 124 are formed in the trenches 112, conductive contacts 126 are formed in the trenches 114, conductive lines 128 are formed in the trenches 116, and conductive lines 130 are formed in the trenches 118. FIG. 26E illustrates a perspective view in which the IMD 70, the dielectric layer 120, and the dielectric layer 121 are omitted in order to more clearly show relationships between the conductive contacts 122, the conductive contacts 124, the conductive contacts 126, the conductive lines 128, and the conductive lines 130 and the other elements of the memory array 200. The conductive lines 128 electrically couple the conductive contacts 122 and the conductive contacts 124. The conductive lines 72 are electrically coupled to circuits formed on the substrate 50 through the conductive contacts 124, the conductive lines 128, and the conductive contacts 122. The conductive contacts 122 extend through the dielectric layer 120 and the IMD 70. The conductive contacts 122 may be referred to as word line contacts, gate contacts, or the like. The conductive contacts 124 extend through the dielectric layer 120, the dielectric materials 102, the memory film 90, and the etch stop layer 51. The conductive lines 128 extend through the dielectric layer 121.

Because the conductive lines 72 are formed in the staircase structure 68, surfaces on each of the conductive lines 72 are provided for the conductive contacts 122 to land on. A number of the conductive lines 72 may be included in the first portion 68A of the staircase structure 68 and a remainder of the conductive lines 72 may be included in the second portion 68B of the staircase structure 68 such that each of the conductive lines 72 is included in the staircase structure 68. As such, the conductive contacts 122 may extend to each of the conductive lines 72. Forming the first portion 68A of the staircase structure 68 and the second portion 68B of the staircase structure 68 along the second edge $E_2$ of the memory array 200 and the fourth edge $E_4$ of the memory array 200 opposite the second edge $E_2$ allows for connections to be made to different portions of the underlying substrate 50. Forming the first portion 68A of the staircase structure 68 and the second portion 68B of the staircase structure 68 extending only partially along the second edge $E_2$ and the fourth edge $E_4$ of the memory array 200 also minimizes the space taken up by the staircase structure 68. For example, memory cells 202 may be formed adjacent the first portion 68A and the second portion 68B of the staircase structure 68 in a direction parallel with the second edge $E_2$ and the fourth edge $E_4$ of the memory array 200, which maximizes the number of memory cells 202 that may be formed in the memory array 200 and increases device density.

Further, the conductive lines 128 route connections between the conductive contacts 122 and the conductive contacts 124 within the first portion 68A and the second portion 68B of the staircase structure 68 and extend in a direction perpendicular to longitudinal axes of the conductive lines 72. This routing configuration requires less area than conventional designs, which allows for greater device densities to be achieved. The connections may also be shorter than conventional designs, which reduces resistance and improves device performance. The trenches 110 and the trenches 112 may be formed simultaneously and the conductive contacts 122 and the conductive contacts 124 may be formed simultaneously such that less lithography steps and less deposition steps may be used, which reduces costs and production time.

The conductive lines 130 are electrically coupled to the conductive contacts 126 and may electrically couple the conductive lines 106 and the conductive lines 108 to the circuits formed on the substrate 50 through the conductive contacts 126 and the conductive lines 130. The conductive contacts 126 extend through the dielectric layer 120. The conductive contacts 126 may be referred to as source line contacts, bit line contacts, or the like. The conductive lines 130 extend through the dielectric layer 121.

The conductive contacts 122, the conductive contacts 124, the conductive contacts 126, the conductive lines 128, and the conductive lines 130 may be formed by forming liners (not separately illustrated), such as diffusion barrier layers, adhesion layers, or the like, and forming conductive materials over the liners. Each of the conductive contacts 122, the conductive contacts 124, the conductive contacts 126, the conductive lines 128, and the conductive lines 130 may be formed simultaneously, or separately using one or more deposition processes. The liners may include titanium, titanium nitride, tantalum, tantalum nitride, or the like. The conductive materials may be copper, a copper alloy, silver, gold, tungsten, cobalt, aluminum, nickel, or the like. A planarization process, such as a CMP, may be performed to remove excess material from surfaces of the dielectric layer 121.

FIG. 27 illustrates an embodiment in which the memory cells 202 in the memory array 200 are aligned in a direction parallel to the second edge $E_2$ and the fourth edge $E_4$. Although the memory cells 202 in a region aligned with the first portion 68A of the staircase structure 68 in a direction parallel to the first edge $E_1$ and the third edge $E_3$ are misaligned with the memory cells 202 in a region aligned with the second portion 68B of the staircase structure 68 in the direction parallel to the first edge $E_1$ and the third edge $E_3$, the memory cells 202 in both regions may be aligned in the direction parallel to the second edge $E_2$ and the fourth edge $E_4$. Aligning the memory cells 202 with one another may simplify the routing of connections to the memory cells 202, such as the conductive contacts 126 and the conductive lines 130.

Figure 28:
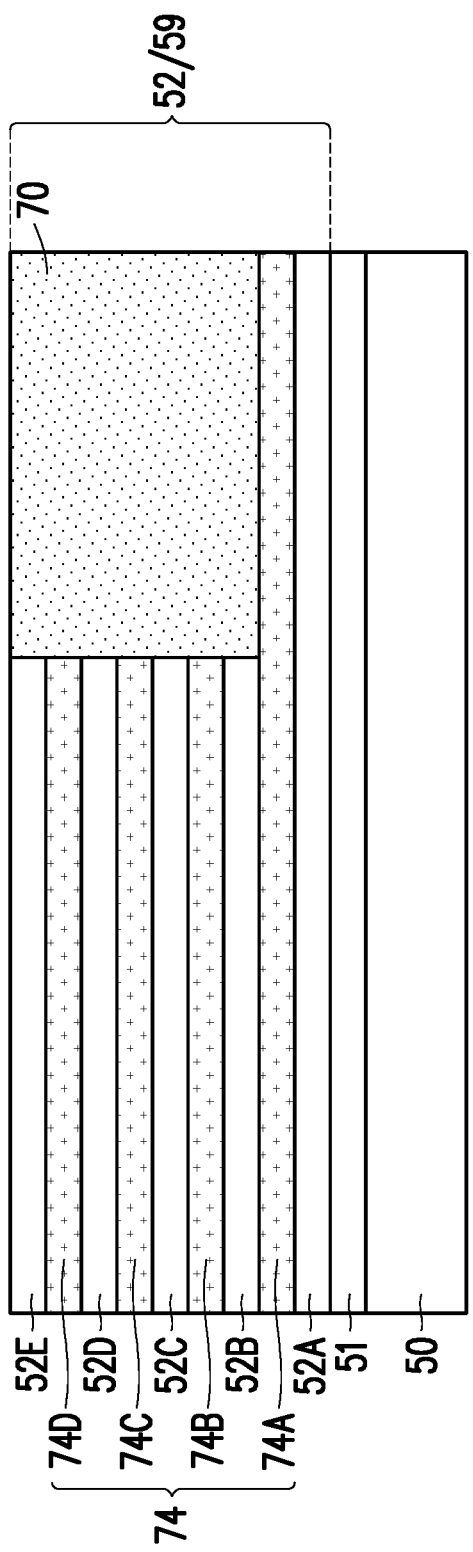

FIGS. 28 through 35 illustrate an embodiment in which a multi-layer stack 59 includes alternating dielectric layers 52 and sacrificial layers 74. FIG. 28 illustrates the multi-layer stack 59 after steps similar to or the same as those illustrated in FIGS. 3 through 12C and discussed above have been performed to form the staircase structure 68 and the IMD 70 over the staircase structure 68. The multi-layer stack 59 includes alternating layers of sacrificial layers 74A-74D (collectively referred to as sacrificial layers 74) and dielectric layers 52A-52E (collectively referred to as dielectric layers 52). The sacrificial layers 74 may be replaced with conductive materials in subsequent steps to define conductive lines 412 (e.g., word lines). The sacrificial layers 74 may comprise insulating materials, such as silicon oxide, silicon nitride, silicon oxynitride, combinations thereof, or the like. The dielectric layers 52 may comprise insulating materials, such as silicon oxide, silicon nitride, silicon oxynitride, combinations thereof, or the like. The dielectric layers 52 may be formed of a material having high etch selectivity from the etching of the sacrificial layers 74 and the substrate 50 may be formed of a material having high etch selectivity from the etching of both the sacrificial layers 74 and the dielectric layers 52 in order to aid with subsequent etching steps. In some embodiments, the substrate 50 may be formed of silicon carbide, the dielectric layers 52 may be formed of an oxide, such as silicon oxide, and the sacrificial layers 74 may be formed of a nitride, such as silicon nitride. The sacrificial layers 74 and the dielectric layers 52 may each be formed using, for example, CVD, ALD, physical vapor deposition (PVD), plasma enhanced CVD (PECVD), or the like. Although FIG. 28 illustrates a particular number of the sacrificial layers 74 and the dielectric layers 52, other embodiments may include different numbers of the sacrificial layers 74 and the dielectric layers 52.

Figure 29:
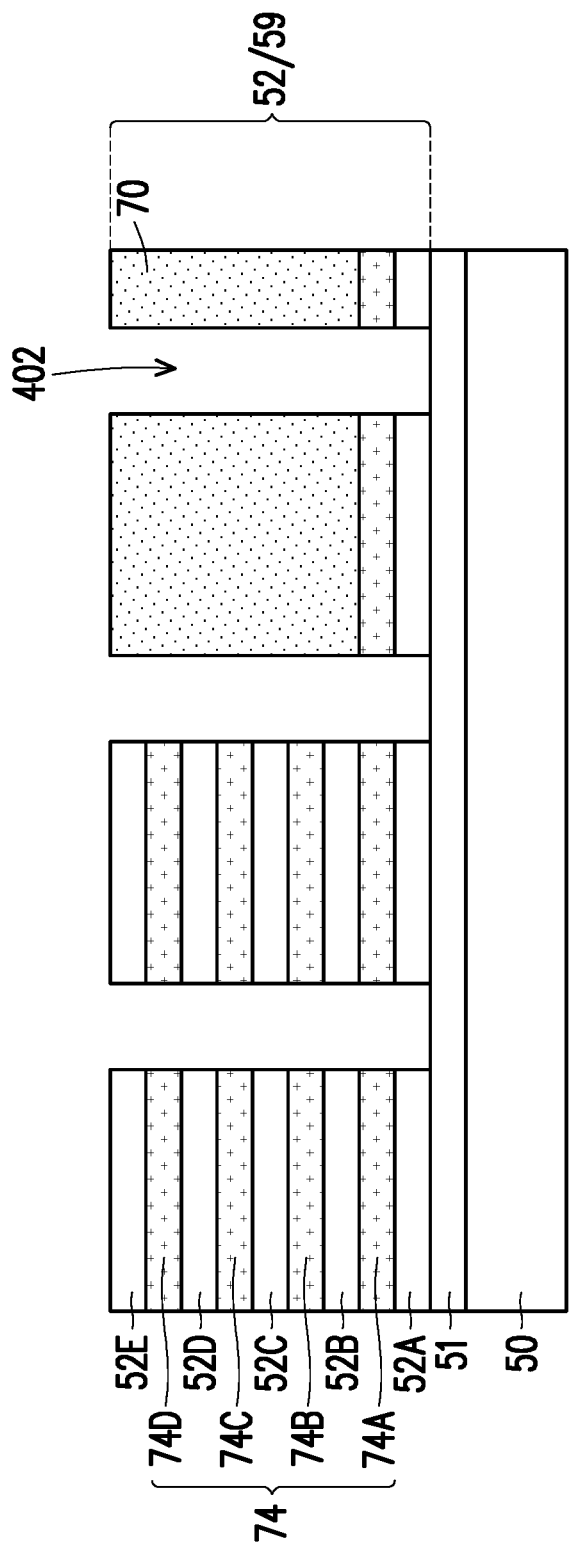

In FIG. 29, first trenches 402 are formed in the multi-layer stack 59. In the illustrated embodiment, the first trenches 402 extend through the multi-layer stack 59 to expose the etch stop layer 51. In some embodiments, the first trenches 402 extend through some but not all layers of the multi-layer stack 59, or extend through the multi-layer stack 59 and the etch stop layer 51. The first trenches 402 may be formed using acceptable photolithography and etching techniques, such as with an etching process that is selective to the multi-layer stack 59 (e.g., etches the dielectric materials of the dielectric layers 52 and the sacrificial layers 74 at a faster rate than the material of the substrate 50). The etching may be any acceptable etch process, such as a reactive ion etch (RIE), neutral beam etch (NBE), the like, or a combination thereof. The etching may be anisotropic. In embodiments in which the substrate 50 is formed of silicon carbide, the dielectric layers 52 are formed of silicon oxide, and the sacrificial layers 74 are formed of silicon nitride, the first trenches 402 may be formed by a dry etch using a fluorine-based gas (e.g., $C_4F_6$) mixed with hydrogen ($H_2$) or oxygen ($O_2$) gas.

Figure 30:
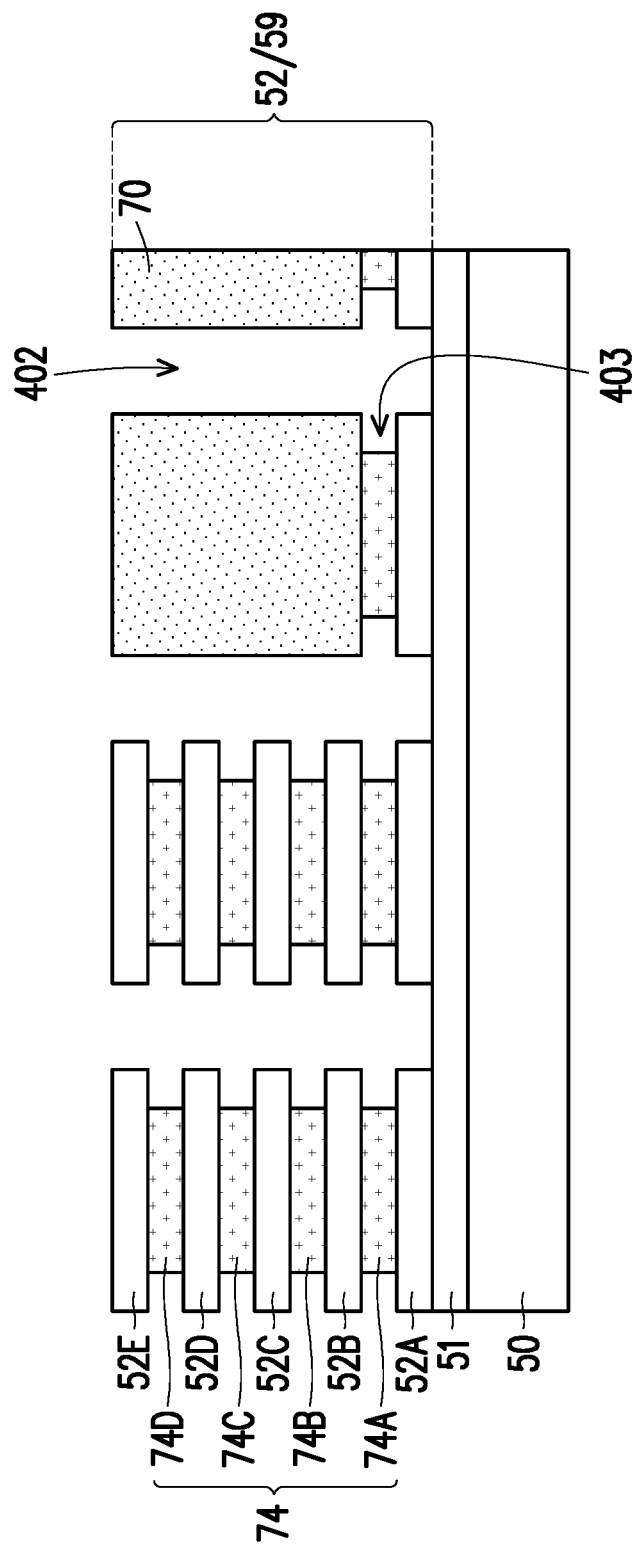

In FIG. 30, the first trenches 402 are expanded to form first sidewall recesses 403. Specifically, portions of the sidewalls of the sacrificial layers 74 exposed by the first trenches 402 are recessed from the first sidewall recesses 403. Although sidewalls of the sacrificial layers 74 are illustrated as being straight, the sidewalls may be concave or convex. The first sidewall recesses 403 may be formed by an acceptable etching process, such as one that is selective to the material of the sacrificial layers 74 (e.g., selectively etches the material of the sacrificial layers 74 at a faster rate than the materials of the dielectric layers 52, the etch stop layer 51, and the substrate 50). The etching may be isotropic. In embodiments where the substrate 50 is formed of silicon carbide, the dielectric layers 52 are formed of silicon oxide, and the sacrificial layers 74 are formed of silicon nitride, the first trenches 402 can be expanded by a wet etch using phosphoric acid ($H_3PO_4$). However, any suitable etching process, such as a dry selective etch, may also be utilized.

Figure 31:
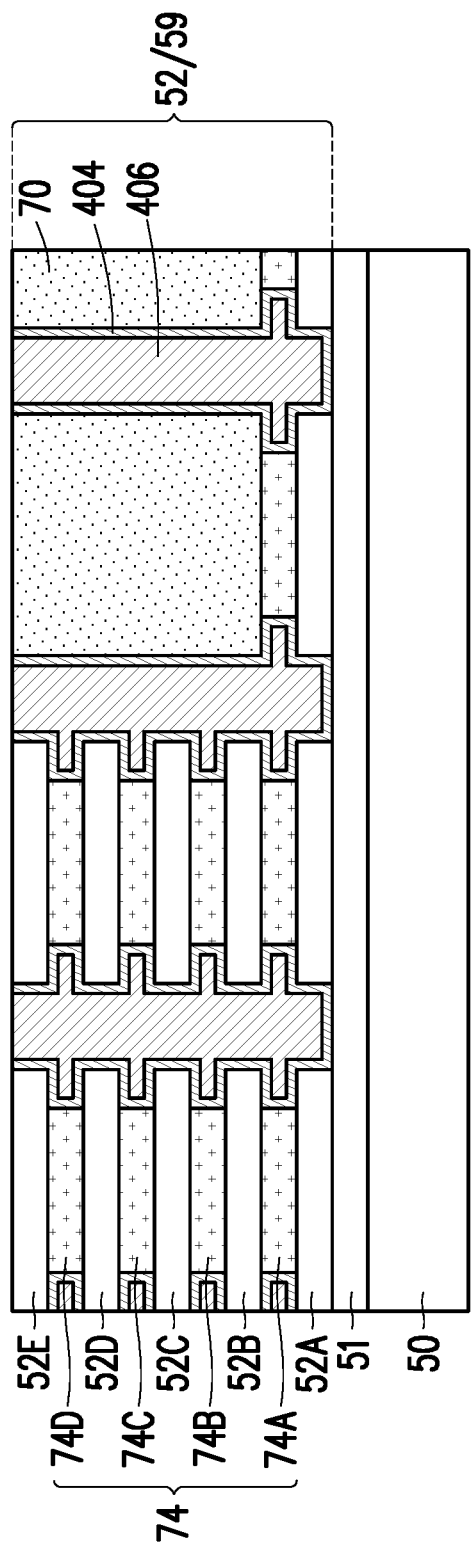

In FIG. 31, a seed layer 404 and a conductive fill material 406 are formed in the first sidewall recesses 403 and to fill and/or overfill the first trenches 402. One or more additional layers, such as seed layers, glue layers, barrier layers, diffusion layers, fill layers, and the like may also be filled in the first trenches 402 and the first sidewall recesses 403. In some embodiments, the seed layer 404 may be omitted. The seed layer 404 may be formed of a first conductive material that can be utilized to help grow or to help adhere the subsequently deposited material. In some embodiments, the seed layer 404 may comprise titanium nitride, tantalum nitride, titanium, tantalum, molybdenum, ruthenium, rhodium, hafnium, iridium, niobium, rhenium, tungsten, combinations of these, oxides of these, or the like. The conductive fill material 406 may be formed of a second conductive material, which may be a metal, such as tungsten, cobalt, aluminum, nickel, copper, silver, gold, molybdenum, ruthenium, molybdenum nitride, alloys thereof, or the like. In embodiments in which the dielectric layers 52 are formed of an oxide such as silicon oxide, the seed layer 404 can be formed of titanium nitride and the conductive fill material 406 can be formed of tungsten. The seed layer 404 and the conductive fill material 406 may each be formed by an acceptable deposition process such as chemical vapor deposition (CVD), atomic layer deposition (ALD), or the like.

Once the seed layer 404 and the conductive fill material 406 have been deposited in order to fill and/or overfill the first trenches 402, the seed layer 404 and the conductive fill material 406 may be planarized to remove excess material outside of the first trenches 402, such that after the planarizing the seed layer 404 and the conductive fill material 406 completely span a top portion of the first trenches 402. In an embodiment, the seed layer 404 and the conductive fill material 406 may be planarized using, for example, a chemical mechanical planarization (CMP) process. However, any suitable planarization process, such as a grinding process, may also be utilized.

Figure 32:
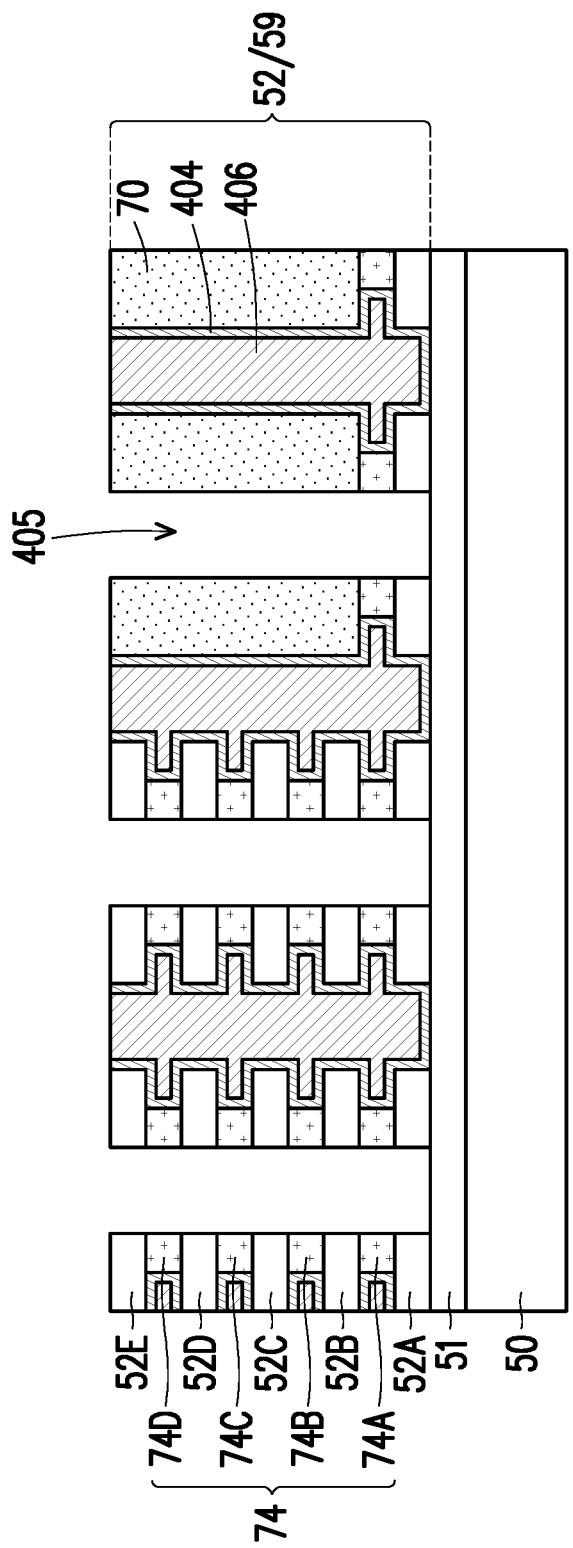

In FIG. 32, second trenches 405 are formed in the multi-layer stack 59. In the illustrated embodiment, the second trenches 405 extend through the multi-layer stack 59 and expose the etch stop layer 51. In some embodiments, the second trenches 405 extend through some but not all layers of the multi-layer stack 59, or extend through the multi-layer stack 59 and the etch stop layer 51. The second trenches 405 may be formed using acceptable photolithography and etching techniques, such as with an etching process that is selective to the multi-layer stack 59 (e.g., etches the dielectric materials of the dielectric layers 52 and the sacrificial layers 74 at a faster rate than the material of the substrate 50). The etching may be any acceptable etch process, and in some embodiments, may be similar to the etch used to form the first trenches 402 discussed with respect to FIG. 29.

Figure 33:
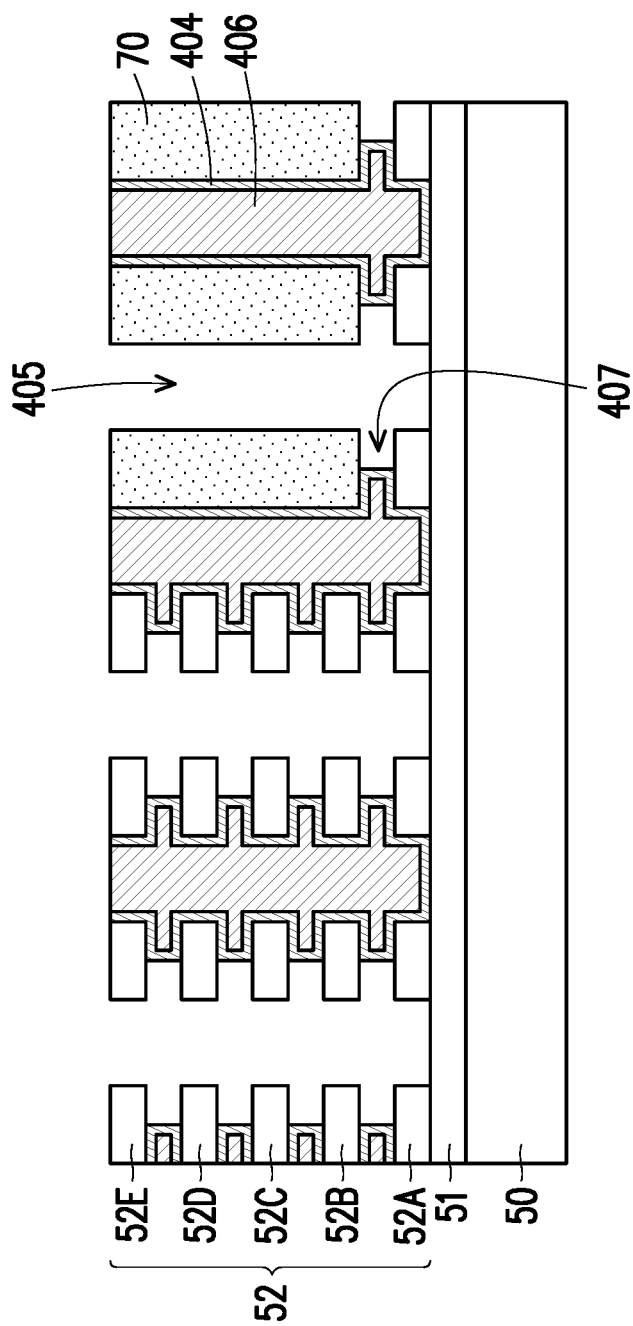

In FIG. 33, the second trenches 405 are expanded to form second sidewall recesses 407. Specifically, the remaining portions of the sacrificial layers 74 are removed to form the second sidewall recesses 407. The second sidewall recesses 407 thus expose portions of the seed layer 404 or, in embodiments in which the seed layer 404 is not present, the conductive fill material 406. The second sidewall recesses 407 may be formed by an acceptable etching process, such as one that is selective to the material of the sacrificial layers 74 (e.g., selectively etches the material of the sacrificial layers 74 at a faster rate than the materials of the dielectric layers 52, the etch stop layer 51, and the substrate 50). The etching may be any acceptable etch process, and in some embodiments, may be similar to the etch used to form the first sidewall recesses 403 discussed with respect to FIG. 30.

Figure 34:
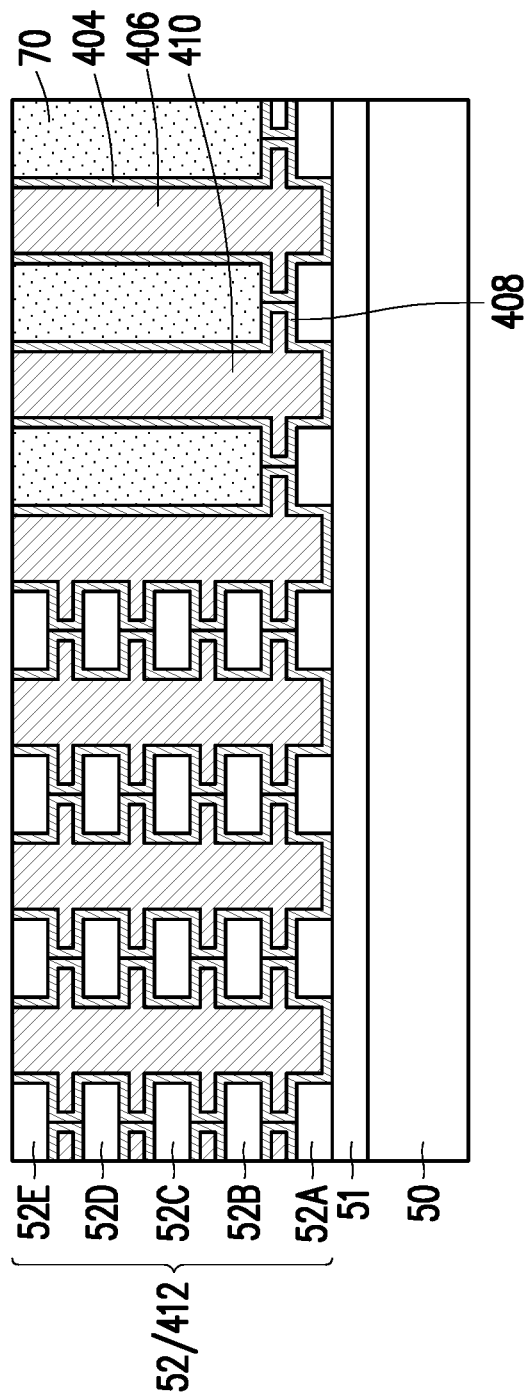

In FIG. 34, a seed layer 408 and a conductive fill material 410 are formed in the second sidewall recesses 407 and to fill and/or overfill the second trenches 405. The seed layer 408 and the conductive fill material 410 may be formed of materials that are selected from the same groups of candidate materials of the seed layer 404 and the conductive fill material 406, respectively, and may be formed using methods that are selected from the same group of candidate methods for forming the materials of the seed layer 404 and the conductive fill material 406, respectively.

Once the seed layer 408 and the conductive fill material 410 have been deposited in order to fill and/or overfill the second trenches 405, the seed layer 408 and the conductive fill material 410 may be planarized to removed excess material outside of the second trenches 405, such that after the planarizing, the seed layer 408 and the conductive fill material 410 completely span a top portion of the second trenches 405. In an embodiment the seed layer 408 and the conductive fill material 410 may be planarized using, for example, a chemical mechanical planarization (CMP) process. However, any suitable planarization process, such as a grinding process, may also be utilized.

The seed layer 404, the conductive fill material 406, the seed layer 408, and the conductive fill material 410 are collectively referred to as conductive lines 412. The conductive lines 412 may perform similarly to the conductive lines 72 and may be used as word lines. Adjacent sets of the seed layer 404, the conductive fill material 406, the seed layer 408, and the conductive fill material 410 are in physical contact with one another and are electrically coupled to one another. Thus, each set of the seed layer 404, the conductive fill material 406, the seed layer 408, and the conductive fill material 410 functions as a single word line.

Figure 35:
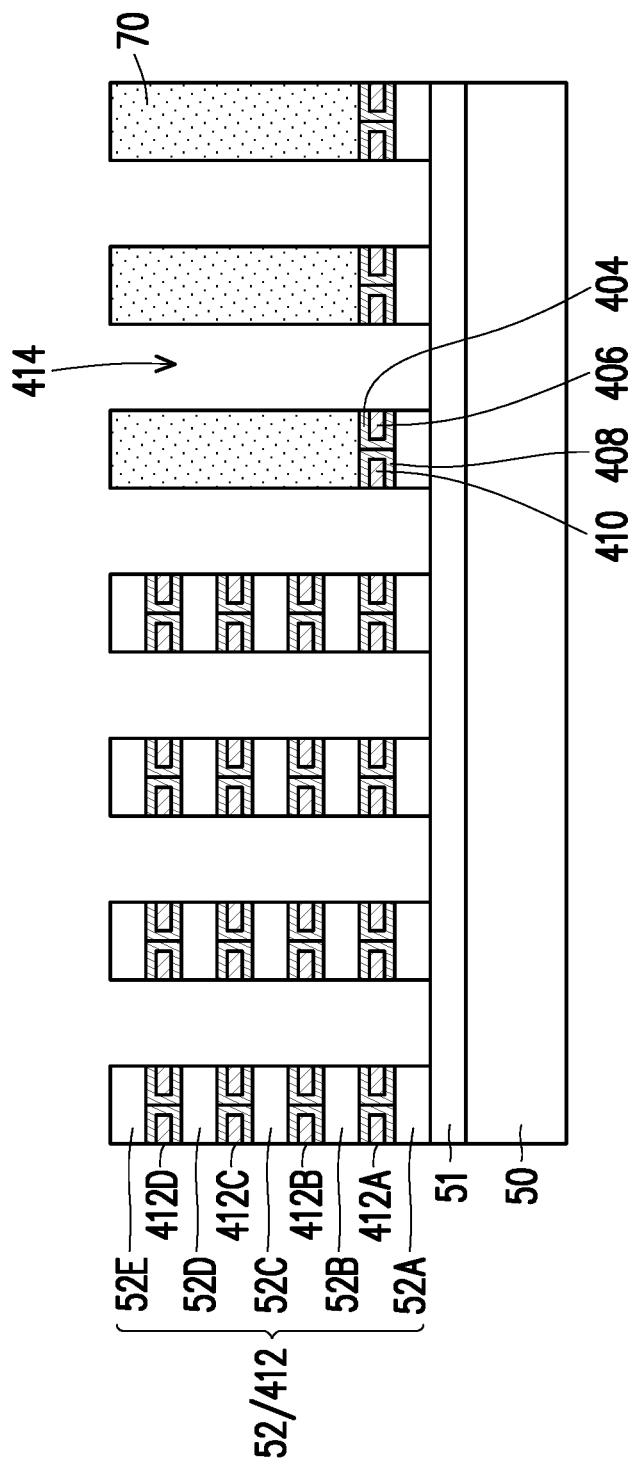
Figure 36A:
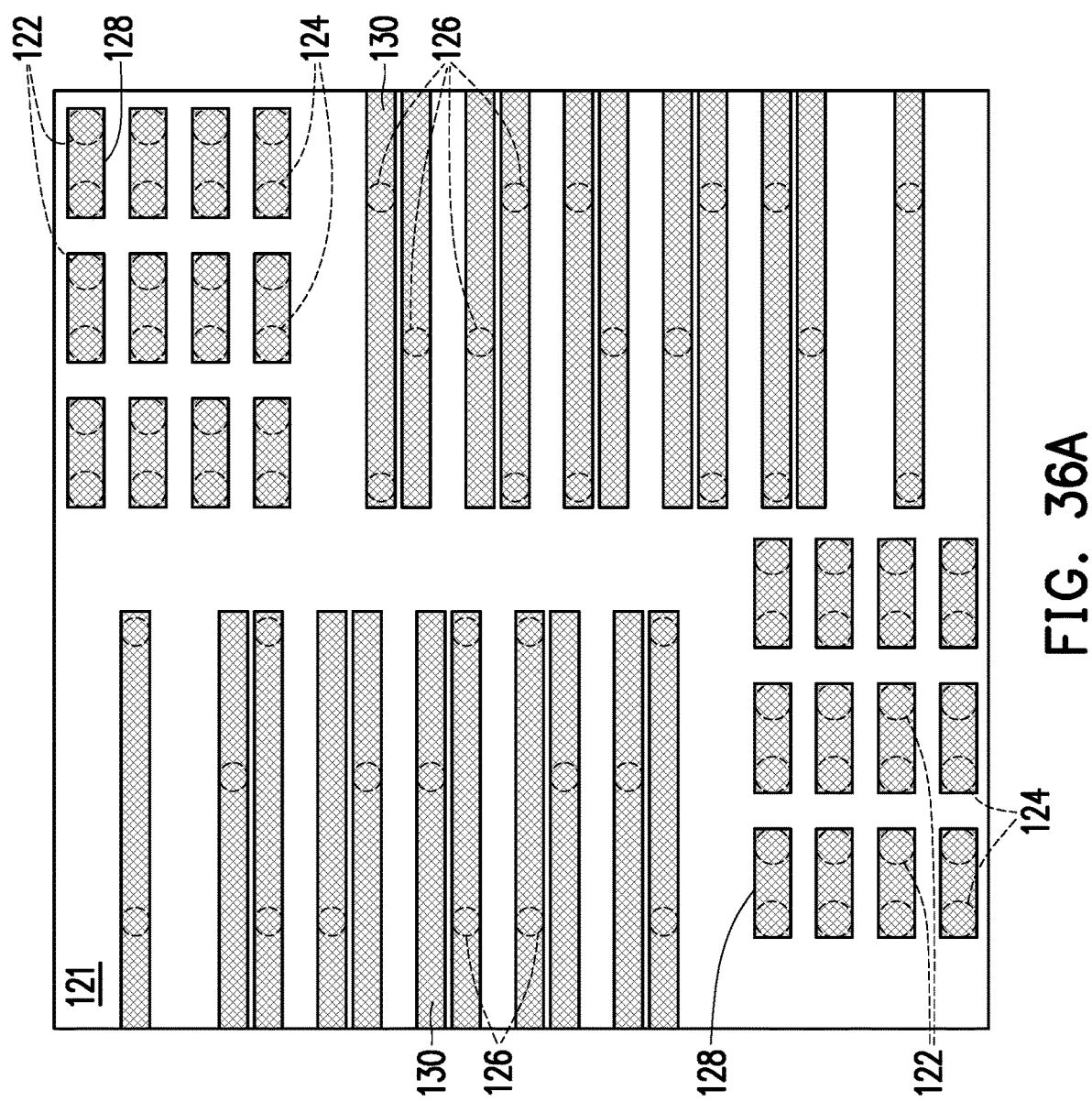
Figure 36B:
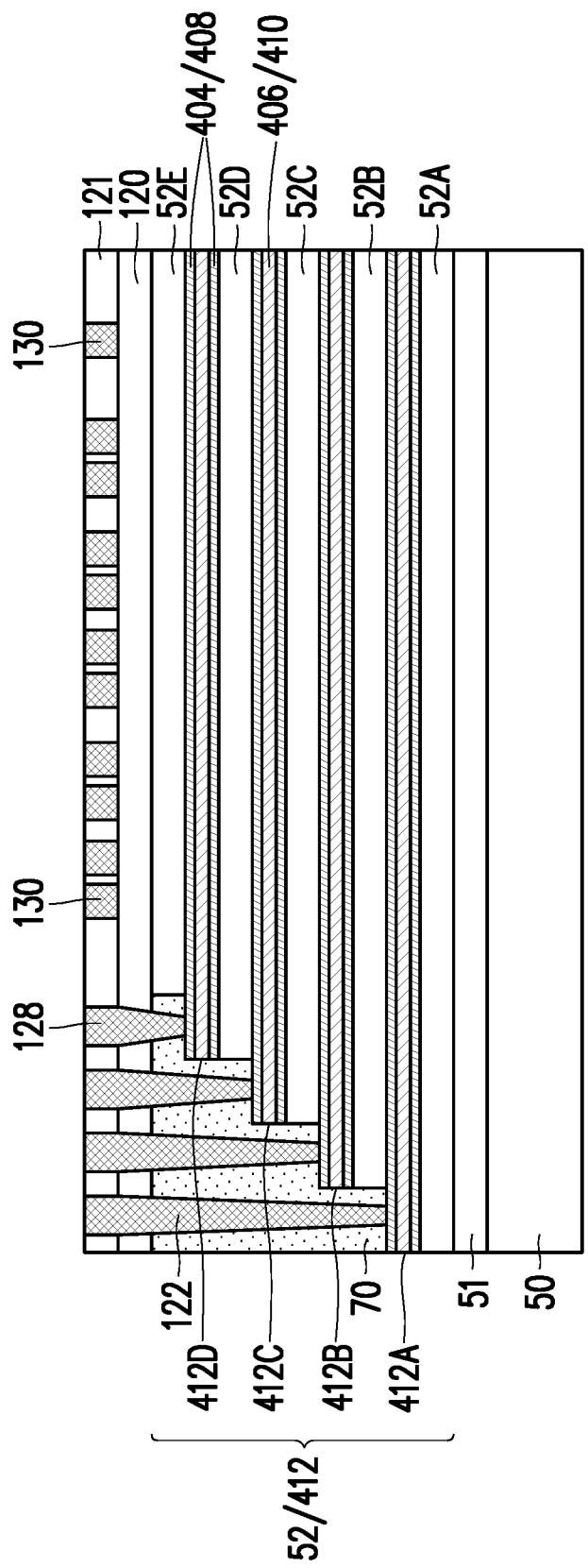
Figure 36C:
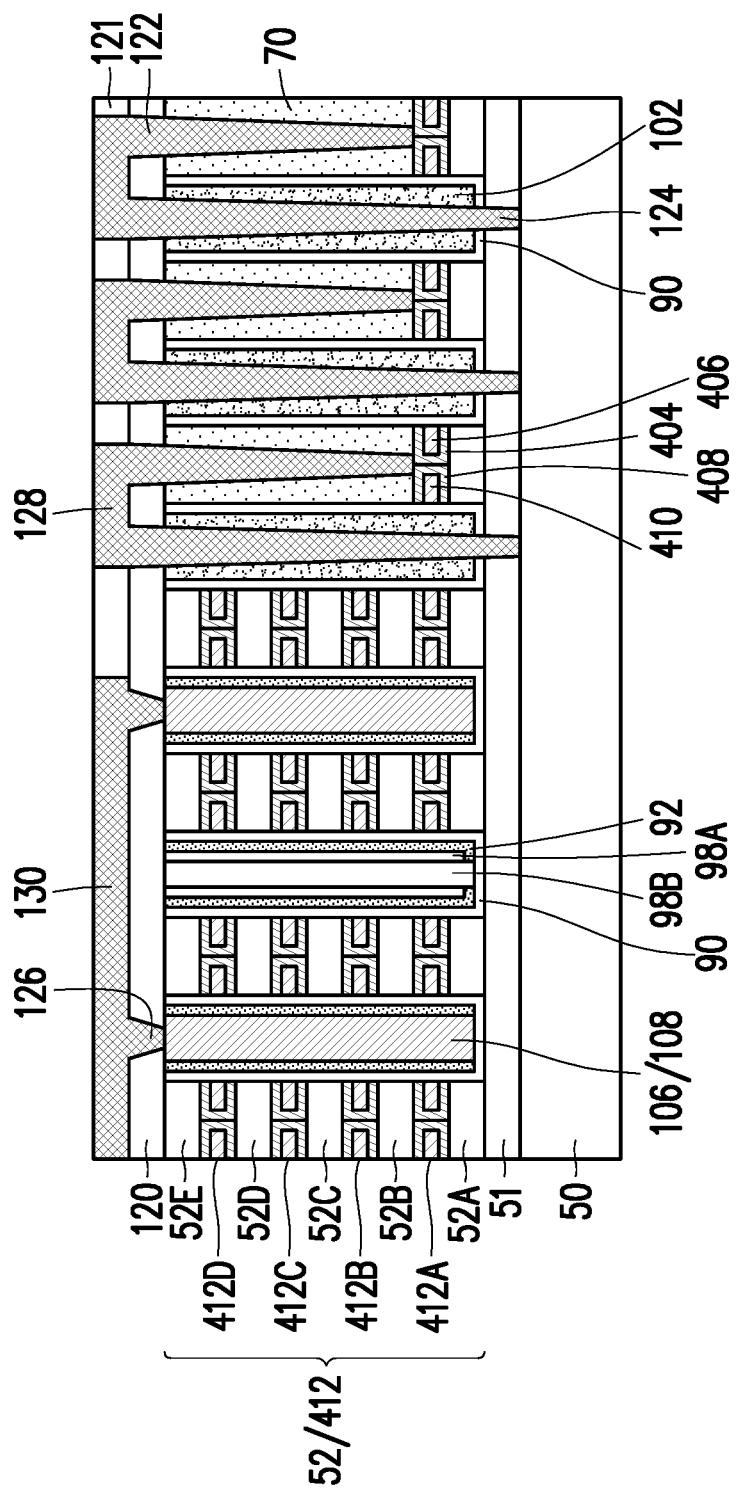
Figure 36D:
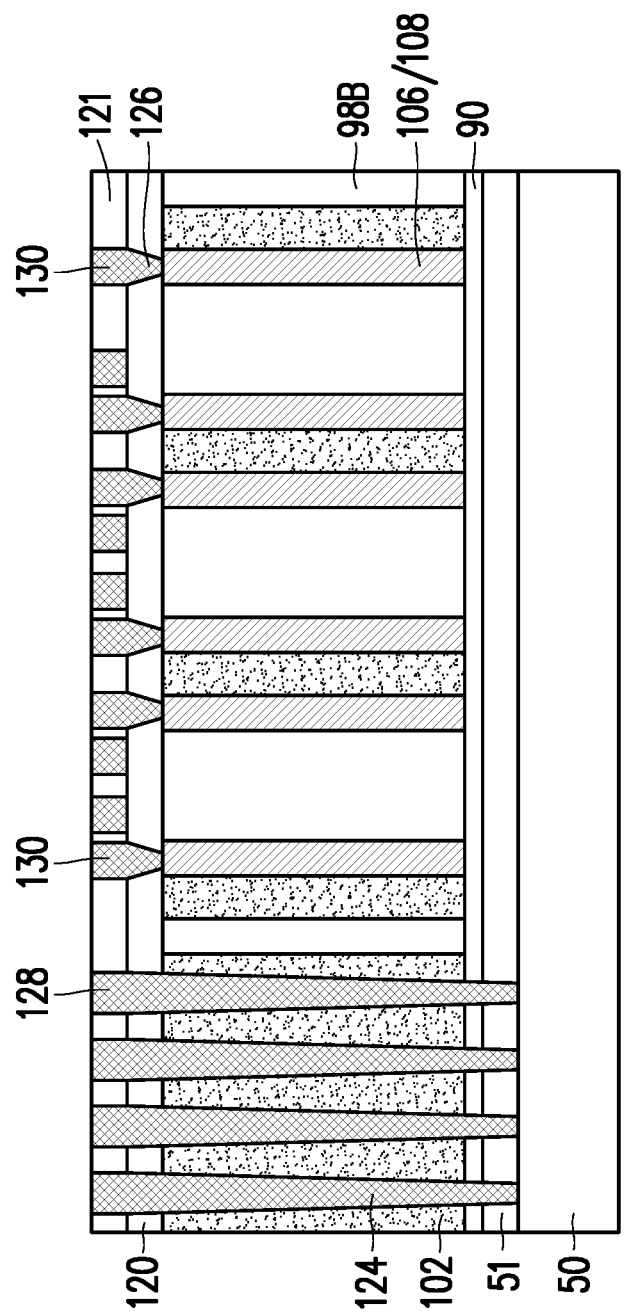
Figure 36E:
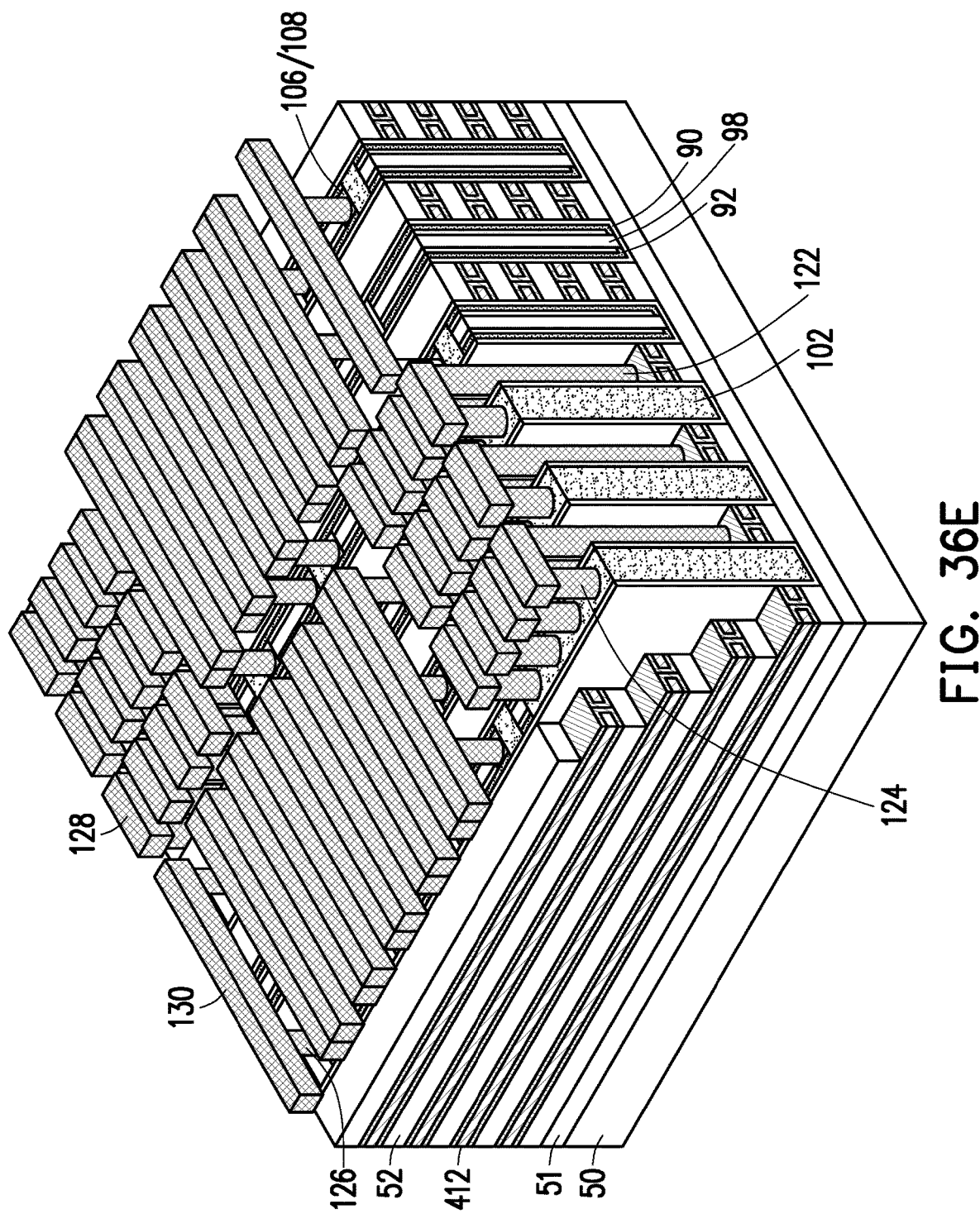

In FIG. 35, third trenches 414 are formed extending through the conductive lines 412, forming individual conductive lines 412A-412D. Forming the third trenches 414 may expose sidewalls of the dielectric layers 52. In some embodiments, the conductive lines 412 may be etched using, for example, an anisotropic etching process. However, any suitable etching process may be utilized. In some embodiments, the etching process is performed until the material of the conductive lines 412 that is not covered by the dielectric layers 52 has been removed. As such, the remaining material of the conductive lines 412 has a similar width as the remaining portion of the dielectric layers 52.

Forming the conductive lines 412 by forming and replacing the sacrificial layers 74 in the multi-layer stack 59 improves the aspect ratio of columns of the memory array 200, and prevents twisting or collapsing of features during formation. This reduces device defects and improves device performance. The steps performed in FIGS. 28 through 35 may be performed in place of the steps performed in FIGS. 13A through 15C, with the remaining steps for forming the memory array 200 being the same as those discussed above (e.g., the steps performed in FIGS. 2 through 12C are performed, then the steps performed in FIGS. 28 through 35 are performed, and finally, the steps performed in FIGS. 16A through 26E are performed.

FIGS. 36A through 36E illustrate the embodiment of FIGS. 28 through 35 after the steps of FIGS. 16A through 26E are performed. The structures of FIGS. 36A through 36E may be similar to those illustrated in FIGS. 26A through 26E, except that the conductive lines 72 are replaced by the conductive lines 412 including the seed layer 404, the conductive fill material 406, the seed layer 408, and the conductive fill material 410.

Embodiments may achieve various advantages. For example, forming the first portion 68A of the staircase structure 68 and the second portion 68B of the staircase structure 68 each extending partially along the second edge $E_2$ and the fourth edge $E_4$ of the memory array 200 allows for connections to be made to various portions of the underlying substrate 50, while minimizing the area taken up by the staircase structure 68, and maximizing the number of memory cells 202 formed in the memory array 200. This increases device density.

In accordance with an embodiment, a memory array includes a first word line extending from a first edge of the memory array in a first direction, the first word line having a length less than a length of a second edge of the memory array, the second edge of the memory array being perpendicular to the first edge of the memory array; a second word line extending from a third edge of the memory array, the third edge of the memory array being opposite the first edge of the memory array, the second word line extending in the first direction, the second word line having a length less than the length of the second edge of the memory array; a memory film contacting the first word line; and an oxide semiconductor (OS) layer contacting a first source line and a first bit line, the memory film being disposed between the OS layer and the first word line. In an embodiment, the memory film includes a ferroelectric (FE) material. In an embodiment, the memory array further includes an inter-metal dielectric (IMD) over the first word line; a first contact extending through the IMD to the first word line, the first contact being electrically coupled to the first word line; a dielectric material contacting the memory film, the memory film being disposed between the dielectric material and the first word line; a second contact extending through the dielectric material and the FE material; and a first conductive line electrically coupling the first contact to the second contact. In an embodiment, the second contact has a length greater than a length of the first contact. In an embodiment, the memory array further includes a third word line over the first word line, the third word line extending from the first edge of the memory array in the first direction, the third word line having a length less than the length of the first word line. In an embodiment, the memory array further includes a second memory film contacting the first word line opposite the memory film; and a second OS layer contacting a second source line and a second bit line, the second memory film being disposed between the second OS layer and the first word line, the second source line being aligned with one of the first source line or the first bit line in a direction parallel to the first edge of the memory array, and the second bit line being aligned with the other of the first source line or the first bit line in the direction parallel to the first edge of the memory array. In an embodiment, the memory array further includes a first inter-metal dielectric (IMD) over the first word line and a second IMD over the second word line, the first IMD and the second IMD having staircase shapes in a cross-sectional view.

In accordance with another embodiment, a device includes a first word line over a semiconductor substrate; a first inter-metal dielectric (IMD) contacting a first end of the first word line; a second word line over the semiconductor substrate, a first end of the second word line being aligned with a first edge of the first IMD; a second IMD contacting a second end of the second word line opposite the first end of the second word line, a first edge of the second IMD being aligned with a second end of the first word line opposite the first end of the first word line; a memory film in contact with the first word line and the first IMD; and an oxide semiconductor (OS) layer over the memory film, the OS layer contacting a source line and a bit line. In an embodiment, the first word line has a first length between the first end and the second end, the second word line has a second length between the first end and the second end, and the second length is equal to the first length. In an embodiment, a first distance between the semiconductor substrate and the first word line in a direction perpendicular to a major surface of the semiconductor substrate is equal to a second distance between the semiconductor substrate and the second word line in a direction perpendicular to the major surface of the semiconductor substrate. In an embodiment, the memory film is in contact with the second word line. In an embodiment, the first IMD and the second IMD have staircase shapes in a cross-sectional view. In an embodiment, a first end of the memory film and a first end of the OS layer are aligned with the second end of the first word line.

In accordance with yet another embodiment, a method includes forming a multi-layer stack over a semiconductor substrate, the multi-layer stack including alternating layers of a first material and a second material; depositing a first hard mask layer over the multi-layer stack; patterning the first hard mask layer to expose a first corner region of the multi-layer stack and a second corner region of the multi-layer stack kitty-corner the first corner region, the first hard mask layer covering a third corner region of the multi-layer stack and a fourth corner region of the multi-layer stack after patterning the first hard mask layer, the fourth corner region being kitty-corner the third corner region; patterning the multi-layer stack through the first hard mask layer to form a first staircase structure in the first corner region and a second staircase structure in the second corner region; patterning a first trench extending through the multi-layer stack; depositing a memory film along sidewalls and a bottom surface of the first trench; and depositing an oxide semiconductor (OS) layer over the memory film. In an embodiment, the method further includes depositing an inter-metal dielectric (IMD) over the first staircase structure, the second staircase structure, and the first hard mask layer, patterning the first trench further including patterning the first trench extending through the IMD. In an embodiment, the method further includes planarizing the IMD and the first hard mask layer, planarizing the IMD and the first hard mask layer removing the first hard mask layer, and top surfaces of the IMD being level with a top surface of the multi-layer stack after planarizing the IMD and the first hard mask layer. In an embodiment, the method further includes depositing a dielectric material over the memory film; forming a first conductive contact extending through the IMD to a first conductive layer of the multi-layer stack, the first conductive contact being electrically coupled to the first conductive layer; forming a second conductive contact extending through the dielectric material and the memory film; and forming a conductive line electrically coupling the second conductive contact with the first conductive contact. In an embodiment, the first material includes a conductive material, the second material includes a dielectric material, and patterning the first trench forms a plurality of word lines including the first material. In an embodiment, the first material includes an oxide dielectric material, and the second material includes a nitride dielectric material. In an embodiment, the method further includes replacing the second material with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
   a first word line extending from a first edge of the memory array in a first direction, the first word line having a length less than a length of a second edge of the memory array, the second edge of the memory array being perpendicular to the first edge of the memory array;
   a second word line extending from a third edge of the memory array, the third edge of the memory array being opposite the first edge of the memory array, the second word line extending in the first direction, the second word line having a length less than the length of the second edge of the memory array;
   a memory film contacting the first word line; and
   an oxide semiconductor (OS) layer in physical contact with a first source line and a first bit line, wherein the memory film is disposed between the OS layer and the first word line.

2. The memory array of claim 1, wherein the memory film comprises a ferroelectric (FE) material.

3. The memory array of claim 2, further comprising:
   an inter-metal dielectric (IMD) over the first word line;
   a first contact extending through the IMD to the first word line, wherein the first contact is electrically coupled to the first word line;
   a dielectric material contacting the memory film, wherein the memory film is disposed between the dielectric material and the first word line;
   a second contact extending through the dielectric material and the FE material; and
   a first conductive line electrically coupling the first contact to the second contact.

4. The memory array of claim 3, wherein the second contact has a length greater than a length of the first contact.

5. The memory array of claim 1, further comprising a third word line over the first word line, the third word line extending from the first edge of the memory array in the first direction, the third word line having a length less than the length of the first word line.

6. The memory array of claim 1, further comprising:
a second memory film contacting the first word line opposite the memory film; and
a second OS layer contacting a second source line and a second bit line, wherein the second memory film is disposed between the second OS layer and the first word line, wherein the second source line is aligned with one of the first source line or the first bit line in a direction parallel to the first edge of the memory array, and wherein the second bit line is aligned with the other of the first source line or the first bit line in the direction parallel to the first edge of the memory array.

7. The memory array of claim 1, further comprising a first portion of an inter-metal dielectric (IMD) over the first word line and a second portion of the IMD over the second word line, wherein the first portion of the IMD and the second portion of the IMD have staircase shapes in a cross-sectional view, and wherein the second portion of the IMD is separated from the first portion of the IMD.

8. A device comprising:
a first word line over a semiconductor substrate;
a first portion of an inter-metal dielectric (IMD) contacting a first end of the first word line;
a second word line over the semiconductor substrate, wherein a first end of the second word line is aligned with a first edge of the first portion of the IMD;
a second portion of the IMD contacting a second end of the second word line opposite the first end of the second word line, wherein a first edge of the second portion of the IMD is aligned with a second end of the first word line opposite the first end of the first word line, wherein the second portion of the IMD is separated from the first portion of the IMD, and wherein a top surface of the second portion of the IMD is level with a top surface of the first portion of the IMD;
a memory film in contact with the first word line and the first portion of the IMD; and
an oxide semiconductor (OS) layer over the memory film, the OS layer contacting a source line and a bit line.

9. The device of claim 8, wherein the first word line has a first length between the first end and the second end, wherein the second word line has a second length between the first end and the second end, and wherein the second length is equal to the first length.

10. The device of claim 9, wherein a first distance between the semiconductor substrate and the first word line in a direction perpendicular to a major surface of the semiconductor substrate is equal to a second distance between the semiconductor substrate and the second word line in a direction perpendicular to the major surface of the semiconductor substrate.

11. The device of claim 8, wherein the memory film is in contact with the second word line.

12. The device of claim 8, wherein the first portion of the IMD and the second portion of the IMD have staircase shapes in a cross-sectional view.

13. The device of claim 8, wherein a first end of the memory film and a first end of the OS layer are aligned with the second end of the first word line.

14. A method comprising:
forming a multi-layer stack over a semiconductor substrate, the multi-layer stack comprising alternating layers of a first material and a second material;
depositing a first hard mask layer over the multi-layer stack;
patterning the first hard mask layer to expose a first corner region of the multi-layer stack and a second corner region of the multi-layer stack kitty-corner the first corner region, wherein the first hard mask layer covers a third corner region of the multi-layer stack and a fourth corner region of the multi-layer stack after patterning the first hard mask layer, wherein the fourth corner region is kitty-corner the third corner region;
patterning the multi-layer stack through the first hard mask layer to form a first staircase structure in the first corner region and a second staircase structure in the second corner region;
patterning a first trench extending through the multi-layer stack;
depositing a memory film along sidewalls and a bottom surface of the first trench; and
depositing an oxide semiconductor (OS) layer over the memory film.

15. The method of claim 14, further comprising depositing an inter-metal dielectric (IMD) over the first staircase structure, the second staircase structure, and the first hard mask layer, wherein patterning the first trench further comprises patterning the first trench extending through the IMD.

16. The method of claim 15, further comprising planarizing the IMD and the first hard mask layer, wherein planarizing the IMD and the first hard mask layer removes the first hard mask layer, and wherein top surfaces of the IMD are level with a top surface of the multi-layer stack after planarizing the IMD and the first hard mask layer.

17. The method of claim 15, further comprising:
depositing a dielectric material over the memory film;
forming a first conductive contact extending through the IMD to a first conductive layer of the multi-layer stack, wherein the first conductive contact is electrically coupled to the first conductive layer;
forming a second conductive contact extending through the dielectric material and the memory film; and
forming a conductive line electrically coupling the second conductive contact with the first conductive contact.

18. The method of claim 14, wherein the first material comprises a conductive material, wherein the second material comprises a dielectric material, and wherein patterning the first trench forms a plurality of word lines comprising the first material.

19. The method of claim 14, wherein the first material comprises an oxide dielectric material, and wherein the second material comprises a nitride dielectric material.

20. The method of claim 19, further comprising replacing the second material with a conductive material.

* * * * *